United States Patent
Kakimoto

(10) Patent No.: US 10,323,181 B2
(45) Date of Patent: Jun. 18, 2019

(54) COMPOSITION CONTAINING PHOSPHORESCENT COMPOUND AND LIGHT EMITTING DEVICE USING THE SAME

(71) Applicant: Sumitomo Chemical Company, Limited, Tokyo (JP)

(72) Inventor: Hidenobu Kakimoto, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 15/545,874

(22) PCT Filed: Jan. 13, 2016

(86) PCT No.: PCT/JP2016/050800
§ 371 (c)(1),
(2) Date: Jul. 24, 2017

(87) PCT Pub. No.: WO2016/121498
PCT Pub. Date: Aug. 4, 2016

(65) Prior Publication Data
US 2018/0016492 A1 Jan. 18, 2018

(30) Foreign Application Priority Data
Jan. 26, 2015 (JP) ................................. 2015-012058

(51) Int. Cl.
*H01L 29/08* (2006.01)
*C09K 11/06* (2006.01)
(Continued)

(52) U.S. Cl.
CPC ............... *C09K 11/06* (2013.01); *C08K 5/56* (2013.01); *C08L 65/00* (2013.01); *C09D 165/00* (2013.01);
(Continued)

(58) Field of Classification Search
CPC .................. C09K 11/06; C08K 5/56
(Continued)

(56) References Cited

U.S. PATENT DOCUMENTS

| 6,878,312 B1 | 4/2005 | Kanbe et al. |
| 2004/0099882 A1 | 5/2004 | Hokari et al. |

(Continued)

FOREIGN PATENT DOCUMENTS

| CN | 1310930 A | 8/2001 |
| CN | 1505846 A | 6/2004 |

(Continued)

OTHER PUBLICATIONS

Office Action dated Apr. 4, 2017 in JP Application No. 2016-570896.
(Continued)

*Primary Examiner* — Caleb E Henry
(74) *Attorney, Agent, or Firm* — Panitch Schwarze Belisario & Nadel LLP

(57) ABSTRACT

A composition containing a phosphorescent compound and solvents, which is useful for producing a film having excellent flatness when used in a discharge type application method, is provided. The composition contains a phosphorescent compound, a solvent (A) and a solvent (B), in which the boiling point under 1 atm of the solvent (A) (bpA (° C.)) and the boiling point under 1 atm of the solvent (B) (bpB (° C.)) satisfy formulas (11) and (12), and the content of the solvent (A) (wtA (by weight)) and the content of solvent (B) (wtB (by weight)) satisfy formula (13):

$$bpB<200°\ C.\leq bpA \quad (11)$$

$$70°\ C.\leq bpA-bpB\leq 120°\ C. \quad (12)$$

$$wtB\leq wtA \quad (13).$$

11 Claims, 1 Drawing Sheet

(51) Int. Cl.
*C08K 5/56* (2006.01)
*C08L 65/00* (2006.01)
*H01L 51/50* (2006.01)
*H01L 51/00* (2006.01)
*C09D 165/00* (2006.01)

(52) U.S. Cl.
CPC ...... *H01L 51/0007* (2013.01); *H01L 51/0035* (2013.01); *H01L 51/0039* (2013.01); *H01L 51/0084* (2013.01); *H01L 51/0085* (2013.01); *H01L 51/0086* (2013.01); *H01L 51/0087* (2013.01); *H01L 51/50* (2013.01); *H01L 51/5016* (2013.01); *C08G 2261/3162* (2013.01); *C08G 2261/51* (2013.01); *C08G 2261/95* (2013.01); *C09K 2211/185* (2013.01)

(58) Field of Classification Search
USPC .......................................................... 257/40
See application file for complete search history.

(56) References Cited

U.S. PATENT DOCUMENTS

| | | |
|---|---|---|
| 2004/0109051 A1 | 6/2004 | Bright et al. |
| 2004/0225056 A1 | 11/2004 | Spreitzer et al. |
| 2009/0033208 A1 | 2/2009 | Nagayama et al. |
| 2009/0103284 A1 | 4/2009 | Suzuki et al. |
| 2010/0243960 A1 | 9/2010 | Matsue et al. |
| 2013/0026415 A1 | 1/2013 | James et al. |
| 2015/0115204 A1 | 4/2015 | Sekine et al. |

FOREIGN PATENT DOCUMENTS

| | | |
|---|---|---|
| CN | 101855308 A | 10/2010 |
| CN | 102859738 A | 1/2013 |
| EP | 2413663 A1 | 2/2012 |
| JP | 2001-288416 A | 10/2001 |
| JP | 2003-229256 A | 8/2003 |
| JP | 2004-179144 A | 6/2004 |
| JP | 2006-348287 A | 12/2006 |
| JP | 2006-348288 A | 12/2006 |
| JP | 2008-226686 A | 9/2008 |
| JP | 2009-140922 A | 6/2009 |
| JP | 2009-266824 A | 11/2009 |
| JP | 2009-267299 A | 11/2009 |
| JP | 2011-42794 A | 3/2011 |
| JP | 2011-66388 A | 3/2011 |
| JP | 2012-49283 A | 3/2012 |
| JP | 2013-527980 A | 7/2013 |
| WO | 02/072714 A1 | 9/2002 |
| WO | 2002/069119 A1 | 9/2002 |
| WO | 2006/087945 A1 | 8/2006 |
| WO | 2010/018388 A1 | 2/2010 |
| WO | 2013146806 A1 | 10/2013 |

OTHER PUBLICATIONS

Office Action dated Mar. 23, 2018 in KR Application No. 10-2017-7023219.

Office Action dated Apr. 23, 2018 in CN Application No. 201680006997.9.

Office Action dated Jan. 11, 2019 in CN Application 201680006997.9 (English Translation).

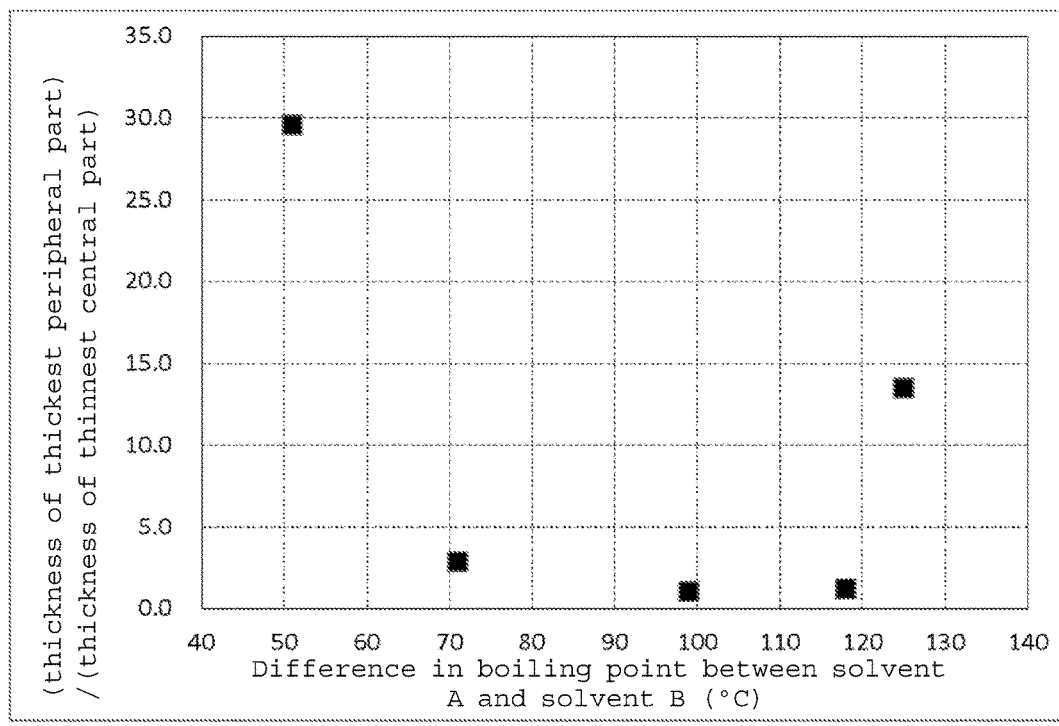

COMPOSITION CONTAINING PHOSPHORESCENT COMPOUND AND LIGHT EMITTING DEVICE USING THE SAME

CROSS-REFERENCE TO RELATED APPLICATION

This application is a Section 371 of International Application No. PCT/JP2016/050800, filed Jan. 13, 2016, which was published in the Japanese language on Aug. 4, 2016 under International Publication No. WO 2016/121498 A1, and the disclosure of which is incorporated herein by reference.

TECHNICAL FIELD

The present invention relates to a composition and a light emitting device using the same.

BACKGROUND ART

An organic electroluminescent device (hereinafter, referred to also as "light emitting device") can be suitably used in applications such as display and illumination because of high light emission efficiency and low driving voltage, and is under active study and development. A light emitting layer can be formed by discharge type application methods typified by an inkjet printing method, by using a composition comprising a solvent and a soluble luminescent compound used for a light emitting layer of a light emitting device. By forming a light emitting layer using a discharge type application method, a large-area light emitting device can be produced by a simple process. For this reason, a composition comprising a soluble luminescent compound and a solvent is investigated.

Patent document 1 discloses that an isotropic light emitting layer can be formed by an inkjet printing method using a composition comprising a soluble luminescent compound and two or more kinds of solvents. The luminescent compound is a fluorescent compound. The difference in boiling point between the two or more kinds of solvents is about 50° C. to 55° C.

Patent document 2 discloses that a smooth light emitting layer can be formed by an inkjet printing method using a composition comprising a soluble luminescent compound and a solvent having a boiling point of 200° C. or higher. The luminescent compound is a fluorescent compound. A composition comprising a solvent having a boiling point of 200° C. or higher and a solvent having a boiling point of lower than 200° C. is not disclosed.

PRIOR ART DOCUMENT

Patent Document

Patent document 1: JP-A No. 2001-288416
Patent document 2: JP-A No. 2003-229256

SUMMARY OF THE INVENTION

Problem to be Solved by the Invention

A light emitting device using a phosphorescent compound showing light emission from triplet excited state (phosphorescence emission) in a light emitting layer shows higher light emission efficiency than a light emitting device using a fluorescent compound showing light emission from singlet excited state (fluorescence emission) in a light emitting layer. Therefore, there is a need for a composition comprising a phosphorescent compound and a solvent which is useful for production of a film excellent in flatness when used in a discharge type application method.

Then, the present invention has an object of providing a composition comprising a phosphorescent compound and a solvent which is useful for production of a film excellent in flatness when used in a discharge type application method. Further, the present invention has an object of providing a light emitting device produced by using the composition.

Means for Solving the Problem

The present invention provides the following [1] to [13].

[1] A composition comprising a phosphorescent compound, a solvent (A) and a solvent (B), wherein
the boiling point under 1 atm of the solvent (A): bpA (° C.) and the boiling point under 1 atm of the solvent (B): bpB (° C.) satisfy the formula (11) and the formula (12), and the content of the solvent (A): wtA (by weight) and the content of the solvent (B): wtB (by weight) satisfy the formula (13):

$$bpB < 200°\ C. \leq bpA \tag{11}$$

$$70°\ C. \leq bpA - bpB \leq 120°\ C. \tag{12}$$

$$wtB \leq wtA \tag{13}.$$

[2] The composition according to [1], wherein the solvent (A) and the solvent (B) are each independently an aromatic hydrocarbon solvent or an aromatic ether solvent.

[3] The composition according to [1] or [2], wherein at least one of the solvent (A) and the solvent (B) is an aromatic ether solvent.

[4] The composition according to any one of [1] to [3], wherein the phosphorescent compound is a phosphorescent compound represented by the formula (1):

[Chemical Formula 1]

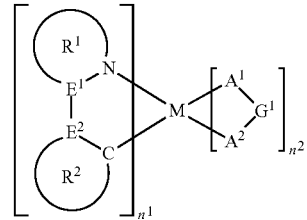

(1)

[wherein,
M represents a ruthenium atom, a rhodium atom, a palladium atom, an iridium atom or a platinum atom.

$n^1$ represents an integer of 1 or more. $n^2$ represents an integer of 0 or more. $n^1 + n^2$ is 3 when M is a ruthenium atom, a rhodium atom or an iridium atom, while $n^1 + n^2$ is 2 when M is a palladium atom or a platinum atom.

$E^1$ and $E^2$ each independently represent a carbon atom or a nitrogen atom. At least one of $E^1$ and $E^2$ is a carbon atom.

The ring $R^1$ represents a 5-membered or 6-membered aromatic heterocyclic ring, and the ring optionally has a substituent. When a plurality of the substituents are present, they may be the same or different and may be combined together to form a ring together with the atoms to which they are attached. When a plurality of the rings $R^1$ are present, they may be the same or different. $E^1$ is a carbon atom when the ring $R^1$ is a 6-membered aromatic heterocyclic ring.

The ring $R^2$ represents a 5-membered or 6-membered aromatic hydrocarbon ring or a 5-membered or 6-membered aromatic heterocyclic ring, and these rings each optionally have a substituent. When a plurality of the substituents are present, they may be the same or different and may be combined together to form a ring together with the atoms to which they are attached. When a plurality of the ring $R^2$ are present, they may be the same or different. $E^2$ is a carbon atom when the ring $R^2$ is a 6-membered aromatic heterocyclic ring.

$A^1$-$G^1$-$A^2$ represents an anionic bidentate ligand. $A^1$ and $A^2$ each independently represent a carbon atom, an oxygen atom or a nitrogen atom, and these atoms each may be an atom constituting a ring. represents a single bond or an atomic group constituting the bidentate ligand together with $A^1$ and $A^2$. When a plurality of $A^1$-$G^1$-$A^2$ are present, they may be the same or different.].

[5] The composition according to [4], wherein the ring $R^2$ is a quinoline ring optionally having a substituent, an isoquinoline ring optionally having a substituent, a pyridine ring optionally having a substituent, a pyrimidine ring optionally having a substituent, an imidazole ring optionally having a substituent or a triazole ring optionally having a substituent.

[6] The composition according to [4] or [5], wherein the ring $R^2$ is a benzene ring optionally having a substituent, a naphthalene ring optionally having a substituent, a fluorene ring optionally having a substituent, a phenanthrene ring optionally having a substituent, a pyridine ring optionally having a substituent, a diazabenzene ring optionally having a substituent, a pyrrole ring optionally having a substituent, a furan ring optionally having a substituent or a thiophene ring optionally having a substituent.

[7] The composition according to any one of [4] to [6], wherein at least one ring selected from the group consisting of the ring $R^1$ and the ring $R^2$ has a group represented by the formula (2):

(2)

[wherein,
$R^{100}$ represents an aryl group, a monovalent heterocyclic group or a substituted amino group, and these groups each optionally have a substituent.].

[8] The composition according to any one of [4] to [7], wherein M is an iridium atom.

[9] The composition according to any one of [1] to [8], further comprising a non-phosphorescent low molecular weight compound.

[10] The composition according to any one of [1] to [8], further comprising a polymer compound comprising at least one constitutional unit selected from the group consisting of a constitutional unit represented by the formula (X) and a constitutional unit represented by the formula (Y):

[Chemical Formula 2]

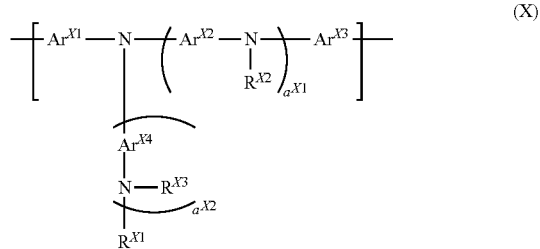
(X)

[wherein,
$a^{X1}$ and $a^{X2}$ each independently represent an integer of 0 or more.

$Ar^{X1}$ and $Ar^{X3}$ each independently represent an arylene group or a divalent heterocyclic group, and these groups each optionally have a substituent.

$Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent. When a plurality of $Ar^{X2}$ and $Ar^{X4}$ are present, they may be the same or different at each occurrence.

$R^{X1}$, $R^{X2}$ and $R^{X3}$ each independently represent a hydrogen atom, an alkyl group, a cycloalkyl group, an aryl group or a monovalent heterocyclic group, and these groups each optionally have a substituent. When a plurality of $R^{X2}$ and $R^{X3}$ are present, they may be the same or different at each occurrence.]

[Chemical Formula 3]

(Y)

[wherein, $Ar^{Y1}$ represents an arylene group, a divalent heterocyclic group or a divalent group in which at least one arylene group and at least one divalent heterocyclic group are bonded directly to each other, and these groups each optionally have a substituent.].

[11] The composition according to any one of [1] to [10], further comprising at least one material selected from the group consisting of a hole transporting material, a hole injection material, an electron transporting material, an electron injection material, a light emitting material and an antioxidant.

[12] The composition according to any one of [1] to [11], the viscosity of the composition being 1 to 20 mPa·s.

[13] A light emitting device comprising an anode, a cathode and a light emitting layer disposed between the anode and the cathode, wherein the light emitting layer is a layer obtained by using the composition according to any one of [1] to [12].

Effect of the Invention

According to the present invention, a composition comprising a phosphorescent compound and a solvent which is useful for production of a film excellent in flatness when used in a discharge type application method can be provided. Further, according to the present invention, a light emitting device produced by using the composition can be provided.

BRIEF EXPLANATION OF DRAWING

FIG. 1 shows a relation between the difference in boiling point between the solvent (A) and the solvent (B) used in Examples B1, B2 and B3 and Comparative Examples CB1 and CB2 and the value of "(thickness of thickest peripheral part)/(thickness of thinnest central part)" of films B1, B2, B3, CB1 and CB2.

MODES FOR CARRYING OUT THE INVENTION

Suitable embodiments of the present invention will be illustrated in detail below.

<Explanation of Common Term>

Terms commonly used in the present specification have the following meanings unless otherwise stated.

Me represents a methyl group, Et represents an ethyl group, Bu represents a butyl group, i-Pr represents an isopropyl group, and t-Bu represents a tert-butyl group.

A hydrogen atom may be a heavy hydrogen atom or a light hydrogen atom.

A solid line representing a bond to a central metal in a formula representing a metal complex denotes a covalent bond or a coordinate bond.

"Polymer compound" denotes a polymer having molecular weight distribution and having a polystyrene-equivalent number average molecular weight of $1 \times 10^3$ to $1 \times 10^8$.

A polymer compound may be any of a block copolymer, a random copolymer, an alternating copolymer and a graft copolymer, and may also be another embodiment.

An end group of a polymer compound is preferably a stable group because if a polymerization active group remains intact at the end, when the polymer compound is used for fabrication of a light emitting device, the light emitting property or luminance life possibly becomes lower. This end group is preferably a group having a conjugated bond to the main chain, and includes, for example, groups bonding to an aryl group or a monovalent heterocyclic group via a carbon-carbon bond.

"Low molecular weight compound" denotes a compound having no molecular weight distribution and having a molecular weight of $1 \times 10^4$ or less.

"Constitutional unit" denotes a unit structure found once or more in a polymer compound.

"Alkyl group" may be any of linear or branched. The number of carbon atoms of the linear alkyl group is, not including the number of carbon atoms of a substituent, usually 1 to 50, preferably 3 to 30, more preferably 4 to 20. The number of carbon atoms of the branched alkyl groups is, not including the number of carbon atoms of a substituent, usually 3 to 50, preferably 3 to 30, more preferably 4 to 20.

The alkyl group optionally has a substituent, and examples thereof include a methyl group, an ethyl group, a propyl group, an isopropyl group, a butyl group, an isobutyl group, a tert-butyl group, a pentyl group, an isoamyl group, a 2-ethylbutyl group, a hexyl group, a heptyl group, an octyl group, a-2-butyl group, a 2-ethylhexyl group, a 3-propyl-heptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom or the like, and the alkyl group having a substituent includes, for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl) propyl group and a 6-ethyloxyhexyl group.

The number of carbon atoms of "Cycloalkyl group" is, not including the number of carbon atoms of a substituent, usually 3 to 50, preferably 3 to 30, more preferably 4 to 20.

The cycloalkyl group optionally has a substituent, and examples thereof include a cyclohexyl group, a cyclohexylmeth yl group and a cyclohexylethyl group.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in these groups with an alkyl group, a cycloalkyl group, an alkoxy group, a cycloalkoxy group, an aryl group, a fluorine atom or the like.

"Alkoxy group" may be any of linear or branched. The number of carbon atoms of the linear alkoxy group is, not including the number of carbon atoms of a substituent, usually 1 to 40, preferably 4 to 10. The number of carbon atoms of the branched alkoxy group is, not including the number of carbon atoms of a substituent, usually 3 to 40, preferably 4 to 10.

The alkoxy group optionally has a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of "Cycloalkoxy group" is, not including the number of carbon atoms of a substituent, usually 3 to 40, preferably 4 to 10.

The cycloalkoxy group optionally has a substituent, and examples thereof include a cyclohexyloxy group.

The number of carbon atoms of "Aryloxy group" is, not including the number of carbon atoms of a substituent, usually 6 to 60, preferably 6 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in these groups with an alkyl group, a cycloalkyl group, an alkoxy group, a cycloalkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remain ing after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole and dibenzophosphole, and a compound in which an aromatic ring is condensed to the heterocyclic ring even if the heterocyclic ring itself shows no aromaticity such as phenoxazine, phenothiazine, dibenzoborole, dibenzosilole and benzopyran.

The number of carbon atoms of the monovalent heterocyclic group is, not including the number of carbon atoms of a substituent, usually 2 to 60, preferably 4 to 20.

The monovalent heterocyclic group optionally has a substituent, and examples thereof include a thienyl group, a pyrrolyl group, a furyl group, a pyridyl group, a piperidyl group, a quinolinyl group, an isoquinolinyl group, a pyrimidinyl group, a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferable. The substituent which an amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl)amino group and a bis(3,5-di-tert-butylphenyl)amino group.

"Alkenyl group" may be any of linear or branched. The number of carbon atoms of the linear alkenyl group, not including the number of carbon atoms of the substituent, is usually 2 to 30, preferably 3 to 20. The number of carbon atoms of the branched alkenyl group, not including the number of carbon atoms of the substituent, is usually 3 to 30, preferably 4 to 20.

The number of carbon atoms of "Cycloalkenyl group", not including the number of carbon atoms of the substituent, is usually 3 to 30, preferably 4 to 20.

The alkenyl group and cycloalkenyl group each optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and these groups having a substituent.

"Alkynyl group" may be any of linear or branched. The number of carbon atoms of the alkynyl group, not including the number of carbon atoms of the substituent, is usually 2 to 20, preferably 3 to 20. The number of carbon atoms of the branched alkynyl group, not including the number of carbon atoms of the substituent, is usually 4 to 30, preferably 4 to 20.

The number of carbon atoms of "Cycloalkynyl group", not including the number of carbon atoms of the substituent, is usually 4 to 30, preferably 4 to 20.

The alkynyl group and cycloalkynyl group each optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, and these groups having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, and these groups having a substituent, p referably, groups represented by the formulae (A-1) to (A-20).

The arylene group includes groups obtained by linking a plurality of these groups.

[Chemical Formula 4]

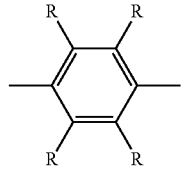

(A-1)

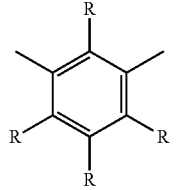

(A-2)

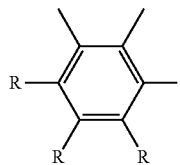

(A-3)

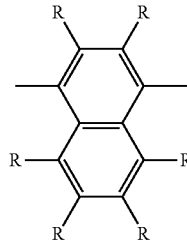

(A-4)

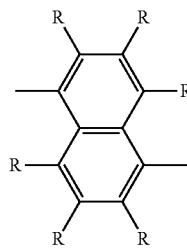

(A-5)

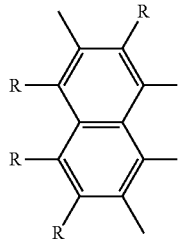

(A-6)

[Chemical Formula 5]

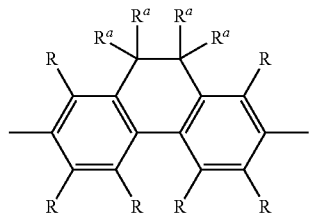

(A-7)

-continued
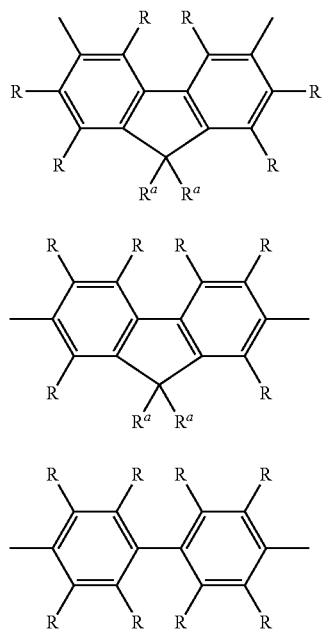
(A-8)
(A-9)
[Chemical Formula 6]
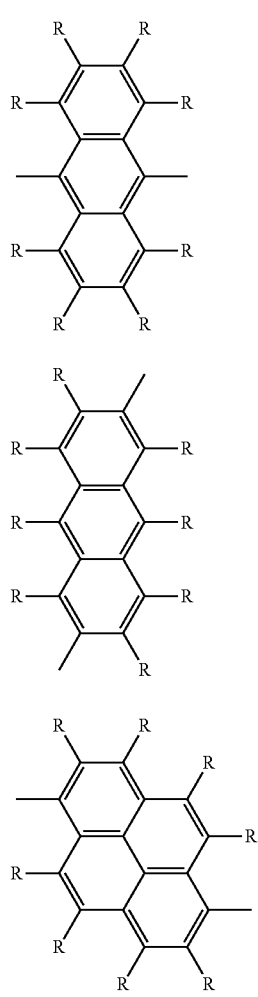
(A-11)
(A-12)
(A-13)
-continued
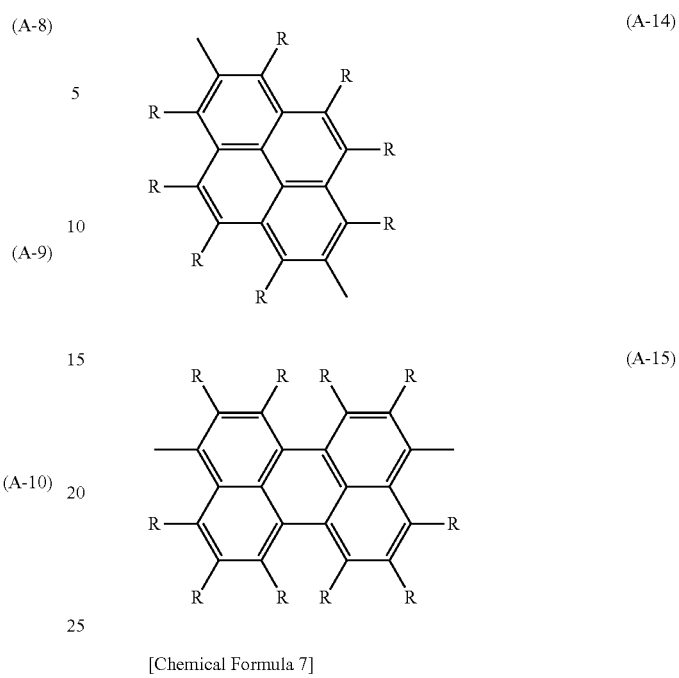
(A-10)
[Chemical Formula 7]
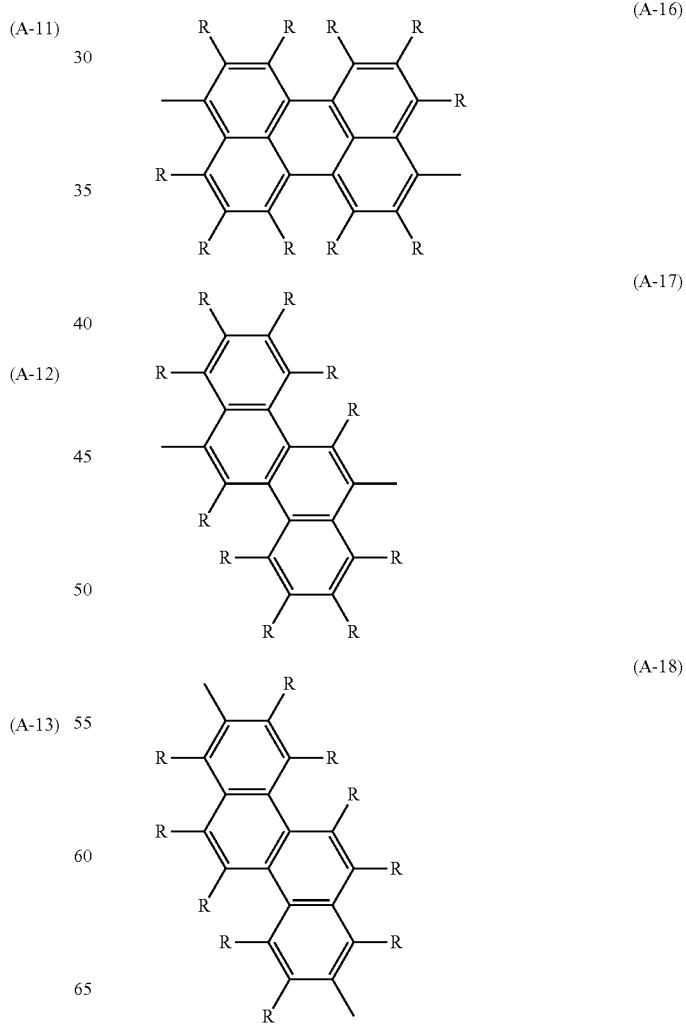
(A-14)
(A-15)
(A-16)
(A-17)
(A-18)

-continued

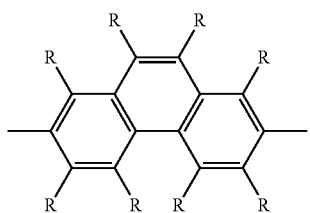
(A-19)

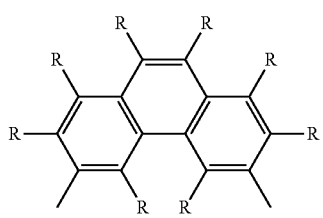
(A-20)

[wherein, R and $R^a$ each independently represent a hydrogen atom, an alkyl group, a cycloalkyl group, an aryl group or a monovalent heterocyclic group. The plurality of R and $R^a$ each may be the same or different, and groups $R^a$ may be combined together to form a ring together with the atoms to which they are attached.]

The number of carbon atoms of the divalent heterocyclic group is, not including the number of carbon atoms of a substituent, usually 2 to 60, preferably 3 to 20, more preferably 4 to 15.

The divalent heterocyclic group optionally has a substituent, and examples thereof include divalent groups obtained by removing from pyridine, diazabenzene, triazine, azanaphth alene, diazanaphthalene, carbazole, dibenzofuran, dibenzoth iophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, p referably groups represented by the formulae (AA-1) to (AA-34). The divalent heterocyclic group includes groups obtained by linking a plurality of these groups.

[Chemical Formula 8]

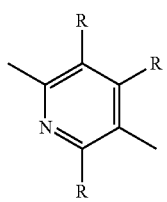
(AA-1)

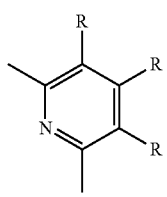
(AA-2)

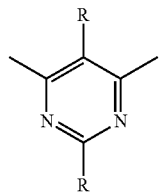
(AA-3)

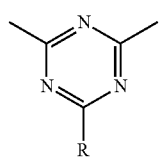
(AA-4)

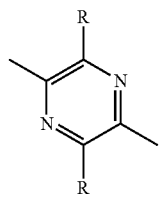
(AA-5)

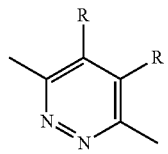
(AA-6)

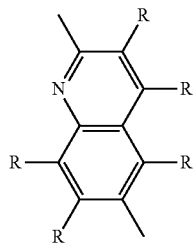
(AA-7)

[Chemical Formula 9]

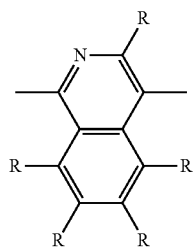
(AA-8)

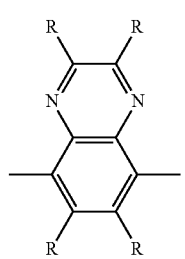
(AA-9)

US 10,323,181 B2
13
-continued
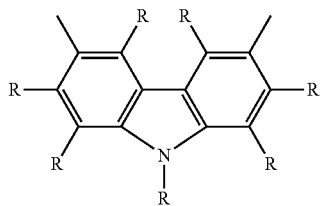
(AA-10)
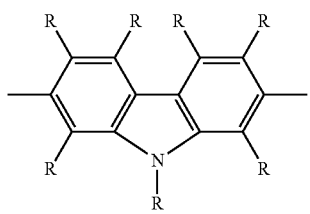
(AA-11)
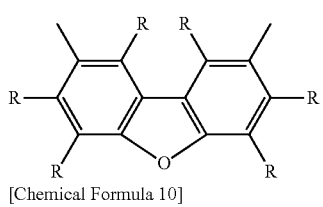
(AA-12)
[Chemical Formula 10]
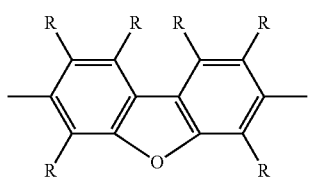
(AA-13)
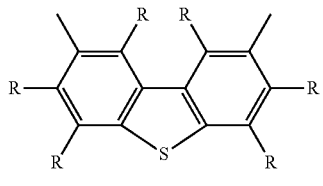
(AA-14)
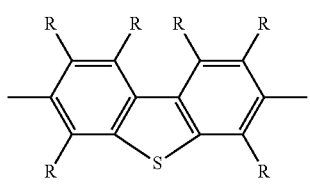
(AA-15)
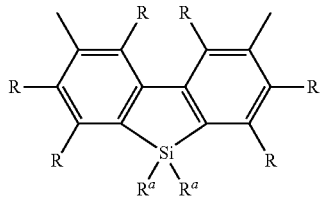
(AA-16)
[Chemical Formula 11]
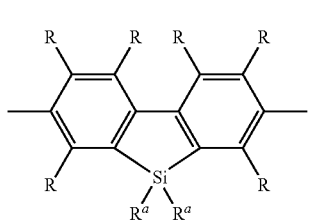
(AA-17)
14
-continued
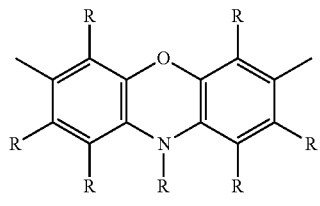
(AA-18)
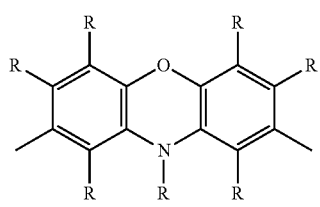
(AA-19)
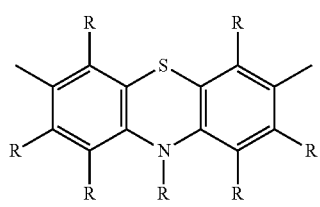
(AA-20)
[Chemical Formula 12]
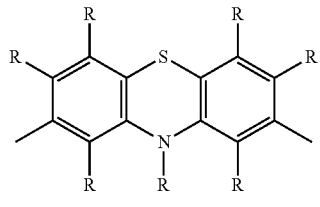
(AA-21)
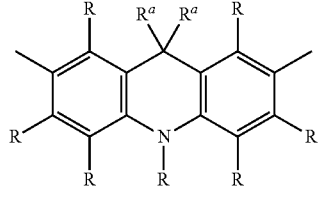
(AA-22)
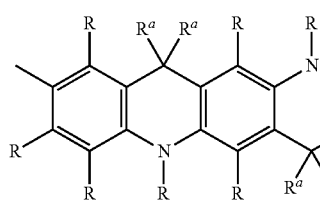
(AA-23)
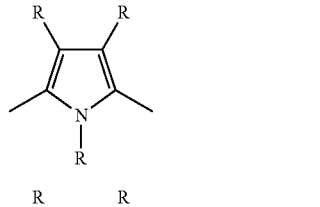
(AA-24)
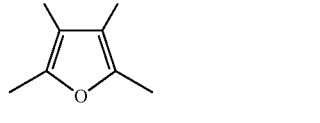
(AA-25)

-continued

[Chemical Formula 13]

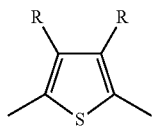
(AA-26)

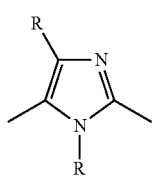
(AA-27)

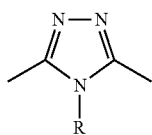
(AA-28)

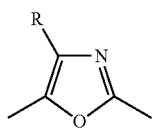
(AA-29)

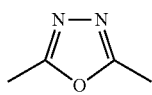
(AA-30)

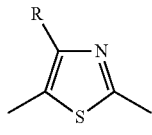
(AA-31)

(AA-32)

[Chemical Formula 14]

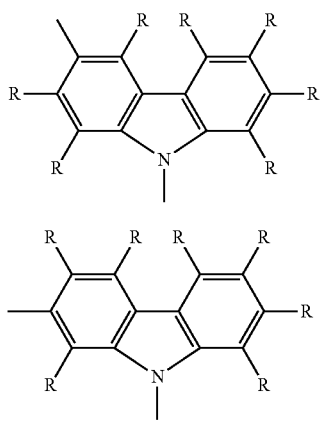
(AA-33)

(AA-34)

[wherein, R and $R^a$ represent the same meaning as described above.]

"Crosslinkable group" is a group capable of forming a new bond by being subjected to a heating treatment, an ultraviolet irradiation treatment, a near ultraviolet irradiation treatment, a visible light irradiation treatment, an infrared irradiation treatment, a radical reaction and the like, and the crosslinkable group is preferably a group represented by any one of the formulae (B-1) to (B-17). These groups each optionally have a substituent.

[Chemical Formula 15]

(B-1)

(B-2)

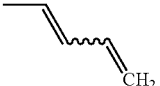
(B-3)

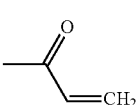
(B-4)

(B-5)

(B-6)

(B-7)

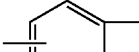
(B-8)

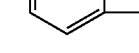
(B-9)

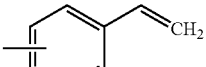
(B-10)

(B-11)

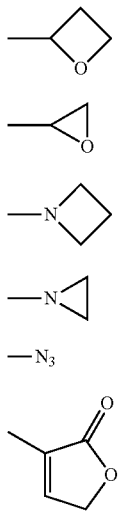

(B-12)

(B-13)

(B-14)

(B-15)

(B-16)

(B-17)

"Substituent" represents a halogen atom, a cyano group, an alkyl group, a cylcoalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

"Dendron" denotes a group having a regular dendritic branched structure having a branching point at an atom or ring (that is, a dendrimer structure). A compound having a dendron (hereinafter, referred to as "dendrimer") includes, for example, structures described in literatures such as International Publication WO02/067343, JP-A No. 2003-231692, International Publication WO2003/079736, International Publication WO2006/097717 and the like.

The dendron is preferably a group represented by the formula (D-A) or (D-B).

[Chemical Formula 16]

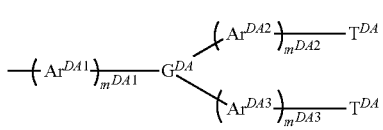

(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, and these groups each optionally have a substituent.

$Ar^{DA1}$, $Ar^{DA2}$ and $Ar^{D3}$ each independently represent an arylene group or a divalent heterocyclic group, and these groups each optionally have a substituent. When a plurality of $Ar^{DA1}$, $Ar^{DA2}$ and $Ar^{DA3}$ are present, they may be the same or different at each occurrence.

$T^{DA}$ represents an aryl group or a monovalent heterocyclic group, and these groups each optionally have a substituent. The plurality of $T^{DA}$ may be the same or different.]

[Chemical Formula 17]

(D-B)

[wherein, $m^{DA1}$, $m^{DA2}$, $m^{DA3}$, $m^{DA4}$, $m^{DA5}$, $m^{DA6}$ and $m^{DA7}$ each independently represent an integer of 0 or more.

$G^{DA}$ represents a nitrogen atom, an aromatic hydrocarbon group or a heterocyclic group, and these groups each optionally have a substituent. The plurality of $G^{DA}$ may be the same or different.

$Ar^{DA1}$, $Ar^{DA2}$, $Ar^{DA3}$, $Ar^{DA4}$, $Ar^{DA5}$, $Ar^{DA6}$ and $Ar^{DA7}$ each independently represent an arylene group or a divalent heterocyclic group, and these groups each optionally have a substituent. When a plurality of $Ar^{DA1}$, $Ar^{DA2}$, $Ar^{DA3}$, $Ar^{DA4}$, $Ar^{DA5}$, $Ar^{DA6}$ and $Ar^{DA7}$ are present, they may be the same or different at each occurrence.

$T^{DA}$ represents an aryl group or a monovalent heterocyclic group, and these groups each optionally have a substituent. The plurality of $T^{DA}$ may be the same or different.]

$m^{DA1}$, $m^{DA2}$, $m^{DA3}$, $m^{DA4}$, $m^{DA5}$, $m^{DA6}$ and $m^{DA7}$ are usually an integer of 10 or less, preferably an integer of 5 or less, more preferably 0 or 1. It is preferable that $m^{DA1}$, $m^{DA2}$, $m^{DA3}$, $m^{DA4}$, $m^{DA5}$, $m^{DA6}$ and $m^{DA7}$ are the same integer.

$G^{DA}$ is preferably a group represented by the formula (GDA-11) to (GDA-15), and these groups each optionally have a substituent.

[Chemical Formula 18]

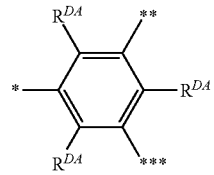

(GDA-11)

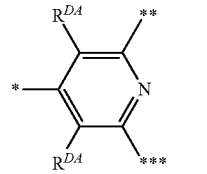

(GDA-12)

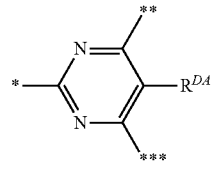

(GDA-13)

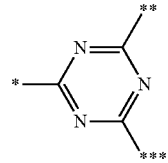

(GDA-14)

-continued (GDA-15)

[wherein,
* represents a linkage to $Ar^{DA1}$ in the formula (D-A), $Ar^{DA1}$ in the formula (D-B), $Ar^{DA2}$ in the formula (D-B) or $Ar^{DA3}$ in the formula (D-B).
** represents a linkage to $Ar^{DA2}$ in the formula (D-A), $Ar^{DA2}$ in the formula (D-B), $Ar^{DA4}$ in the formula (D-B) or $Ar^{DA6}$ in the formula (D-B).
*** represents a linkage to $Ar^{DA3}$ in the formula (D-A), $Ar^{DA3}$ in the formula (D-B), $Ar^{DA5}$ in the formula (D-B) or $Ar^{DA7}$ in the formula (D-B).
$R^{DA}$ represents a hydrogen atom, an alkyl group, a cycloalkyl group, an alkoxy group, a cycloalkoxy group, an aryl group or a monovalent heterocyclic group, and these groups each optionally have a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or cycloalkyl group, and these groups each optionally have a substituent.

$Ar^{DA1}$, $Ar^{DA2}$, $Ar^{DA3}$, $Ar^{DA4}$, $Ar^{DA5}$, $Ar^{DA6}$ and $Ar^{DA7}$ are preferably groups represented by the formulae (ArDA-1) to (ArDA-3).

[Chemical Formula 19]

(ArDA-1)

(ArDA-2)

(ArDA-3)

[wherein,
$R^{DA}$ represents the same meaning as described above.
$R^{DB}$ represents a hydrogen atom, an alkyl group, a cycloalkyl group, an aryl group or a monovalent heterocyclic group, and these groups each optionally have a substituent. When a plurality of $R^{DB}$ are present, they may be the same or different.]

$R^{DB}$ is preferably an alkyl group, a cycloalkyl group, an aryl group or a monovalent heterocyclic group, more preferably an aryl group or a monovalent heterocyclic group, further preferably an aryl group.

$T^{DA}$ is preferably groups represented by the formulae (TDA-1) to (TDA-3).

[Chemical Formula 20]

(TDA-1)

(TDA-2)

(TDA-3)

[wherein, $R^{DA}$ and $R^{DB}$ represent the same meaning described above.]

The group represented by the formula (D-A) is preferably a group represented by the formula (D-A1) to (D-A3).

[Chemical Formula 21]

(D-A1)

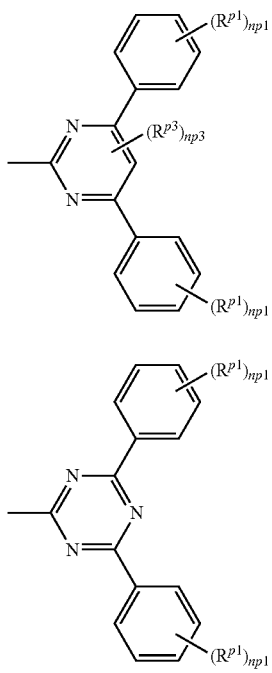

(D-A2)

(D-A3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. The plurality of np1 may be the same or different.]

The group represented by the formula (D-B) is preferably a group represented by the formula (D-B1) to (D-B3).

[Chemical Formula 22]

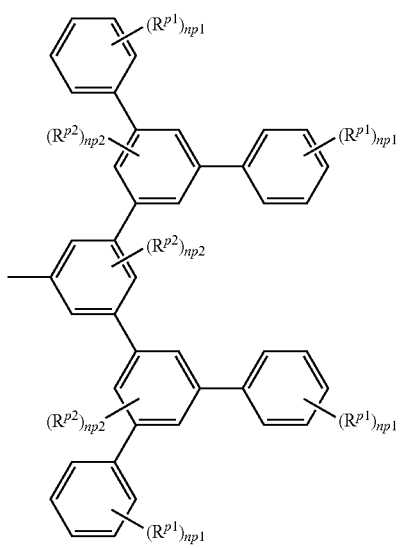

(D-B1)

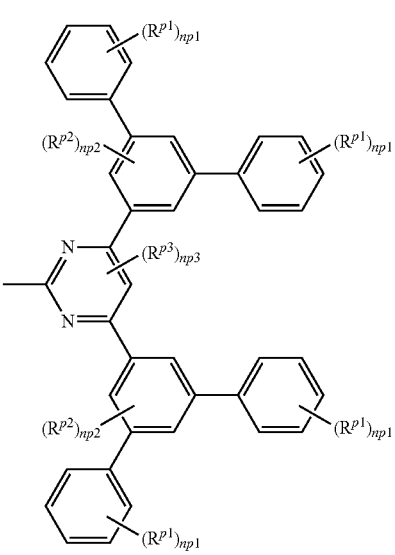

(D-B2)

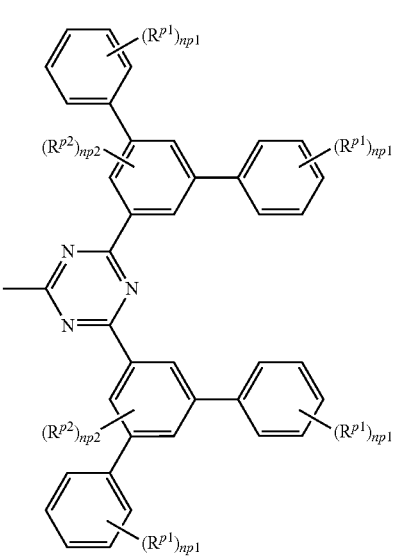

(D-B3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. When a plurality of np1 and np2 are present, they may be the same or different at each occurrence.]

np1 is preferably 0 or 1, more preferably 1. np2 is preferably 0 or 1, more preferably 0. np3 is preferably 0. $R^{p1}$, $R^{p2}$ and $R^{p3}$ are preferably an alkyl group or a cycloalkyl group.

<Solvent>

The solvent (A) and the solvent (B) contained in the composition of the present invention will be illustrated.

In the composition of the present invention, the boiling point under 1 atm of the solvent (A): bpA (° C.) and the boiling point under 1 atm of the solvent (B): bpB (° C.) satisfy the formula (11).

$$bpB < 200° C. \leq bpA \tag{11}$$

In the composition of the present invention, the boiling point under 1 atm of the solvent (A): bpA (° C.) and the boiling point under 1 atm of the solvent (B): bpB (° C.) preferably satisfy the formula (11'), more preferably satisfy the formula (11"), because the flatness of a film formed by using the composition of the present invention is more excellent.

$$80° C. \leq bpB < 200° C. \leq bpA < 320° C. \quad (11')$$

$$100° C. \leq bpB < 200° C. \leq bpA < 300° C. \quad (11'')$$

In the composition of the present invention, the boiling point under 1 atm of the solvent (A): bpA (° C.) and the boiling point under 1 atm of the solvent (B): bpB (° C.) satisfy the formula (12).

$$70° C. \leq bpA - bpB \leq 120° C. \quad (12)$$

In the composition of the present invention, the boiling point under 1 atm of the solvent (A): bpA (° C.) and the boiling point under 1 atm of the solvent (B): bpB (° C.) preferably satisfy the formula (12'), more preferably satisfy the formula (12"), because the flatness of a film formed by using the composition of the present invention is more excellent.

$$80° C. \leq bpA - bpB \leq 120° C. \quad (12')$$

$$90° C. \leq bpA - bpB \leq 120° C. \quad (12'')$$

In the composition of the present invention, the content of the solvent (A): wtA (by weight) and the content of the solvent (B): wtB (by weight) satisfy the formula (13).

$$wtB \leq wtA \quad (13)$$

In the composition of the present invention, the content of the solvent (A): wtA (by weight) and the content of the solvent (B): wtB (by weight) preferably satisfy the formula (13-A) and the formula (13-B), because the flatness of a film formed by using the composition of the present invention is more excellent.

$$0.50 \leq wtA/(wtA+wtB) \leq 0.95 \quad (13\text{-}A)$$

$$0.05 \leq wtB/(wtA+wtB) \leq 0.50 \quad (13\text{-}B)$$

In the composition of the present invention, the content of the solvent (A): wtA (by weight) and the content of the solvent (B): wtB (by weight) more preferably satisfy the formula (13'-A) and the formula (13'-B), because the flatness of a film formed by using the composition of the present invention is more excellent.

$$0.50 \leq wtA/(wtA+wtB) \leq 0.90 \quad (13'\text{-}A)$$

$$0.10 \leq wtB/(wtA+wtB) \leq 0.50 \quad (13'\text{-}B)$$

In the composition of the present invention, the content of the solvent (A): wtA (by weight) and the content of the solvent (B): wtB (by weight) further preferably satisfy the formula (13"-A) and the formula (13"-B), because the flatness of a film formed by using the composition of the present invention is more excellent.

$$0.50 \leq wtA/(wtA+wtB) \leq 0.80 \quad (13''\text{-}A)$$

$$0.20 \leq wtB/(wtA+wtB) \leq 0.50 \quad (13''\text{-}B)$$

The solvent (A) and the solvent (B) contained in the composition of the present invention include, for example, hydrocarbon solvents, monohydric alcohol solvents, polyhydric alcohol solvents, ester solvents, ketone solvents, ether solvents, solvents comprising a nitrogen atom and solvents comprising a sulfur atom.

The solvent (A) and the solvent (B) contained in the composition of the present invention each independently represent preferably a hydrocarbon solvent, an ester solvent, a ketone solvent or an ether solvent, more preferably a hydrocarbon solvent, an ester solvent or an ether solvent, further preferably a hydrocarbon solvent or an ether solvent, particularly preferably an aromatic hydrocarbon solvent or an aromatic ether solvent.

It is preferable that at least one of the solvent (A) and the solvent (B) contained in the composition of the present invention is an aromatic ether solvent.

The solvent (A) contained in the composition of the present invention has a boiling point under 1 atm of 200° C. or higher, and examples thereof include the following solvents.

The hydrocarbon solvent includes, for example, aliphatic hydrocarbon solvents such as n-dodecane, n-tridecane, n-tetradecane and bicyclohexyl; and aromatic hydrocarbon solvents such as n-pentylbenzene, n-hexylbenzene, n-heptylbenzene, n-octylbenzene, n-nonylbenzene, n-decylbenzene, dodecylbenzene, 1,3-di-isopropylbenzene, 1,4-di-isopropylbenzene, cyclohexylbenzene, tetralin and biphenyl.

The monohydric alcohol solvent includes, for example, aliphatic alcohol solvents such as 1-nonanol, n-decanol, 2-decanol, n-undecanol, isodecanol and n-tetradecanol; and aromatic alcohol solvents such as m-cresol, p-cresol, p-ethylphenol, 4-methoxyphenol, o-n-propylphenol, o-isopropylphenol, o-sec-butylphenol, o-t-butylphenol, m-t-butylphenol, p-t-butylphenol and benzyl alcohol.

The polyhydric alcohol solvent includes, for example, diethylene glycol, triethylene glycol, ethylene glycol mono-2-ethyl hexyl ether, ethylene glycol monobutyl ether, ethylene glycol monohexyl ether, ethylene glycol monobenzyl ether, dipropylene glycol, tripropylene glycol, 1,3-butanediol, 1,4-butanediol, neopentyl glycol, 1,5-pentanediol and 1,6-hexanediol.

The ester solvent includes, for example, aliphatic ester solvents such as n-octyl acetate and diethyl succinate; and aromatic ester solvents such as ethyl benzoate and n-butyl benzoate.

The ketone solvent includes, for example, 2-(1-cyclohexenyl)cyclohexanone and isophorone.

The ether solvent includes, for example, aliphatic ether solvents such as triethylene glycol dimethyl ether and tetraethylene glycol dimethyl ether; and aromatic ether solvents such as n-butyl phenyl ether, t-butylanisole, n-pentylanisole, n-hexylanisole, n-heptylanisole, n-octylanisole, 1-methyl naphthyl ether, 2-methyl naphthyl ether, diphenyl ether and 3-phenoxytoluene, and aromatic ether solvents are preferable.

The solvent comprising a nitrogen atom includes, for example, acetamide, N-methylpyrrolidone and 2-pyrrolidone.

The solvent comprising a sulfur atom includes, for example, thiodiglycol and sulfolane.

The solvent (B) contained in the composition of the present invention has a boiling point under 1 atom of lower than 200° C., and examples thereof include the following solvents.

The hydrocarbon solvent includes, for example, aliphatic hydrocarbon solvents such as n-octane, n-nonane, n-decane, n-undecane, methylcyclohexane, dimethylcyclohexane, ethylcyclohexane, cycloheptane and decalin; and aromatic hydrocarbon solvents such as toluene, o-xylene, p-xylene, m-xylene, mesitylene, 1,2,4-trimethylbenzene, ethylbenzene, o-diethylbenzene, m-diethylbenzene, p-diethylbenzene, o-ethylmethylbenzene, p-ethylmethylbenzene, m-ethylmethylbenzene, n-propylbenzene, isopropylbenzene, n-butylbenzene, sec-butylbenzene, isobutylbenzene and t-butylbenzene.

The monohydric alcohol solvent includes, for example, aliphatic alcohol solvents such as 1-butanol, 1-pentanol, 2-pentanol, 1-hexanol, 2-hexanol, 1-heptanol, 2-heptanol, 1-octanol, 2-octanol, cyclopentanol, cyclohexanol, methylcyclohexanol, dimethylcyclohexanol, cyclohexenol, cyclohexylmethanol, tetrahydrofurfuryl alcohol and 2-nonanol; and aromatic alcohol solvents such as phenol, o-cresol and o-ethylphenol.

The polyhydric alcohol solvent includes, for example, ethylene glycol, ethylene glycol monoethyl ether, ethylene glycol monomethyl ether, propylene glycol, propylene glycol monoethyl ether, propylene glycol monomethyl ether and hexylene glycol.

The ester solvent includes, for example, aliphatic ester solvents such as n-butyl formate, allyl acetate, n-butyl acetate, dimethyl succinate, diethyl oxalate, dimethyl oxalate, methyl lactate, ethyl lactate, methyl pyruvate, ethyl pyruvate, dimethyl malonate and diethyl malonate; and aromatic ester solvents such as methyl benzoate.

The ketone solvent includes, for example, cyclopentanone, cyclohexanone, methylcyclohexanone, methyl isobutyl ketone, diisopropyl ketone and diisobutyl ketone.

The ether solvent includes, for example, aliphatic ether solvents such as ethylene glycol diethyl ether, dibutyl ether, dioxane and tetrahydrofuran; and aromatic ether solvents such as anisole, ethylphenyl ether, 2-methylanisole, 3-methylanisole, 4-methylanisole, 2,5-dimethylanisole, 2-ethylanisole and 4-ethylanisole.

The solvent comprising a nitrogen atom includes, for example, N,N-dimethylacetamide, N,N-dimethylformamide and N, N-diisopropylethylamine.

The solvent comprising a sulfur atom includes, for example, dimethyl sulfoxide.

In the composition of the present invention, a solvent satisfying the formula (14) (hereinafter, referred to also as "solvent (C)") may also be contained as the solvent other than the solvent (A) and the solvent (B). In the composition of the present invention, one kind of the solvent (C) may be contained singly or two or more kinds of the solvents (C) may be contained.

$$wtC < wtB \leq wtA \quad (14)$$

(wherein, wtC represents the content of the solvent (C) (by weight). When two or more kinds of the solvents (C) are contained in the composition of the present invention, wtC represents the total content of the solvents (C) (by weight).).

When the solvent (C) is contained in the composition of the present invention, the content of the solvent (A): wtA (by weight), the content of the solvent (B): wtB (by weight) and the content of the solvent (C): wtC (by weight) preferably satisfy the formula (14-A) and the formula (14-B), because the flatness of a film formed by using the composition of the present invention is more excellent.

$$0.50 \leq wtA/(wtA+wtB+wtC) \leq 0.95 \quad (14\text{-A})$$

$$0.05 \leq wtB/(wtA+wtB+wtC) \leq 0.50 \quad (14\text{-B})$$

When the solvent (C) is contained in the composition of the present invention, the content of the solvent (A: wtA (by weight), the content of the solvent (B): wtB (by weight) and the content of the solvent (C): wtC (by weight) more preferably satisfy the formula (14'-A) and the formula (14'-B), because the flatness of a film formed by using the composition of the present invention is more excellent.

$$0.50 \leq wtA/(wtA+wtB+wtC) \leq 0.90 \quad (14'\text{-A})$$

$$0.10 \leq wtB/(wtA+wtB+wtC) \leq 0.50 \quad (14'\text{-B})$$

When the solvent (C) is contained in the composition of the present invention, the content of the solvent (A): wtA (by weight), the content of the solvent (B): wtB (by weight) and the content of the solvent (C): wtC (by weight) further preferably satisfy the formula (14"-A) and the formula (14"-B), because the flatness of a film formed by using the composition of the present invention is more excellent.

$$0.50 \leq wtA/(wtA+wtB+wtC) \leq 0.80 \quad (14"\text{-A})$$

$$0.20 \leq wtB/(wtA+wtB+wtC) \leq 0.50 \quad (14"\text{-B})$$

When the solvent (C) is contained in the composition of the present invention, the content of the solvent (A): wtA (by weight), the content of the solvent (B): wtB (by weight) and the content of the solvent (C): wtC (by weight) preferably satisfy the formula (14-C), more preferably satisfy the formula (14'-C), further preferably satisfy the formula (14"-C), because the flatness of a film formed by using the composition of the present invention is more excellent.

$$0.01 \leq wtC/(wtA+wtB+wtC) \leq 0.20 \quad (14\text{-C})$$

$$0.02 \leq wtC/(wtA+wtB+wtC) \leq 0.15 \quad (14'\text{-C})$$

$$0.03 \leq wtC/(wtA+wtB+wtC) \leq 0.10 \quad (14"\text{-C})$$

When the solvent (C) is contained in the composition of the present invention, the boiling point under 1 atm of the solvent (C): bpC (° C.) preferably satisfies the formula (15), more preferably satisfies the formula (15'), further preferably satisfies the formula (15").

$$25° C. \leq bpC \leq 350° C. \quad (15)$$

$$50° C. \leq bpC \leq 350° C. \quad (15')$$

$$80° C. \leq bpC \leq 350° C. \quad (15")$$

When the solvent (C) is contained in the composition of the present invention, the solvent (C) includes, for example, hydrocarbon solvents, monohydric alcohol solvents, polyhydric alcohol solvents, ester solvents, ketone solvents, ether solvents, solvents comprising a nitrogen atom and solvents comprising a sulfur atom.

When the solvent (C) is contained in the composition of the present invention, the solvent (C) is preferably a hydrocarbon solvent, an ester solvent, a ketone solvent or an ether solvent, more preferably a hydrocarbon solvent, an ester solvent or an ether solvent, further preferably a hydrocarbon solvent or an ether solvent, particularly preferably an aromatic hydrocarbon solvent or an aromatic ether solvent.

When the solvent (C) is contained in the composition of the present invention, examples of the solvent (C) include the same examples as those of the solvent (A) and the solvent (B) described above.

As the combination of the solvent (A) and the solvent (B) contained in the composition of the present invention, combinations of INK-001 to INK026 in Table 1 are preferable.

TABLE 1

| | solvent A | bpA (° C.) | solvent B | bpB (° C.) | difference in boiling point bpA − bpB |
|---|---|---|---|---|---|
| INK-001 | tetralin | 207 | ethylbenzene | 136 | 71 |
| INK-002 | n-heptylbenzene | 235 | mesitylene | 164 | 71 |
| INK-003 | n-hexylbenzene | 226 | anisole | 154 | 72 |
| INK-004 | cyclohexylbenzene | 236 | mesitylene | 164 | 72 |
| INK-005 | 3-phenoxytoluene | 272 | methyl benzoate | 199 | 73 |

TABLE 1-continued

| | solvent A | bpA (° C.) | solvent B | bpB (° C.) | difference in boiling point bpA − bpB |
|---|---|---|---|---|---|
| INK-006 | n-butyl phenyl ether | 210 | ethylbenzene | 136 | 74 |
| INK-007 | butyl benzoate | 250 | 4-methylanisole | 175 | 75 |
| INK-008 | ethyl benzoate | 212 | ethylbenzene | 136 | 76 |
| INK-009 | butyl benzoate | 250 | sec-butylbenzene | 173 | 77 |
| INK-010 | n-heptylbenzene | 235 | anisole | 154 | 81 |
| INK-011 | cyclohexylbenzene | 236 | anisole | 154 | 82 |
| INK-012 | butyl benzoate | 250 | mesitylene | 164 | 86 |
| INK-013 | n-hexylbenzene | 226 | ethylbenzene | 136 | 90 |
| INK-014 | butyl benzoate | 250 | anisole | 154 | 96 |
| INK-015 | tetralin | 207 | toluene | 110 | 97 |
| INK-016 | 3-phenoxytoluene | 272 | 4-methylanisole | 175 | 97 |
| INK-017 | n-heptylbenzene | 235 | ethylbenzene | 136 | 99 |
| INK-018 | 3-phenoxytoluene | 272 | sec-butylbenzene | 173 | 99 |
| INK-019 | n-decylbenzene | 298 | methyl benzoate | 199 | 99 |
| INK-020 | n-butyl phenyl ether | 210 | toluene | 110 | 100 |
| INK-021 | cyclohexylbenzene | 236 | ethylbenzene | 136 | 100 |
| INK-022 | ethyl benzoate | 212 | toluene | 110 | 102 |
| INK-023 | 3-phenoxytoluene | 272 | mesitylene | 164 | 108 |
| INK-024 | butyl benzoate | 250 | ethylbenzene | 136 | 114 |
| INK-025 | n-hexylbenzene | 226 | toluene | 110 | 116 |
| INK-026 | 3-phenoxytoluene | 272 | anisole | 154 | 118 |

As the combination of the solvent (A), the solvent (B) and the solvent (C) contained in the composition of the present invention, combinations of INK-101 to INK121 in Table 2 are preferable.

TABLE 2

| | solvent A | bpA (° C.) | solvent B | bpB (° C.) | difference in boiling point bpA-bpB | solvent C | bpC (° C.) |
|---|---|---|---|---|---|---|---|
| INK-101 | tetralin | 207 | ethylbenzene | 136 | 71 | 4-methylanisole | 175 |
| INK-102 | tetralin | 207 | ethylbenzene | 136 | 71 | n-heptylbenzene | 164 |
| INK-103 | tetralin | 207 | ethylbenzene | 136 | 71 | butyl benzoate | 250 |
| INK-104 | butyl benzoate | 250 | 4-methylanisole | 175 | 75 | cyclohexylbenzene | 236 |
| INK-105 | butyl benzoate | 250 | 4-methylanisole | 175 | 75 | 3-phenoxytoluene | 272 |
| INK-106 | butyl benzoate | 250 | 4-methylanisole | 175 | 75 | n-heptylbenzene | 164 |
| INK-107 | cyclohexylbenzene | 236 | anisole | 154 | 82 | butyl benzoate | 250 |
| INK-108 | cyclohexylbenzene | 236 | anisole | 154 | 82 | 3-phenoxytoluene | 272 |
| INK-109 | cyclohexylbenzene | 236 | anisole | 154 | 82 | n-heptylbenzene | 164 |
| INK-110 | 3-phenoxytoluene | 272 | 4-methylanisole | 175 | 97 | cyclohexylbenzene | 164 |
| INK-111 | 3-phenoxytoluene | 272 | 4-methylanisole | 175 | 97 | butyl benzoate | 250 |
| INK-112 | 3-phenoxytoluene | 272 | 4-methylanisole | 175 | 97 | n-heptylbenzene | 164 |
| INK-113 | 3-phenoxytoluene | 272 | sec-butylbenzene | 173 | 99 | cyclohexylbenzene | 236 |
| INK-114 | 3-phenoxytoluene | 272 | sec-butylbenzene | 173 | 99 | butyl benzoate | 250 |
| INK-115 | 3-phenoxytoluene | 272 | sec-butylbenzene | 173 | 99 | n-heptylbenzene | 164 |
| INK-116 | butyl benzoate | 250 | ethylbenzene | 136 | 114 | 3-phenoxytoluene | 272 |
| INK-117 | butyl benzoate | 250 | ethylbenzene | 136 | 114 | cyclohexylbenzene | 236 |
| INK-118 | butyl benzoate | 250 | ethylbenzene | 136 | 114 | n-heptylbenzene | 164 |
| INK-119 | 3-phenoxytoluene | 272 | anisole | 154 | 118 | cyclohexylbenzene | 236 |
| INK-120 | 3-phenoxytoluene | 272 | anisole | 154 | 118 | butyl benzoate | 250 |

TABLE 2-continued

| solvent A | | bpA (° C.) | solvent B | bpB (° C.) | difference in boiling point bpA-bpB | solvent C | bpC (° C.) |
|---|---|---|---|---|---|---|---|
| INK-121 | 3-phenoxytoluene | 272 | anisole | 154 | 118 | n-heptylbenzene | 164 |

<Phosphorescent Compound>

The phosphorescent compound contained the composition of the present invention will be illustrated.

The phosphorescent compound contained the composition of the present invention is preferably a phosphorescent compound represented by the formula (1).

[Chemical Formula 23]

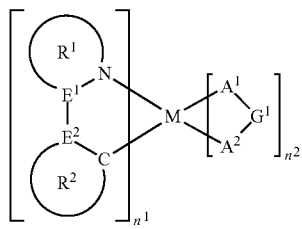

(1)

The phosphorescent compound represented by the formula (1) is constituted of M as a central metal, a ligand of which number is prescribed by a subscript $n^1$ and a ligand of which number is prescribed by a subscript $n^2$.

M is preferably an iridium atom or a platinum atom, more preferably an iridium atom, because the light emitting device of the present invention is more excellent in light emission efficiency.

$n^1$ is preferably 2 or 3, more preferably 3 when M is a ruthenium atom, a rhodium atom or an iridium atom.

$n^1$ is preferably 2 when M is a palladium atom or a platinum atom.

It is preferable that $E^1$ and $E^2$ are a carbon atom.

The ring $R^1$ is preferably a quinoline ring, an isoquinoline ring, a pyridine ring, a pyrimidine ring, an imidazole ring or a triazole ring, more preferably a pyridine ring, a pyrimidine ring, an imidazole ring or a triazole ring, and these rings each optionally have a substituent.

The ring $R^2$ is preferably a benzene ring, a naphthalene ring, a fluorene ring, a phenanthrene ring, a pyridine ring, a diazabenzene ring or a triazine ring, more preferably a benzene ring, a pyridine ring or a pyrimidine ring, and these rings each optionally have a substituent.

The substituent which the ring $R^1$ and the ring $R^2$ optionally have includes an alkyl group, a cycloalkyl group, an alkoxy group, a cycloalkoxy group, an aryl group, an aryloxy group, a monovalent heterocyclic group, a halogen atom and a substituted amino group, preferably an alkyl group, a cycloalkyl group, an aryl group, a monovalent heterocyclic group or a substituted amino group, more preferably an alkyl group, an aryl group, a monovalent heterocyclic group or a substituted amino group.

It is preferable that the at least one ring selected from the group consisting of the ring $R^1$ and the ring $R^2$ has a group represented by the formula (2), and it is more preferable that the ring $R^2$ has a group represented by the formula (2), because a light emitting device produced by using the composition of the present invention is more excellent in luminance life.

$$-R^{100} \quad (2)$$

When a plurality of the rings $R^1$ and the rings $R^2$ are present, it is preferable that all of the plurality of the rings $R^1$, all of the plurality of the rings $R^2$ or all of the plurality of the rings $R^1$ and the rings $R^2$ have a group represented by the formula (2), and it is more preferable that all of the plurality of the rings $R^2$ have a group represented by the formula (2).

$R^{100}$ is preferably an aryl group or a monovalent heterocyclic group, more preferably an aryl group.

The aryl group, the monovalent heterocyclic group or the substituted amino group represented by $R^{100}$ is preferably a dendron.

The anionic bidentate ligand represented by $A^1$-$G^1$-$A^2$ includes, for example, ligands represented by the following formulae.

[Chemical Formula 24]

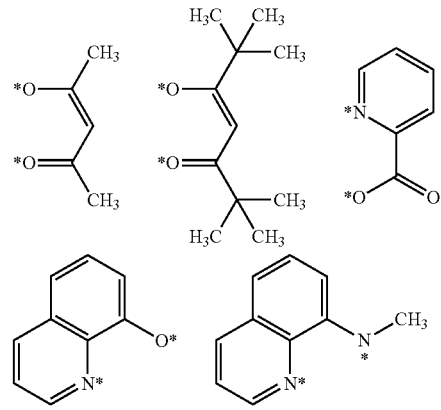

[Chemical Formula 25]

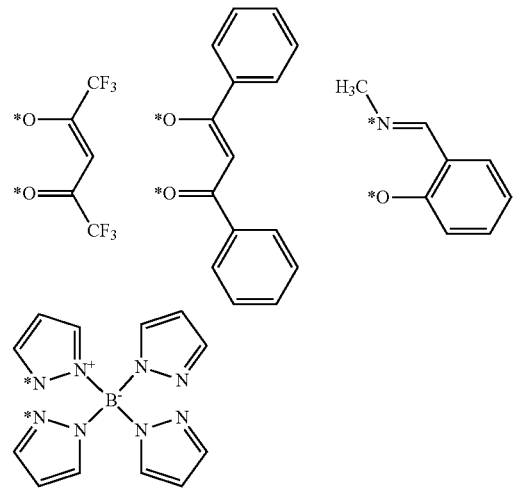

[wherein, * represents a site binding to M.]

The phosphorescent compound represented by the formula (1) is preferably a phosphorescent compound represented by the formula (1-A) or a phosphorescent compound represented by the formula (1-B), because a light emitting device produced by using the composition of the present invention is excellent in light emission efficiency.

[Chemical Formula 26]

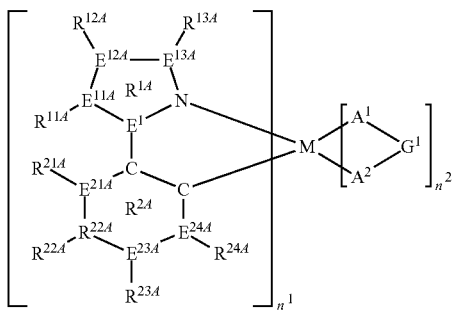

(1-A)

[wherein,

M, $n^1$, $n^2$, $E^1$ and $A^1$-$G^1$-$A^2$ represent the same meaning as described above.

$E^{11A}$, $E^{12A}$, $E^{13A}$, $E^{21A}$, $E^{22A}$, $E^{23A}$ and $E^{24A}$ each independently represent a nitrogen atom or a carbon atom. When a plurality of $E^{11A}$, $E^{12A}$, $E^{13A}$, $E^{21A}$, $E^{22A}$, $E^{23A}$ and $E^{24A}$ are present, they may be the same or different at each occurrence. $R^{11A}$, $R^{12A}$ and $R^{13A}$ may be either present or not present when $E^{11A}$, $E^{12A}$ and $E^{13A}$ are a nitrogen atom. $R^{21A}$, $R^{22A}$, $R^{23A}$ and $R^{24A}$ are not present when $E^{21A}$, $E^{22A}$, $E^{23A}$ and $E^{24A}$ are a nitrogen atom.

$R^{11A}$, $R^{12A}$, $R^{13A}$, $R^{21A}$, $R^{22A}$, $R^{23A}$ and $R^{24A}$ each independently represent a hydrogen atom, an alkyl group, a cycloalkyl group, an alkoxy group, a cycloalkoxy group, an aryl group, an aryloxy group, a monovalent heterocyclic group, a halogen atom or a substituted amino group, and these groups each optionally have a substituent. When a plurality $R^{11A}$, $R^{12A}$, $R^{13A}$, $R^{21A}$, $R^{22A}$, $R^{23A}$ and $R^{24A}$ are present, they may be the same or different at each occurrence. $R^{11A}$ and $R^{12A}$, $R^{12A}$ and $R^{13A}$, $R^{11A}$ and $R^{21A}$, $R^{21A}$ and $R^{22A}$, $R^{22A}$ and $R^{23A}$, and $R^{23A}$ and $R^{24A}$ each may be combined together to form a ring together with the atoms to which they are attached.

The ring $R^{1A}$ represents an imidazole ring or a triazole ring constituted of a nitrogen atom, $E^1$, $E^{11A}$, $E^{12A}$ and $E^{13A}$.

The ring $R^{2A}$ represents a benzene ring, a pyridine ring or a pyrimidine ring constituted of two carbon atoms, $E^{21A}$, $E^{22A}$, $E^{23A}$ and $E^{24A}$.]

It is preferable that at least one selected from the group consisting $R^{11A}$, $R^{12A}$, $R^{13A}$, $R^{21A}$, $R^{22A}$, $R^{23A}$ and $R^{24A}$ is a group represented by the formula (2), because a light emitting device produced by using the composition of the present invention is excellent in luminance life.

When the ring $R^{1A}$ is an imidazole ring, an imidazole ring in which $E^{11A}$ is a nitrogen atom or an imidazole ring in which $E^{12A}$ is a nitrogen atom is preferable, an imidazole ring in which $E^{11A}$ is a nitrogen atom is more preferable.

When the ring $R^{1A}$ is a triazole ring, a triazole ring in which $E^{11A}$ and $E^{12A}$ are a nitrogen atom or a triazole ring in which $E^{11A}$ and $E^{13A}$ are a nitrogen atom is preferable, a triazole ring in which $E^{11A}$ and $E^{12A}$ are a nitrogen atom is more preferable.

When $E^{11A}$ is a nitrogen atom and $R^{11A}$ is present, it is preferable that $R^{11A}$ is an alkyl group, a cycloalkyl group or a group represented by the formula (2).

When $E^{11A}$ a carbon atom, $R^{11A}$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom, an alkyl group or a cycloalkyl group.

When $E^{12A}$ is a nitrogen atom and $R^{12A}$ is present, it is preferable that $R^{12A}$ is an alkyl group, a cycloalkyl group or a group represented by the formula (2).

When $E^{12A}$ is a carbon atom, $R^{12A}$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom, an alkyl group or a cycloalkyl group.

When $E^{13A}$ is a nitrogen atom and $R^{13A}$ is present, it is preferable that $R^{13A}$ is an alkyl group, a cycloalkyl group or a group represented by the formula (2).

When $E^{13A}$ is a carbon atom, $R^{13A}$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom, an alkyl group or a cycloalkyl group.

When the ring $R^{1A}$ has a group represented by the formula (2), it is preferable that $R^{11A}$ or $R^{12A}$ is a group represented by the formula (2), and it is more preferable that $R^{11A}$ is a group represented by the formula (2). The group represented by the formula (2) is preferably a dendron.

When the ring $R^{2A}$ is a pyridine ring, a pyridine ring in which $E^{21A}$ is a nitrogen atom, a pyridine ring in which $E^{22A}$ is a nitrogen atom or a pyridine ring in which $E^{23A}$ is a nitrogen atom is preferable, a pyridine ring in which $E^{22A}$ is a nitrogen atom is more preferable.

When the ring $R^{2A}$ is a pyrimidine ring, a pyrimidine ring in which $E^{21A}$ and $E^{23A}$ are a nitrogen atom or a pyrimidine ring in which $E^{22A}$ and $E^{24A}$ are a nitrogen atom is preferable, a pyrimidine ring in which $E^{22A}$ and $E^{24A}$ are a nitrogen atom is more preferable.

The ring $R^{2A}$ is preferably a benzene ring.

$R^{21A}$, $R^{22A}$, $R^{23A}$ and $R^{24A}$ are preferably a hydrogen atom, an alkyl group, a cycloalkyl group or a group represented by the formula (2), more preferably a hydrogen atom or a group represented by the formula (2).

When the ring $R^{2A}$ has a group represented by the formula (2), it is preferable that $R^{22A}$ or $R^{23A}$ is a group represented by the formula (2), it is more preferable that $R^{22A}$ is a group represented by the formula (2). The group represented by the formula (2) is preferably a dendron.

[Chemical Formula 27]

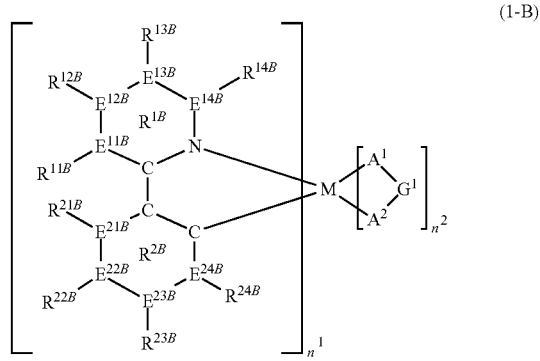

(1-B)

[wherein,

M, $n^1$, $n^2$ and $A^1$-$G^1$-$A^2$ represent the same meaning as described above.

$E^{11B}$, $E^{12B}$, $E^{13B}$, $E^{14B}$, $E^{21B}$, $E^{22B}$, $E^{23B}$ and $E^{24B}$ each independently represent a nitrogen atom or a carbon atom. When a plurality of $E^{11B}$, $E^{12B}$, $E^{13B}$, $E^{14B}$, $E^{21B}$, $E^{22B}$, $E^{23B}$ and $E^{24B}$ are present, they may be the same or different at each occurrence. $R^{11B}$, $R^{12B}$, $R^{13B}$, $R^{14B}$, $R^{21B}$, $R^{22B}$, $R^{23B}$ and $R^{24B}$ are not present when $E^{11B}$, $E^{12B}$, $E^{13B}$, $E^{14B}$, $E^{21B}$, $E^{22B}$, $E^{23B}$ and $E^{24B}$ are a nitrogen atom.

$R^{11B}$, $R^{12B}$, $R^{13B}$, $R^{14B}$, $R^{21B}$, $R^{22B}$, $R^{23B}$ and $R^{24B}$ each independently represent a hydrogen atom, an alkyl group, a cycloalkyl group, an alkoxy group, a cycloalkoxy group, an aryl group, an aryloxy group, a monovalent heterocyclic group, a halogen atom or a substituted amino group, and these groups each optionally have a substituent. When a plurality of $R^{11B}$, $R^{12B}$, $R^{13B}$, $R^{14B}$, $R^{21B}$, $R^{22B}$, $R^{23B}$ and $R^{24B}$ are present, they may be the same or different at each occurrence. $R^{11B}$ and $R^{12B}$, $R^{12B}$ and $R^{13B}$, $R^{13B}$ and $R^{14B}$, $R^{11B}$ and $R^{21B}$, $R^{21B}$ and $R^{22B}$, $R^{22B}$ and $R^{23B}$, and $R^{23B}$ and $R^{24B}$ each may be combined together to form a ring together with the atoms to which they are attached.

The ring $R^{1B}$ represents a pyridine ring or a pyrimidine ring constituted of a nitrogen atom, a carbon atom, $E^{11B}$, $E^{12B}$, $E^{13B}$ and $E^{14B}$.

The ring $R^{2B}$ represents a benzene ring, a pyridine ring or a pyrimidine ring constituted of two carbon atoms, $E^{21B}$, $E^{22B}$, $E^{23B}$ and $E^{24B}$.]

It is preferable that at least one selected from the group consisting of $R^{11B}$, $R^{12B}$, $R^{13B}$, $R^{14B}$, $R^{21B}$, $R^{22B}$, $R^{23B}$ and $R^{24B}$ is a group represented by the formula (2), because a light emitting device produced by using the composition of the present invention is excellent in luminance life.

When the ring $R^{1B}$ is a pyrimidine ring, a pyrimidine ring in which $E^{11B}$ is a nitrogen atom or a pyrimidine ring in which $E^{13B}$ is a nitrogen atom is preferable, a pyrimidine ring in which $E^{11B}$ is a nitrogen atom is more preferable.

$R^{11B}$, $R^{12B}$, $R^{13B}$ and $R^{14B}$ are preferably a hydrogen atom, an alkyl group, a cycloalkyl group or a group represented by the formula (2), more preferably a hydrogen atom or a group represented by the formula (2).

When the ring $R^{1B}$ has a group represented by the formula (2), it is preferable that $R^{11B}$, $R^{12B}$ or $R^{13B}$ is a group represented by the formula (2), it is more preferable that $R^{11B}$ or $R^{13B}$ is a group represented by the formula (2), it is further preferable that $R^{11B}$ is a group represented by the formula (2). The group represented by the formula (2) is preferably a dendron.

When the ring $R^{2B}$ is a pyridine ring, a pyridine ring in which $E^{21B}$ is a nitrogen atom, a pyridine ring in which $E^{22B}$ is a nitrogen atom or a pyridine ring in which $E^{23B}$ is a nitrogen atom is preferable, a pyridine ring in which $E^{22B}$ is a nitrogen atom is more preferable.

When the ring $R^{2B}$ is a pyrimidine ring, a pyrimidine ring in which $E^{21B}$ and $E^{23B}$ are a nitrogen atom or a pyrimidine ring in which $E^{22B}$ and $E^{24B}$ are a nitrogen atom is preferable, a pyrimidine ring in which $E^{22B}$ and $E^{24B}$ are a nitrogen atom is more preferable.

The ring $R^{2B}$ is preferably a benzene ring.

$R^{21B}$, $R^{22B}$, $R^{23B}$ and $R^{24B}$ are preferably a hydrogen atom, an alkyl group, a cycloalkyl group or a group represented by the formula (2), more preferably a hydrogen atom or a group represented by the formula (2).

When the ring $R^{2B}$ has a group represented by the formula (2), it is preferable that $R^{22B}$ or $R^{23B}$ is a group represented by the formula (2), it is more preferable that $R^{22B}$ is a group represented by the formula (2). The group represented by the formula (2) is preferably a dendron.

The phosphorescent compound represented by the formula (1-A) is preferably a phosphorescent compound represented by the formula (1-A1), a phosphorescent compound represented by the formula (1-A2), a phosphorescent compound represented by the formula (1-A3) or a phosphorescent compound represented by the formula (1-A4).

[Chemical Formula 28]

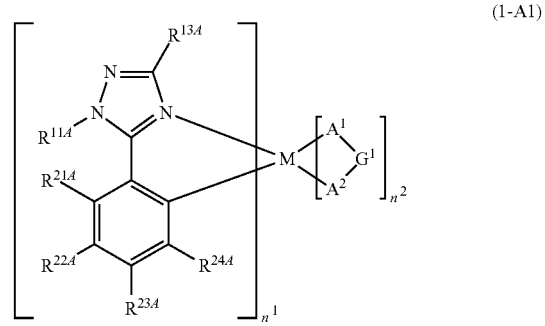

(1-A1)

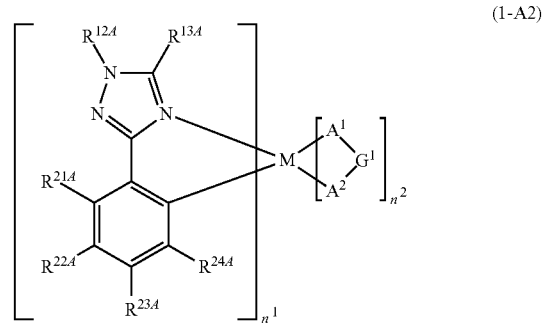

(1-A2)

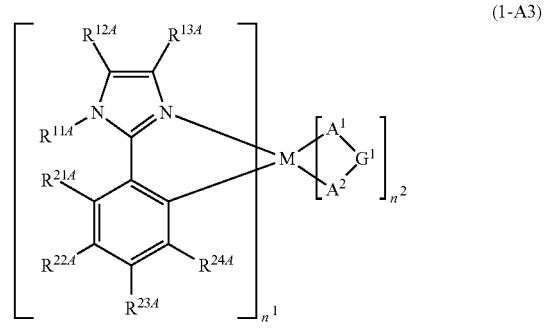

(1-A3)

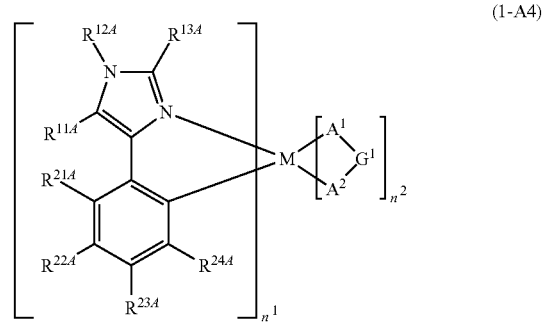

(1-A4)

[wherein,

M, $n^1$, $n^2$, $R^{11A}$, $R^{12A}$, $R^{13A}$, $R^{21A}$, $R^{22A}$, $R^{23A}$, $R^{24A}$ and $A^1$-$G^1$-$A^2$ represent the same meaning as described above.]

The phosphorescent compound represented by the formula (1-B) is preferably a phosphorescent compound represented by the formula (1-B1), a phosphorescent compound represented by the formula (1-B2) or a phosphorescent compound represented by the formula (1-B3).

[Chemical Formula 29]

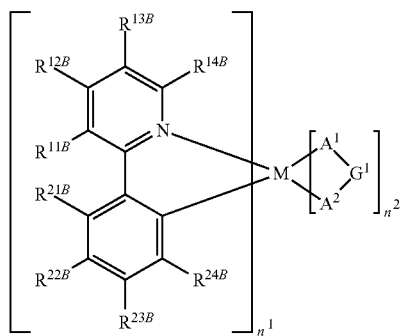

(1-B1)

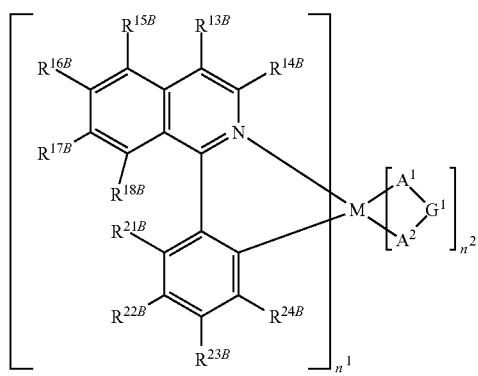

(1-B2)

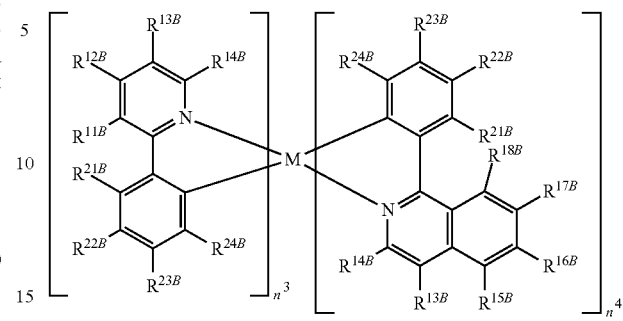

(1-B3)

[wherein,

M, $n^1$, $n^2$, $R^{11B}$, $R^{12B}$, $R^{13B}$, $R^{14B}$, $R^{21B}$, $R^{22B}$, $R^{23B}$, $R^{24B}$ and $A^1$-$G^1$-$A^2$ represent the same meaning as described above.

$n^3$ and $n^4$ each independently represent an integer of 1 or more, and $n^3+n^4$ is 2 or 3. $n^3+n^4$ is 3 when M is a ruthenium atom, a rhodium atom or an iridium atom, while $n^3+n^4$ is 2 when M is a palladium atom or a platinum atom.

$R^{15B}$, $R^{16B}$, $R^{17B}$ and $R^{18B}$ each independently represent a hydrogen atom, an alkyl group, a cycloalkyl group, an alkoxy group, a cycloalkoxy group, an aryl group, an aryloxy group, a monovalent heterocyclic group, a halogen atom or a substituted amino group, and these groups each optionally have a substituent. When a plurality of $R^{15B}$, $R^{16B}$, $R^{17B}$ and $R^{18B}$ are present, they may be the same or different at each occurrence. $R^{13B}$ and $R^{15B}$, $R^{15B}$ and $R^{16B}$, $R^{16B}$ and $R^{17B}$ and $R^{18B}$, and $R^{18B}$ and $R^{21B}$ each may be combined together to form a ring together with the atoms to which they are attached.]

The phosphorescent compound represented by the formula (1) includes, for example, phosphorescent compounds represented by the following formulae.

[Chemical Formula 30]

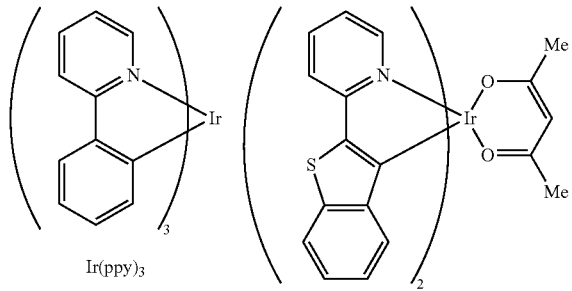

Ir(ppy)₃    Btp₂Ir(acac)

-continued
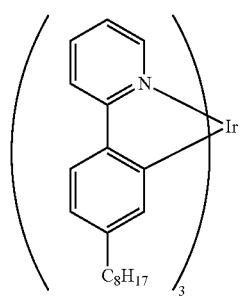
COM-1
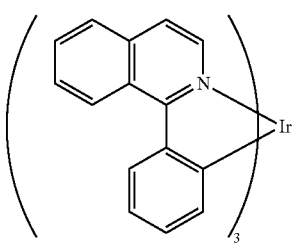
COM-2
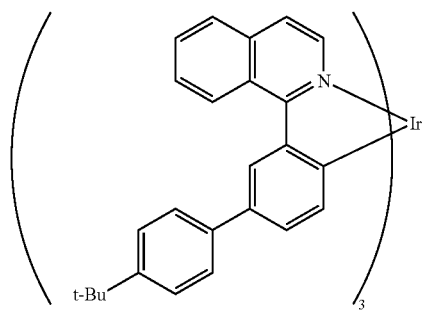
COM-3
[Chemical Formula 31]
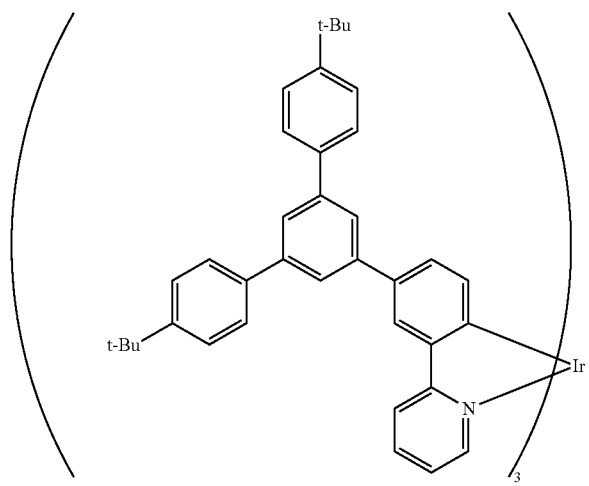
COM-4
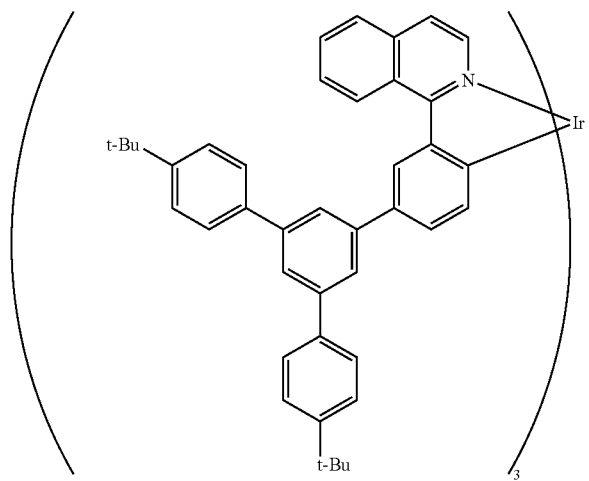
COM-5

COM-6
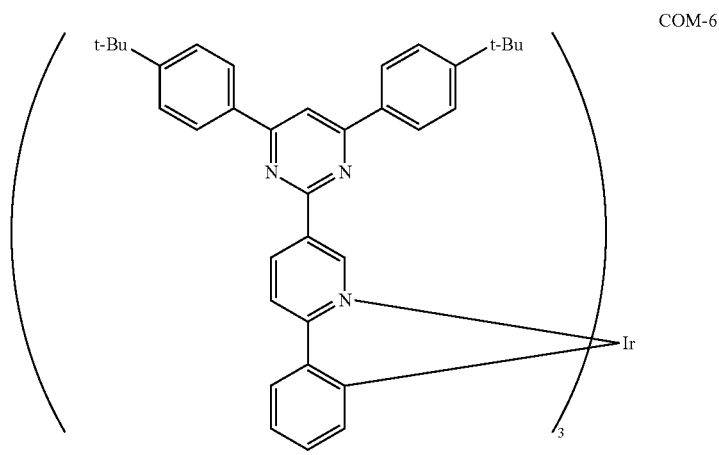
[Chemical Formula 32]
COM-7
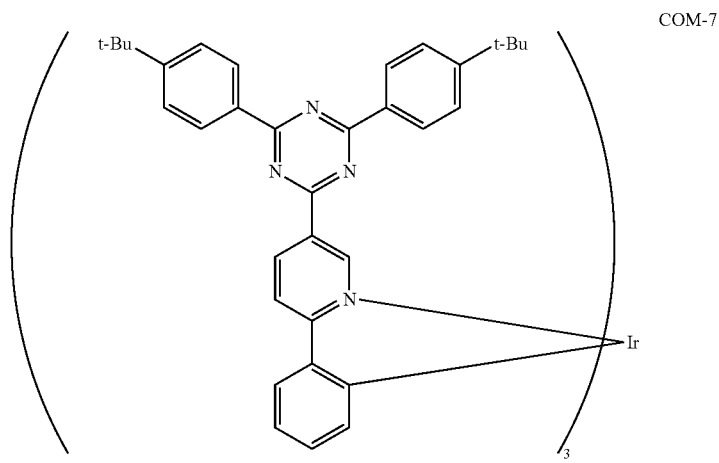
COM-8
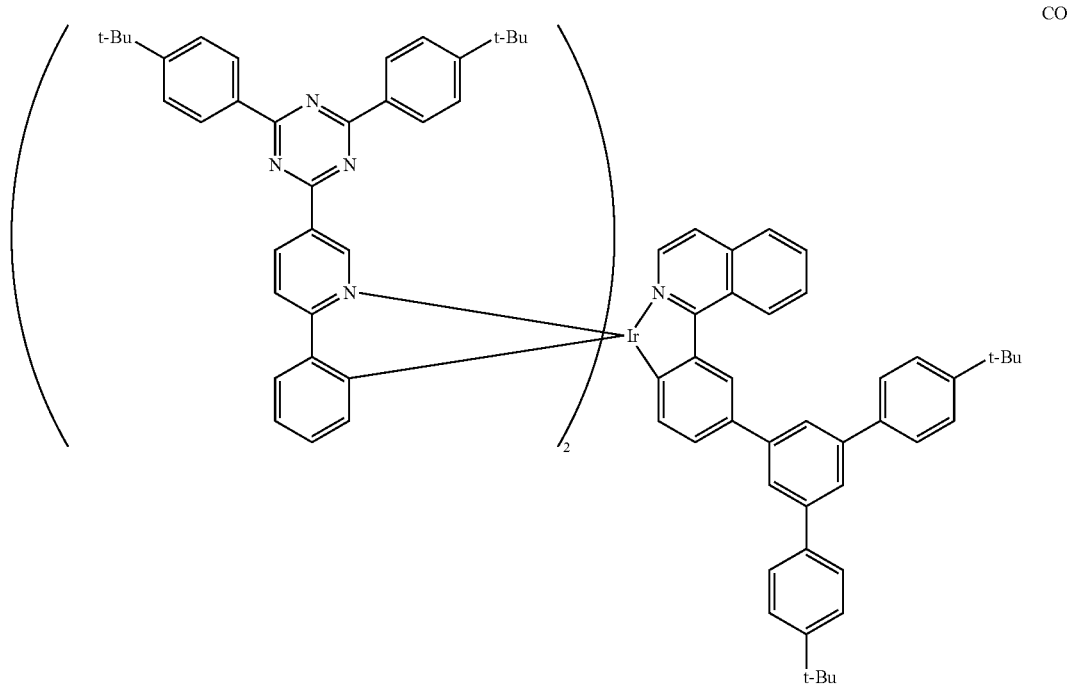

[Chemical Formula 33]
COM-9
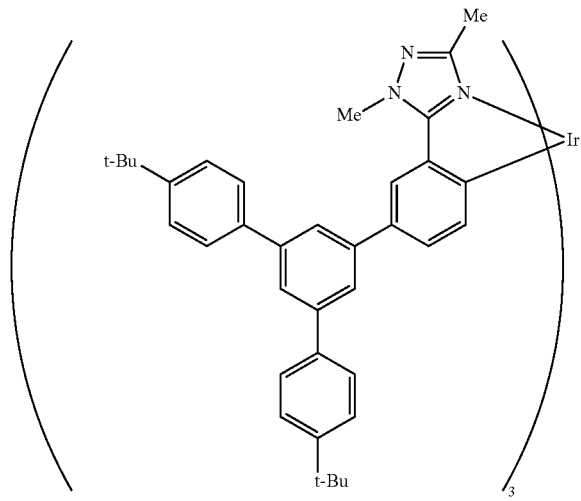
COM-10
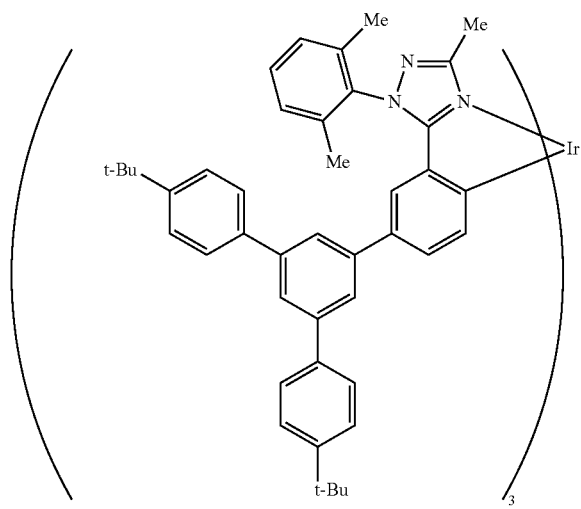
COM-11
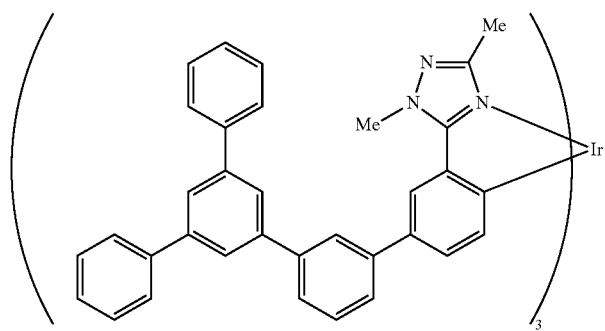

-continued
COM-12
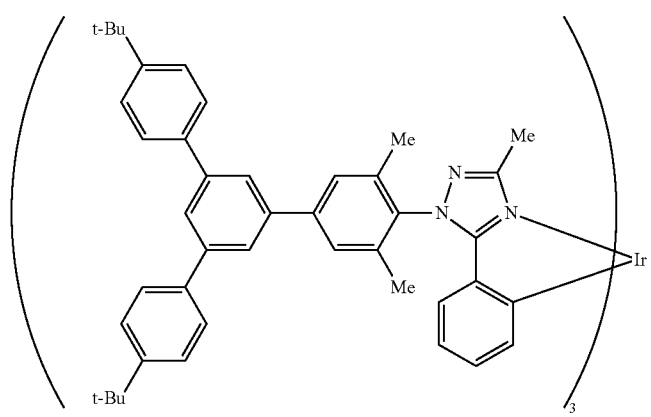
COM-13
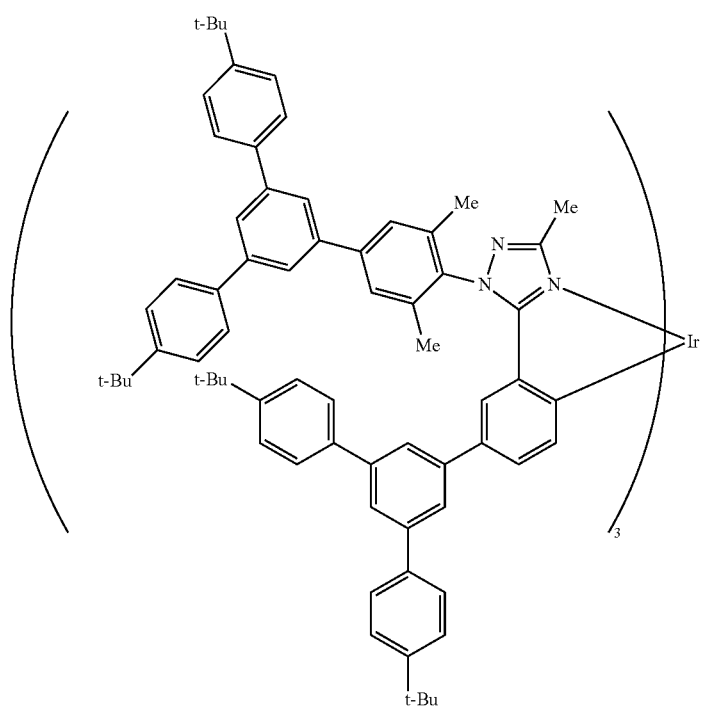
[Chemical Formula 34]
COM-14
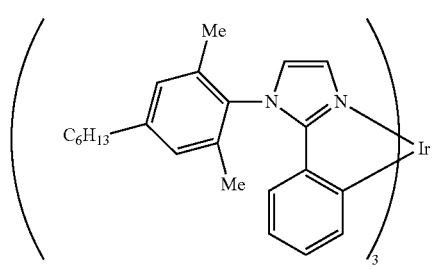

COM-15
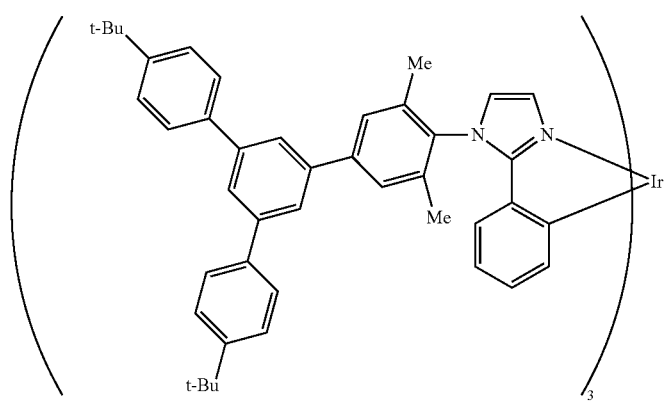
COM-16
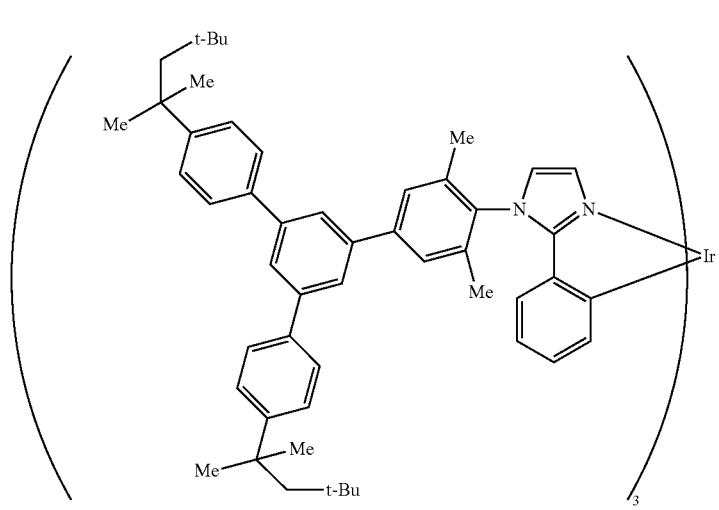
COM-17
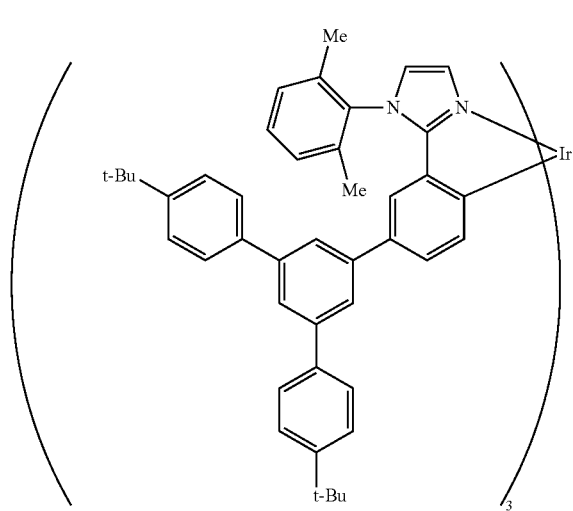

-continued

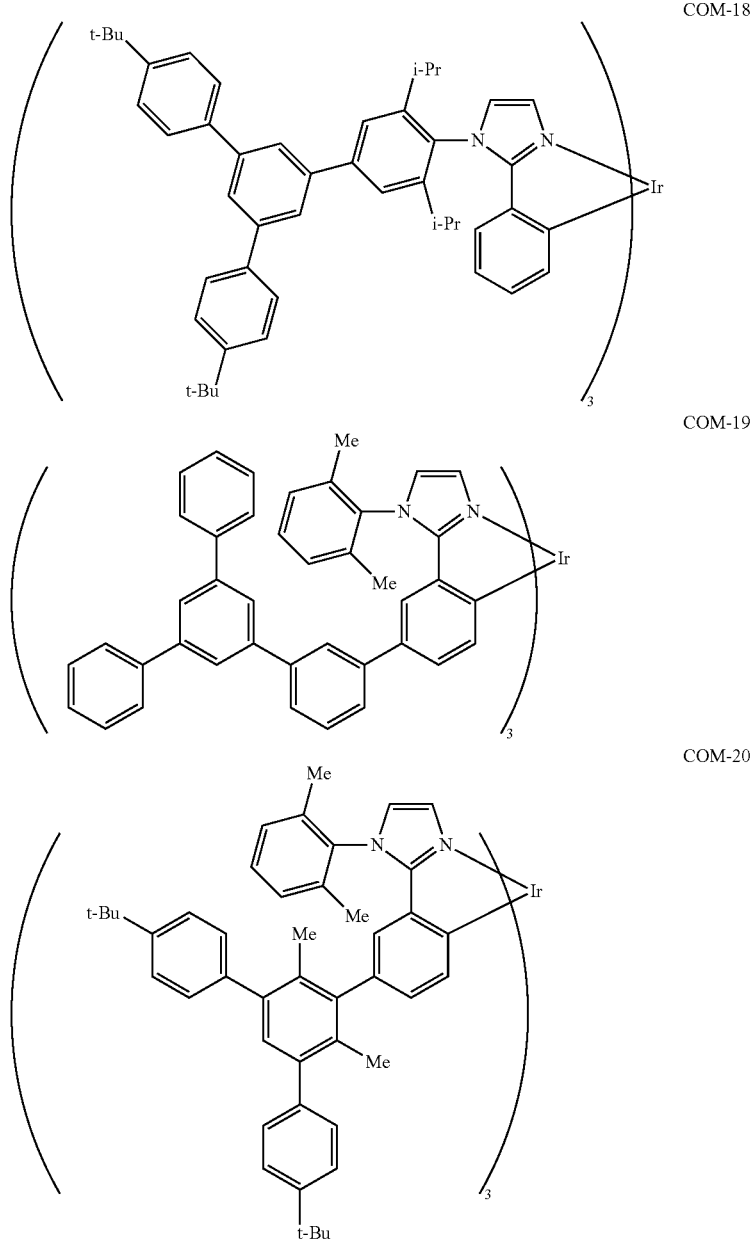

The phosphorescent compound can be synthesized, for example, according to methods described in Japanese Patent Application National Publication No. 2004-530254, JP-A No. 2008-179617, JP-A No. 2011-105701, Japanese Patent Application National Publication No. 2007-504272, JP-A No. 2013-147449 and JP-A No. 2013-147450.

<Non-Phosphorescent Low Molecular Weight Compound>

The composition of the present invention may further comprise a non-phosphorescent low molecular weight compound. The non-phosphorescent low molecular weight compound which may be contained in the composition of the present invention will be illustrated.

The non-phosphorescent low molecular weight compound which may be contained in the composition of the present invention is preferably a compound represented by the formula (H-1).

[Chemical Formula 35]

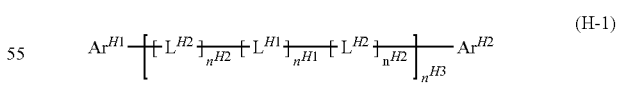

(H-1)

[wherein, $Ar^{H1}$ and $Ar^{H2}$ each independently represent an aryl group or a monovalent heterocyclic group, and these groups each optionally have a substituent.

$n^{H1}$ and $n^{H2}$ each independently represent 0 or 1. When a plurality of $n^{H1}$ are present, they may be the same or different. The plurality of $n^{H2}$ may be the same or different.

$n^{H3}$ represents an integer of 0 or more.

$L^{H1}$ represents an arylene group, a divalent heterocyclic group or a group represented by $—[C(R^{H11})_2]n^{H11}—$, and these groups each optionally have a substituent. When a plurality of $L^{H1}$ are present, they may be the same or different.

$n^{H11}$ represents an integer of 1 to 10. $R^{H11}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{H11}$ may be the same or different and may be combined together to form a ring together with the carbon atoms to which they are attached.

$L^{H2}$ represents a group represented by —N(-$L^{H21}$-$R^{H21}$)—.

When a plurality of $L^{H2}$ are present, they may be the same or different.

$L^{H21}$ represents a single bond, an arylene group or a divalent heterocyclic group, and these groups each optionally have a substituent. $R^{21}$ represents a hydrogen atom, an alkyl group, a cycloalkyl group, an aryl group or a monovalent heterocyclic group, and these groups each optionally have a substituent.]

$Ar^{H1}$ and $Ar^{H2}$ are preferably a phenyl group, a fluorenyl group, a spirobifluorenyl group, a pyridyl group, a pyrimidinyl group, a triazinyl group, a quinolinyl group, an isoquinolinyl group, a thienyl group, a benzothienyl group, a dibenzothienyl group, a furyl group, a benzofuryl group, a dibenzofuryl group, a pyrrolyl group, an indolyl group, an azaindolyl group, a carbazolyl group, an azacarbazolyl group, a diazacarbazolyl group, a phenoxazinyl group or a phenothiazinyl group, more preferably a phenyl group, a spirobifluorenyl group, a pyridyl group, a pyrimidinyl group, a triazinyl group, a dibenzothienyl group, a dibenzofuryl group, a carbazolyl group or an azacarbazolyl group, further preferably a phenyl group, a pyridyl group, a carbazolyl group or an azacarbazolyl group, particularly preferably a group represented by the formula (TDA-1) or (TDA-3) described above, especially preferably a group represented by the formula (TDA-3) described above, and these groups each optionally have a substituent.

The substituent which $Ar^{H1}$ and $Ar^{H2}$ optionally have is preferably a halogen atom, an alkyl group, a cycloalkyl group, an alkoxy group, a cycloalkoxy group, an aryl group or a monovalent heterocyclic group, more preferably an alkyl group, a cycloalkoxy group, an alkoxy group or cycloalkoxy group, further preferably an alkyl group or cycloalkoxy group, and these groups each optionally further have a substituent.

$n^{H1}$ is preferably 1. $n^{H2}$ is preferably 0.

$n^{H3}$ is usually an integer of 0 to 10, preferably an integer of 0 to 5, further preferably an integer of 1 to 3, particularly preferably 1.

$n^{H11}$ is preferably an integer of 1 to 5, more preferably an integer of 1 to 3, further preferably 1.

$R^{H11}$ is preferably a hydrogen atom, an alkyl group, a cycloalkyl group, an aryl group or a monovalent heterocyclic group, more preferably a hydrogen atom, an alkyl group or a cycloalkyl group, further preferably a hydrogen atom or an alkyl group, and these groups each optionally have a substituent.

$L^{H1}$ is preferably an arylene group or a divalent heterocyclic group.

$L^{H1}$ is preferably a group represented by the formula (A-1) to (A-3), the formula (A-8) to (A-10), the formula (AA-1) to (AA-6), the formula (AA-10) to (AA-21) or the formula (AA-24) to (AA-34), more preferably a group represented by the formula (A-1), the formula (A-2), the formula (A-8), the formula (A-9), the formula (AA-1) to (AA-4), the formula (AA-10) to (AA-15) or the formula (AA-29) to (AA-34), further preferably a group represented by the formula (A-1), the formula (A-2), the formula (A-8), the formula (A-9), the formula (AA-2), the formula (AA-4) or the formula (AA-10) to (AA-15), particularly preferably a group represented by the formula (A-1), the formula (A-2), the formula (A-8), the formula (AA-2), the formula (AA-4), the formula (AA-10), the formula (AA-12) or the formula (AA-14), especially preferably a group represented by the formula (A-1), the formula (A-2), the formula (AA-2), the formula (AA-4) or the formula (AA-14).

The substituent which $L^{H1}$ optionally has is preferably a halogen atom, an alkyl group, a cycloalkyl group, an alkoxy group, a cycloalkoxy group, an aryl group or a monovalent heterocyclic group, more preferably an alkyl group, an alkoxy group, an aryl group or a monovalent heterocyclic group, further preferably an alkyl group, an aryl group or a monovalent heterocyclic group, and these groups each optionally further have a substituent.

$L^{H21}$ is preferably a single bond or an arylene group, more preferably a single bond, and this arylene group optionally has a substituent.

The definition and examples of the arylene group or the divalent heterocyclic group represented by $L^{H21}$ are the same as the definition and examples of the arylene group or the divalent heterocyclic group represented by $L^{H1}$.

$R^{H21}$ preferably an aryl group or a monovalent heterocyclic group, and these groups each optionally have a substituent.

The definition and examples of the aryl group and the monovalent heterocyclic group represented by $R^{H21}$ are the same as the definition and examples of the aryl group and the monovalent heterocyclic group represented by $Ar^{H1}$ and $Ar^{H2}$.

The definition and examples of the substituent which $R^{H2}$ may optionally has are the same as the definition and examples of the substituent which $Ar^{H1}$ and $A^2$ optionally have.

The compound represented by the formula (H-1) is preferably a compound represented by the formula (H-2).

[Chemical Formula 36]

(H-2)

[wherein, $Ar^{H1}$, $Ar^{H2}$, $n^{H3}$ and $L^{H1}$ represent the same meaning as described above.]

As the compound represented by the formula (H-1), compounds represented by the following formulae (H-101) to (H-119) are exemplified.

[Chemical Formula 37]

(H-101)

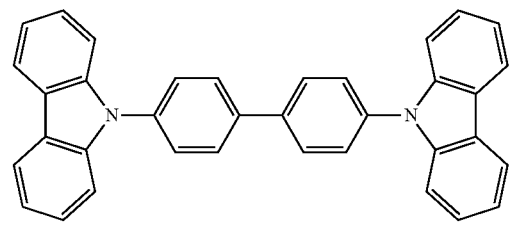

(H-102)
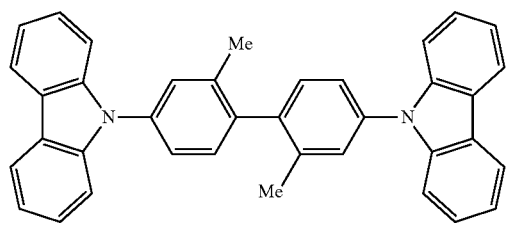
(H-103)
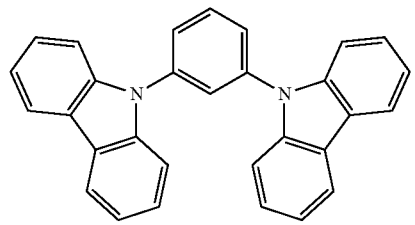
(H-104)
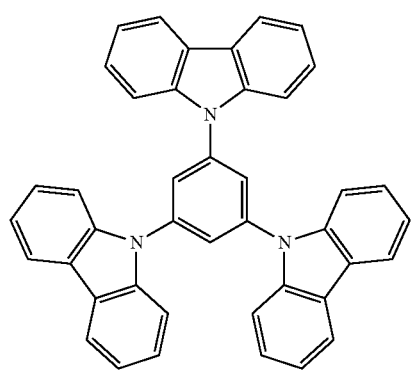
(H-105)
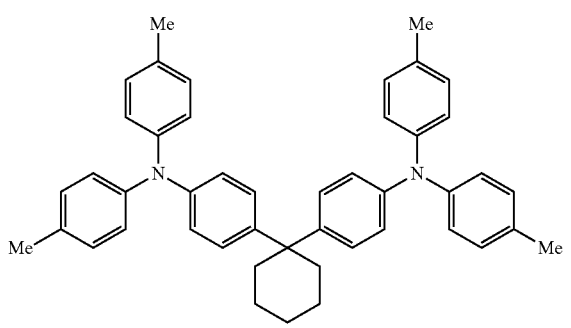
(H-106)
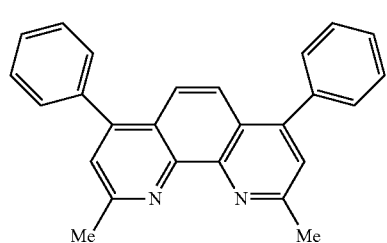
[Chemical Formula 38]
(H-107)
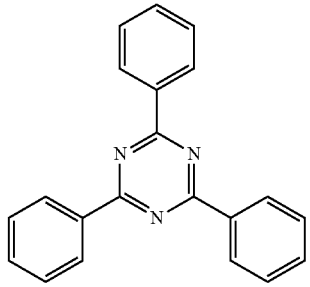
(H-108)
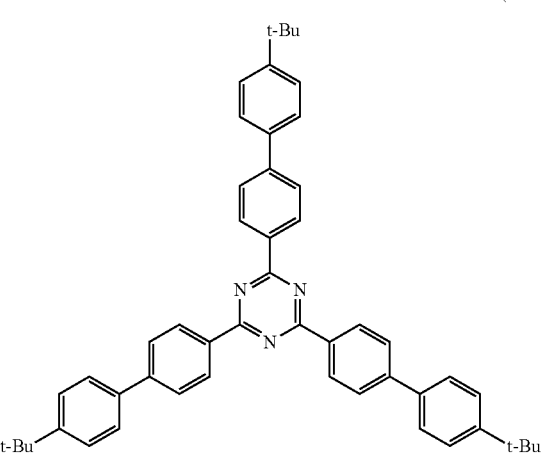
(H-109)
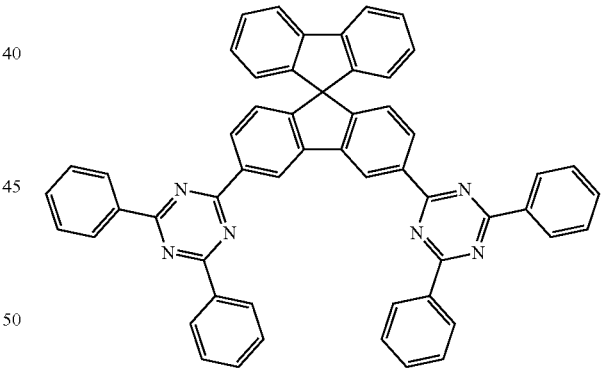
(H-110)
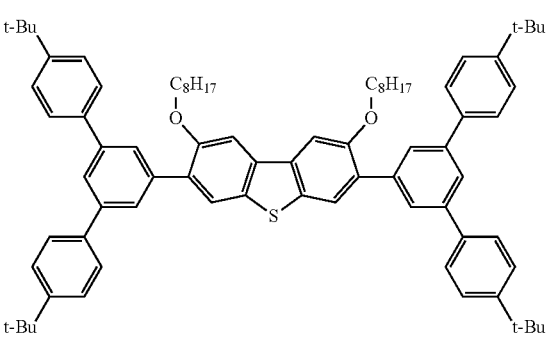

(H-111)
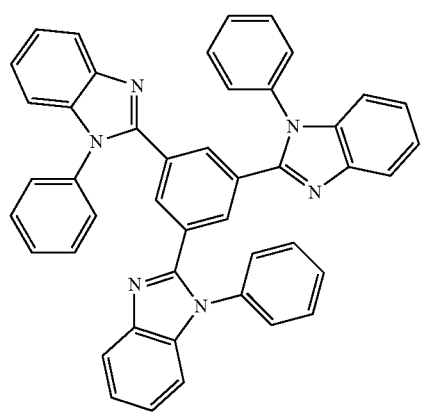
(H-115)
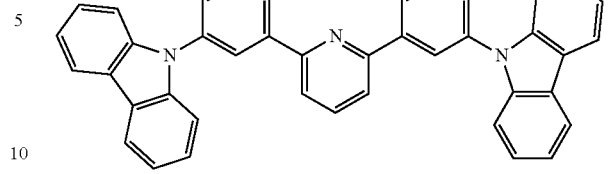
[Chemical Formula 40]
(H-116)
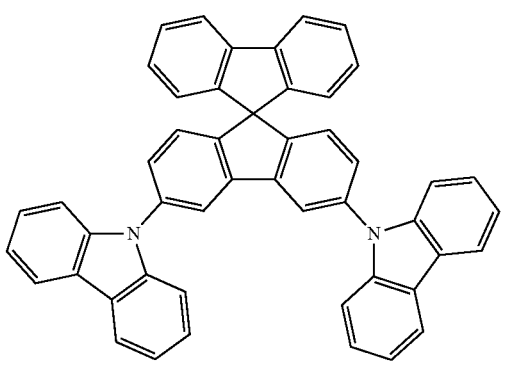
(H-112)
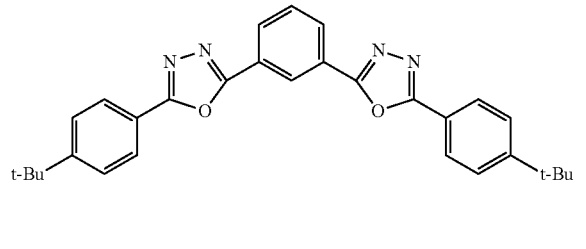
[Chemical Formula 39]
(H-113)
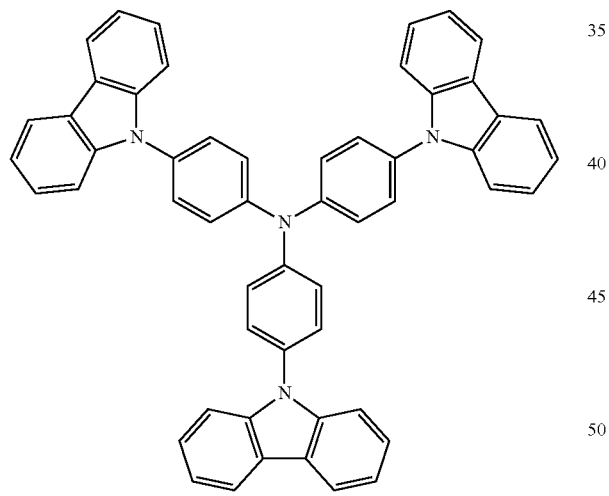
(H-117)
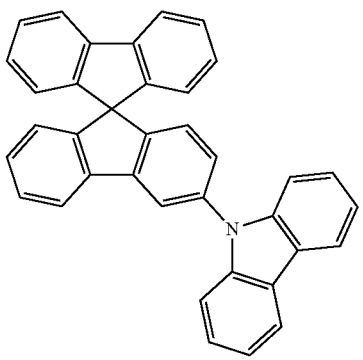
(H-114)
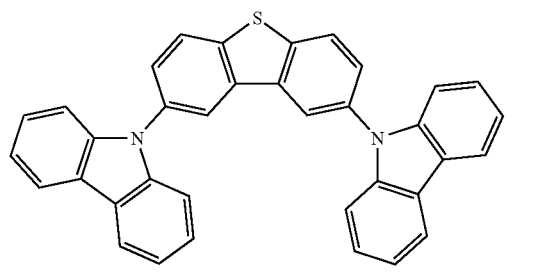
(H-118)
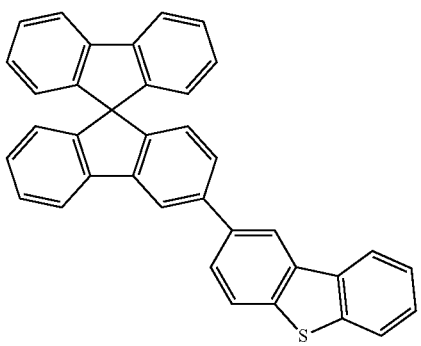

(H-119)

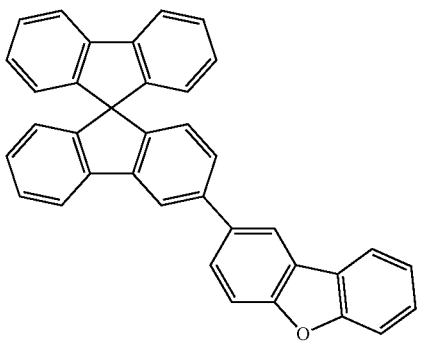

<Polymer Compound>

The composition of the present invention may further comprise a polymer compound comprising at least one constitutional unit selected from the group consisting of a constitutional unit represented by the formula (X) and a constitutional unit represented by the formula (Y) (hereinafter, referred to also as "first polymer compound"). The first polymer compound which may be contained in the composition of the present invention will be illustrated.

[Constitutional Unit Represented by the Formula (X)]

[Chemical Formula 41]

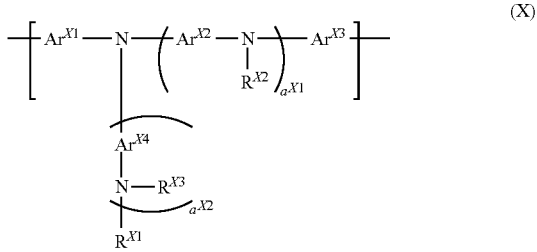

(X)

$a^{x1}$ is preferably an integer of 2 or less, more preferably 1, because the light emission efficiency of a light emitting device produced by using the composition of the present invention is excellent.

$a^{x2}$ is preferably an integer of 2 or less, more preferably 0, because the light emission efficiency of a light emitting device produced by using the composition of the present invention is excellent.

$R^{X1}$, $R^{X2}$ and $R^{X3}$ are preferably an alkyl group, a cycloalkyl group, an aryl group or a monovalent heterocyclic group, more preferably an aryl group, and these groups each optionally have a substituent.

The arylene group represented by $Ar^{X1}$ and $Ar^{X3}$ is more preferably a group represented by the formula (A-1) or the formula (A-9), further preferably a group represented by the formula (A-1), and these groups each optionally have a substituent.

The divalent heterocyclic group represented by $Ar^{X1}$ and $Ar^{X3}$ is more preferably a group represented by the formula (AA-1), the formula (AA-2) or the formula (AA-7) to (AA-26), and these groups each optionally have a substituent.

$Ar^{X1}$ and $Ar^{X3}$ are preferably an arylene group optionally having a substituent.

The arylene group represented by $Ar^{X2}$ and $Ar^{X4}$ is more preferably a group represented by the formula (A-1), the formula (A-6), the formula (A-7), the formula (A-9) to (A-11) or the formula (A-19), and these groups each optionally have a substituent.

The more preferable range of the divalent heterocyclic group represented by $Ar^{X2}$ and $Ar^{X4}$ is the same as the more preferable range of the divalent heterocyclic group represented by $Ar^{X1}$ and $Ar^{X3}$.

The more preferable range and the further preferable range of the arylene group and the divalent heterocyclic group in the divalent group in which at least one arylene group and at least one divalent heterocyclic group are bonded directly to each other represented by $Ar^{X2}$ and $Ar^{X4}$ are the same as the more preferable range and the further preferable range of the arylene group and the divalent heterocyclic group represented by $Ar^{X1}$ and $Ar^{X3}$, respectively.

The divalent group in which at least one arylene group and at least one divalent heterocyclic group are bonded directly to each other represented by $Ar^{X2}$ and $Ar^{X4}$ includes, for example, groups represented by the following formulae, and each of them optionally has a substituent.

[Chemical Formula 42]

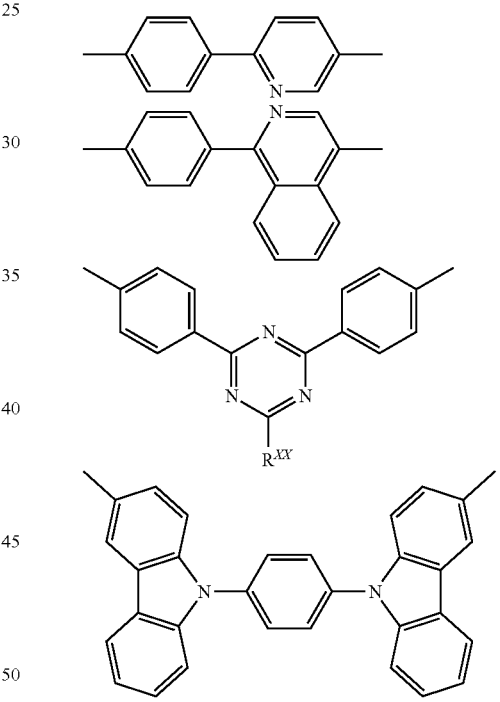

[wherein, $R^{XX}$ represents a hydrogen atom, an alkyl group, a cycloalkyl group, an aryl group or a monovalent heterocyclic group, and these groups each optionally have a substituent.]

$R^{XX}$ is preferably an alkyl group, a cycloalkyl group or an aryl group, and these groups each optionally have a substituent.

$Ar^{X2}$ and $Ar^{X4}$ are preferably an arylene group optionally having a substituent.

The substituent which the group represented by $Ar^{X1}$ to $Ar^{X4}$ and $R^{X1}$ to $R^{X3}$ optionally has is preferably an alkyl group, a cycloalkyl group or an aryl group, and these groups each optionally further have a substituent.

The constitutional unit represented by the formula (X) is preferably a constitutional unit represented by the formula (X-1) to (X-7), more preferably a constitutional unit represented by the formula (X-1) to (X-6), further preferably a constitutional unit represented by the formula (X-3) to (X-6).

[Chemical Formula 43]

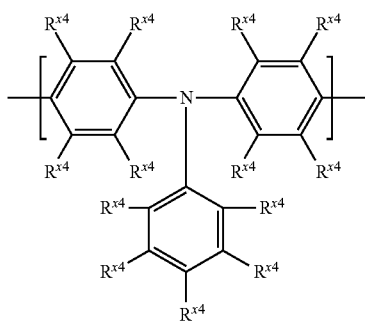

(X-1)

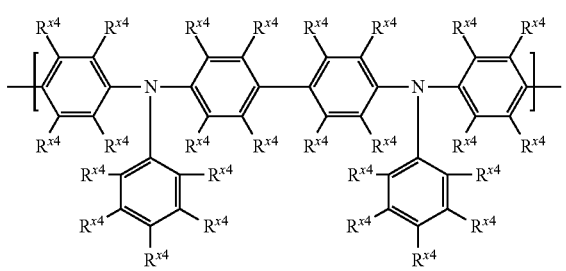

(X-2)

[Chemical Formula 44]

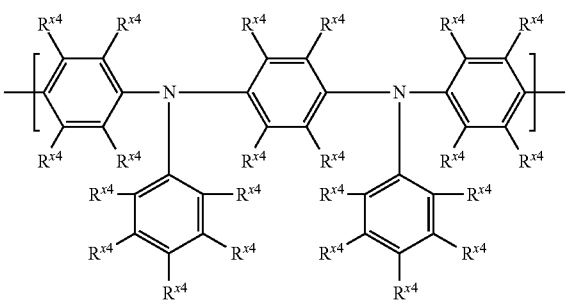

(X-3)

[Chemical Formula 45]

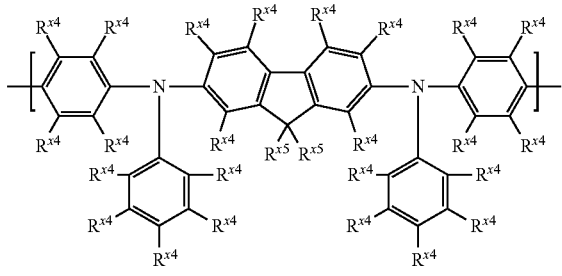

(X-4)

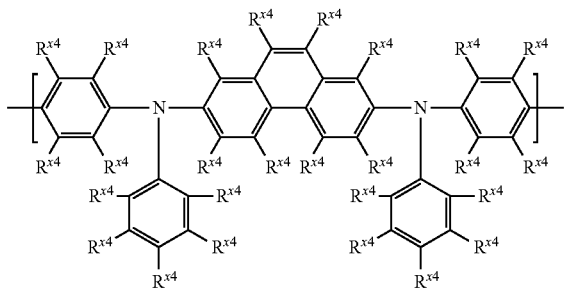

(X-5)

[Chemical Formula 46]

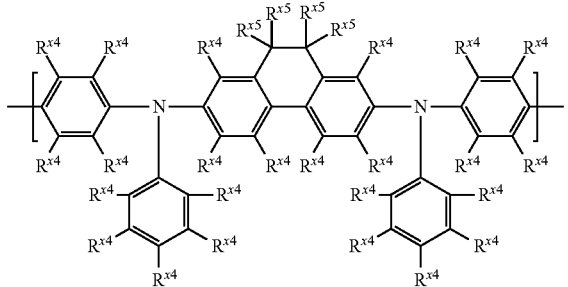

(X-6)

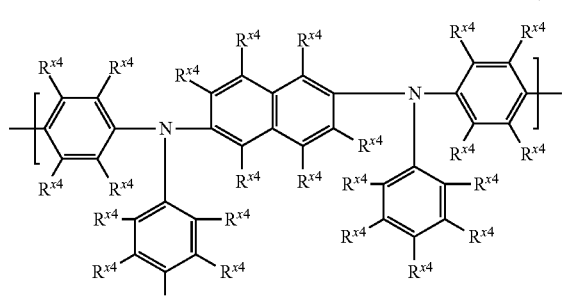

(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, and these groups each optionally have a substituent. The plurality of $R^{X4}$ may be the same or different. The plurality of $R^{X5}$ may be the same or different, and adjacent groups $R^{X5}$ may be combined together to form a ring together with the carbon atoms to which they are attached.]

The amount of the constitutional unit represented by the formula (X) is preferably 0.1 to 50 mol %, more preferably 1 to 40 mol %, further preferably 5 to 30 mol % with respect to the total amount of constitutional units contained in the first polymer compound, because the hole transportability of a light emitting device produced by using the composition of the present invention is excellent.

The constitutional unit represented by the formula (X) includes, for example, constitutional units represented by the formulae (X1-1) to (X1-11), preferably constitutional units represented by the formulae (X1-3) to (X1-10).

[Chemical Formula 47]
(X1-1)
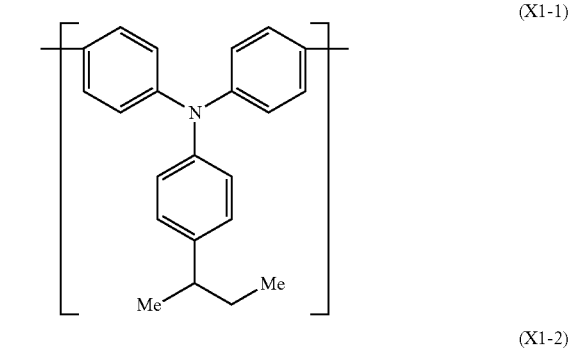
(X1-2)
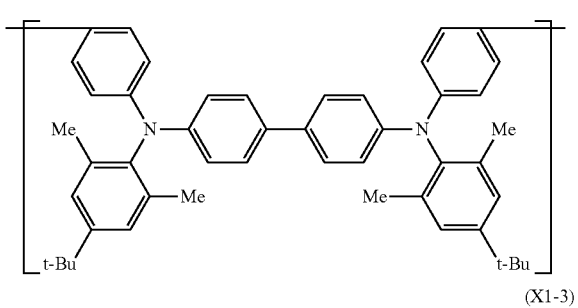
(X1-3)
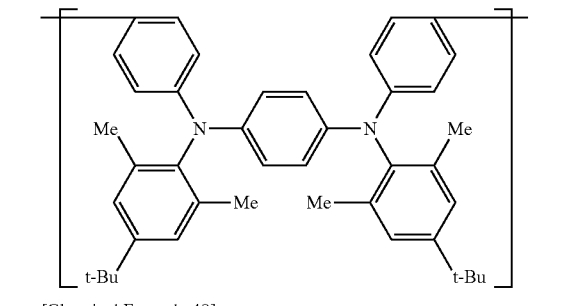
[Chemical Formula 48]
(X1-4)
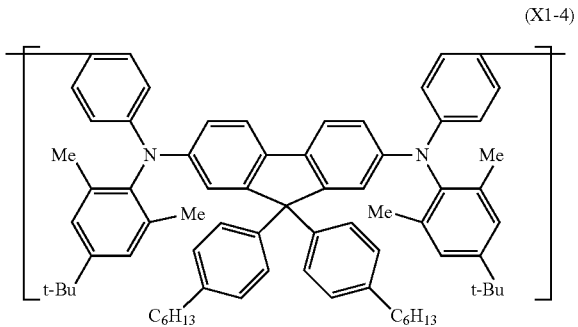
(X1-5)
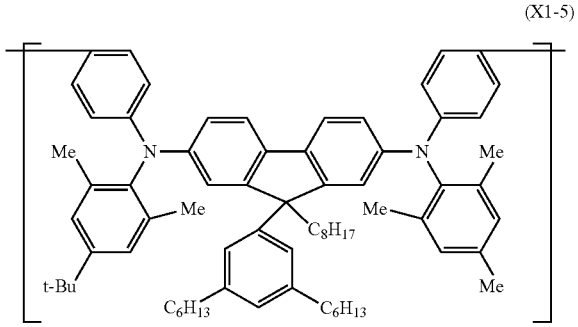
[Chemical Formula 49]
(X1-6)
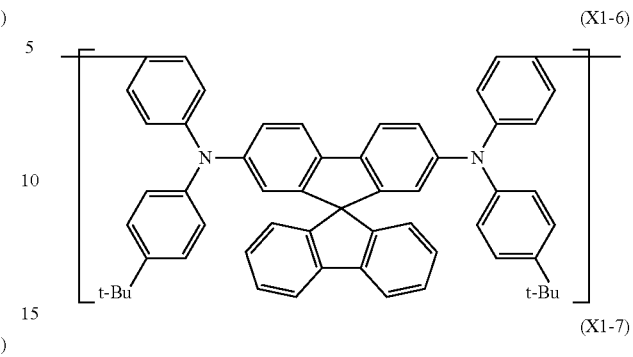
(X1-7)
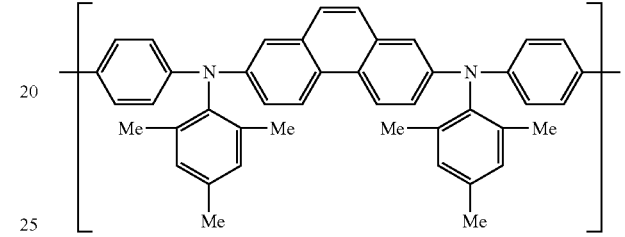
[Chemical Formula 50]
(X1-8)
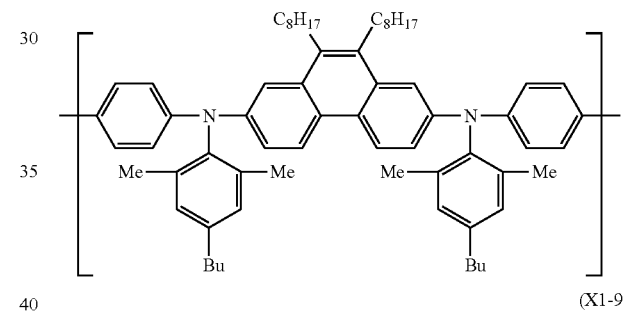
(X1-9)
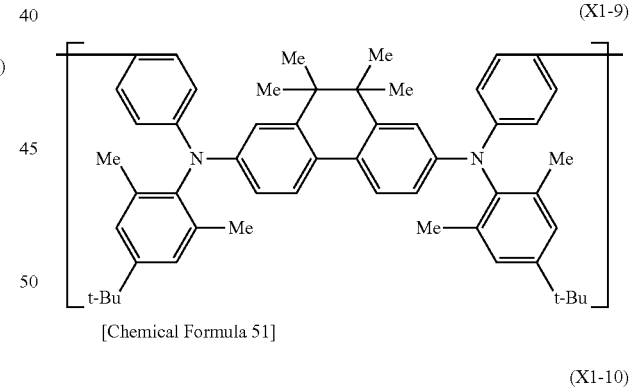
[Chemical Formula 51]
(X1-10)
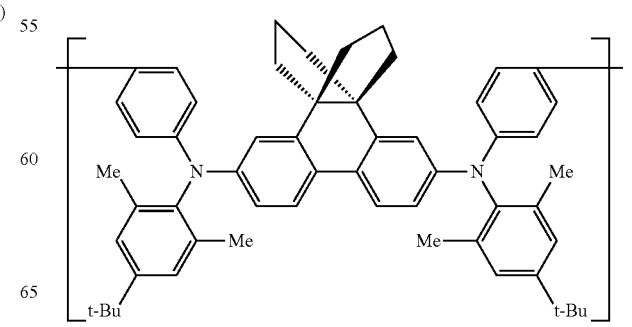

-continued

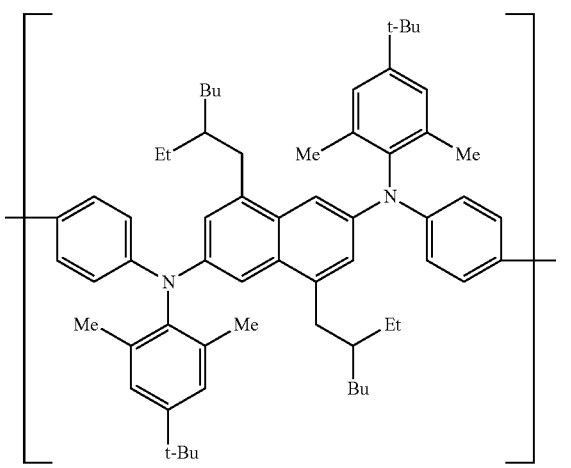

(X1-11)

The constitutional unit represented by the formula (X) may be contained only singly or two or more units thereof may be contained in the first polymer compound.

[Constitutional Unit Represented by the Formula (Y)]

[Chemical Formula 52]

(Y)

The arylene group represented by Ar$^{Y1}$ is more preferably a group represented by the formula (A-1), the formula (A-2), the formula (A-6) to (A-10), the formula (A-19) or the formula (A-20), further preferably a group represented by the formula (A-1), the formula (A-2), the formula (A-7), the formula (A-9) or the formula (A-19), and these groups each optionally have a substituent.

The divalent heterocyclic group represented by Ar$^{Y1}$ is more preferably a group represented by the formula (AA-1) to (AA-4), the formula (AA-10) to (AA-15), the formula (AA-18) to (AA-21), the formula (AA-33) or the formula (AA-34), further preferably a group represented by the formula (AA-4), the formula (AA-10), the formula (AA-12), the formula (AA-14) or the formula (AA-33), and these groups each optionally have a substituent.

The more preferable range and the further preferable range of the arylene group and the divalent heterocyclic group in the divalent group in which at least one arylene group and at least one divalent heterocyclic group are bonded directly to each other represented by Ar$^{Y1}$ are the same as the more preferable range and the further preferable range of the arylene group and the divalent heterocyclic group represented by Ar$^{Y1}$ described above, respectively.

The divalent group in which at least one arylene group and at least one divalent heterocyclic group are bonded directly to each other represented by Ar$^{Y1}$ includes the same groups as the divalent group in which at least one arylene group and at least one divalent heterocyclic group are bonded directly to each other represented by Ar$^{X2}$ and Ar$^{X4}$ n the formula (X).

The substituent which the group represented by Ar$^{Y1}$ optionally has is preferably an alkyl group, a cycloalkyl group or an aryl group, and these groups each optionally further have a substituent.

The constitutional unit represented by the formula (Y) includes, for example, constitutional units represented by the formulae (Y-1) to (Y-10), and from the standpoint of the emission efficiency of a light emitting device produced by using the composition of the present invention preferable are constitutional units represented by the formulae (Y-1) to (Y-3), from the standpoint of the electron transportability of a light emitting device produced by using the composition of the present invention preferable are constitutional units represented by the formulae (Y-4) to (Y-7), and from the standpoint of the hole transportability of light emitting device produced by using the composition of the present invention preferable are constitutional units represented by the formulae (Y-8) to (Y-10). The constitutional units represented by the formula (Y) are preferably constitutional units represented by the formulae (Y-1) to (Y-4), because the luminance life of a light emitting device produced by using the composition of the present invention is excellent.

[Chemical Formula 53]

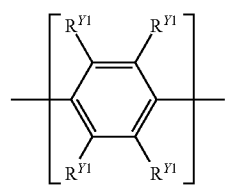

(Y-1)

[wherein R$^{Y1}$ represents a hydrogen atom, an alkyl group, a cycloalkyl group, an alkoxy group, a cycloalkoxy group, an aryl group or a monovalent heterocyclic group, and these groups each optionally have a substituent. The plurality of R$^{Y1}$ may be the same or different, and adjacent R$^{Y1}$s may be combined together to form a ring together with the carbon atoms to which they are attached.]

R$^{Y1}$ is preferably a hydrogen atom, an alkyl group, cycloalkyl group or an aryl group, and these groups each optionally have a substituent.

The constitutional unit represented by the formula (Y-1) may be a constitutional unit represented by the formula (Y-1').

[Chemical Formula 54]

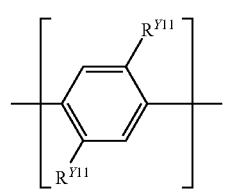

(Y-1')

[wherein, R$^{Y11}$ represents an alkyl group, a cycloalkyl group, an alkoxy group, a cycloalkoxy group, an aryl group or a monovalent heterocyclic group, and these groups each optionally have a substituent. The plurality of R$^{Y11}$ may be the same or different.]

R$^{Y11}$ is preferably an alkyl group, a cycloalkyl group or an aryl group, more preferably an alkyl group or a cycloalkyl group, and these groups each optionally have a substituent.

[Chemical Formula 55]

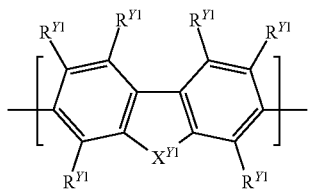

(Y-2)

[wherein, $R^{Y1}$ represents the same meaning as described above.

$X^{Y1}$ represents a group represented by —C($R^{Y2}$)$_2$—, —C($R^{Y2}$)=C($R^{Y2}$)— or —C($R^{Y2}$)$_2$—C($R^{Y2}$)$_2$—. $R^{Y2}$ represents a hydrogen atom, an alkyl group, a cycloalkyl group, an alkoxy group, a cycloalkoxy group, an aryl group or a monovalent heterocyclic group and these groups each optionally have a substituent. The plurality of $R^{Y2}$ may be the same or different, and groups $R^{Y2}$ may be combined together to form a ring together with the carbon atoms to which they are attached.]

$R^{Y2}$ is preferably an alkyl group, a cycloalkyl group, an aryl group or a monovalent heterocyclic group, more preferably an alkyl group a cycloalkyl group or an aryl group, and these groups each optionally have a substituent.

Regarding the combination of two $R^{Y2}$s in the group represented by —C($R^{Y2}$)$_2$— in $X^{Y1}$, it is preferable that the both are an alkyl group or a cycloalkyl group, the both are an aryl group, the both are a monovalent heterocyclic group, or one is an alkyl group or a cycloalkyl group and the other is an aryl group or a monovalent heterocyclic group, it is more preferable that one is an alkyl group or cycloalkyl group and the other is an aryl group, and these groups each optionally have a substituent. The two groups $R^{Y2}$ may be combined together to form a ring together with the atoms to which they are attached, and when the groups $R^{Y2}$ form a ring, the group represented by —C($R^{Y2}$)$_2$— is preferably a group represented by the formula (Y-A1) to (Y-A5), more preferably a group represented by the formula (Y-A4), and these groups each optionally have a substituent.

[Chemical Formula 56]

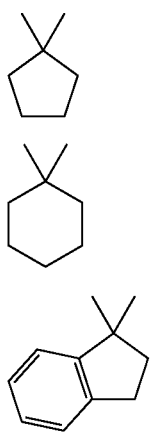

(Y-A1)

(Y-A2)

(Y-A3)

-continued

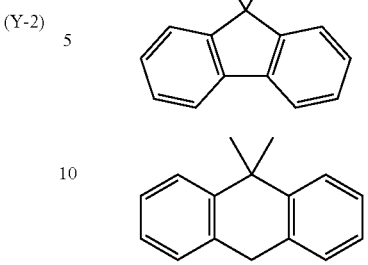

(Y-A4)

(Y-A5)

Regarding the combination of two $R^{Y2}$s in the group represented by —C($R^{Y2}$)=C($R^{Y2}$)— in $X^{Y1}$, it is preferable that the both are an alkyl group or cycloalkyl group, or one is an alkyl group or a cycloalkyl group and the other is an aryl group, and these groups each optionally have a substituent.

Four $R^{Y2}$s in the group represented by —C($R^{Y2}$)$_2$—C($R^{Y2}$)$_2$— in $X^{Y1}$ are preferably an alkyl group or a cycloalkyl group each optionally having a substituent. The plurality of $R^{Y2}$ may be combined together to form a ring together with the atoms to which they are attached, and when the groups $R^{Y2}$ form a ring, the group represented by —C($R^{Y2}$)$_2$—C($R^{Y2}$)$_2$— is preferably a group represented by the formula (Y-B1) to (Y-B5), more preferably a group represented by the formula (Y-B3), and these groups each optionally have a substituent.

[Chemical Formula 57]

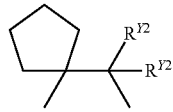

(Y-B1)

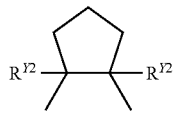

(Y-B2)

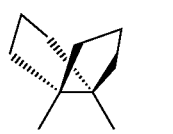

(Y-B3)

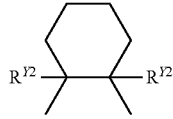

(Y-B4)

(Y-B5)

[wherein, $R^{Y2}$ represents the same meaning as described above.]

The constitutional unit represented by the formula (Y-2) is preferably a constitutional unit represented by the formula (Y-2').

[Chemical Formula 58]

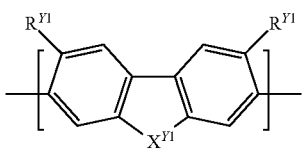
(Y-2')

[wherein, $R^{Y1}$ and $X^{Y1}$ represent the same meaning as described above.]

[Chemical Formula 59]

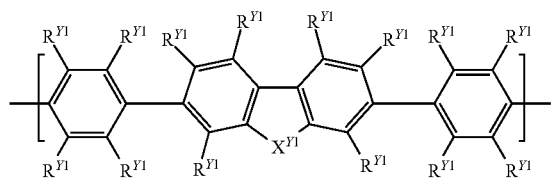
(Y-3)

[wherein, $R^{Y1}$ and $X^{Y1}$ represent the same meaning as described above.]

The constitutional unit represented by the formula (Y-3) is preferably a constitutional unit represented by the formula (Y-3').

[Chemical Formula 60]

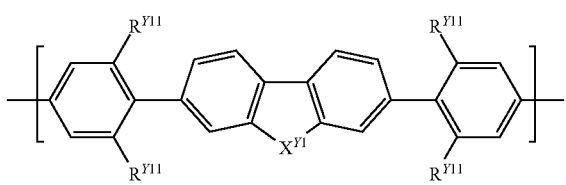
(Y-3')

[wherein, $R^{Y11}$ and $X^{Y1}$ represent the same meaning as described above.]

[Chemical Formula 61]

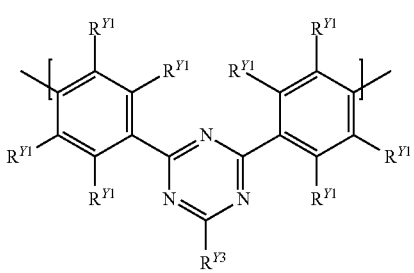
(Y-4)

[Chemical Formula 62]

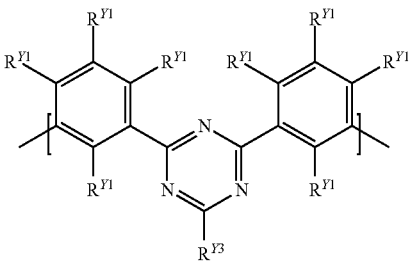
(Y-5)

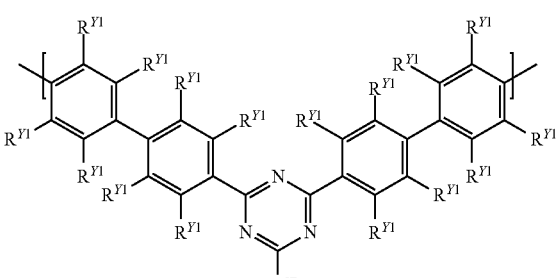
(Y-6)

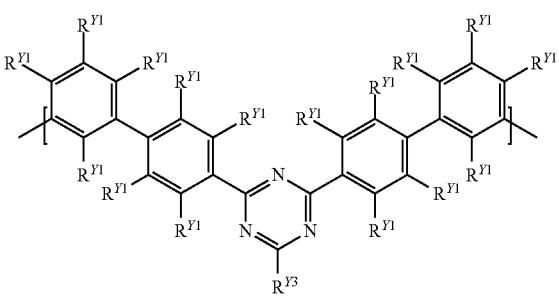
(Y-7)

[wherein,
$R^{Y1}$ represents the same meaning as described above.
$R^{Y3}$ represents a hydrogen atom, an alkyl group, a cycloalkyl group, an alkoxy group, a cycloalkoxy group, an aryl group or a monovalent heterocyclic group and these groups each optionally have a substituent.]

$R^{Y3}$ is preferably an alkyl group, a cycloalkyl group, an alkoxy group, a cyclo oxy group, an aryl group or a monovalent heterocyclic group, more preferably an aryl group, and these groups each optionally have a substituent.

The constitutional unit represented by the formula (Y-4) is preferably a constitutional unit represented by the formula (Y-4'), and the constitutional unit represented by the formula (Y-6) is preferably a constitutional unit represented by the formula (Y-6').

[Chemical Formula 63]

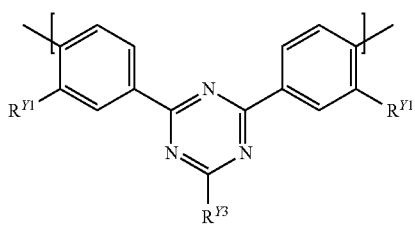
(Y-4')

-continued

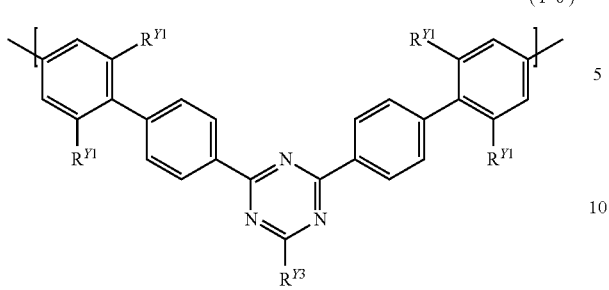
(Y-6')

[wherein, $R^{Y1}$ and $R^{Y3}$ represent the same meaning as described above.]

[Chemical Formula 64]

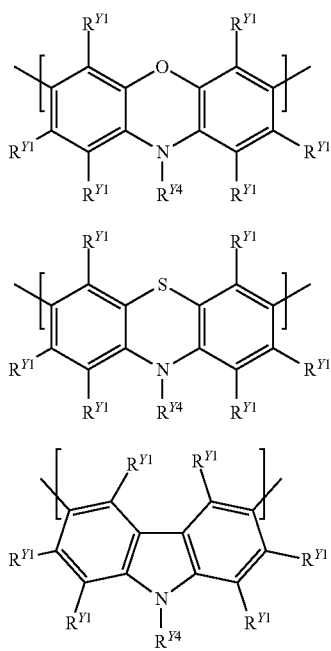
(Y-8)

(Y-9)

(Y-10)

[wherein, $R^{Y1}$ represents the same meaning as described above.

$R^{Y4}$ represents a hydrogen atom, an alkyl group, a cycloalkyl group, an alkoxy group, a cycloalkoxy group, an aryl group or a monovalent heterocyclic group, and these groups each optionally have a substituent.]

$R^{Y4}$ is preferably an alkyl group, a cycloalkyl group, an alkoxy group, a cycloalkoxy group, an aryl group or a monovalent heterocyclic group, more preferably an aryl group, and these groups each optionally have a substituent.

The constitutional unit represented by the formula (Y) includes, for example, a constitutional unit composed of an arylene group represented by the formula (Y-101) to (Y-121), a constitutional unit composed of a divalent heterocyclic group represented by the formula (Y-201) to (Y-206), and a constitutional unit composed of a divalent group in which at least one arylene group and at least one divalent heterocyclic group are bonded directly to each other represented by the formula (Y-301) to (Y-304).

[Chemical Formula 65]

(Y-101)

(Y-102)

(Y-103)

[Chemical Formula 66]

(Y-104)

(Y-105)

[Chemical Formula 67]

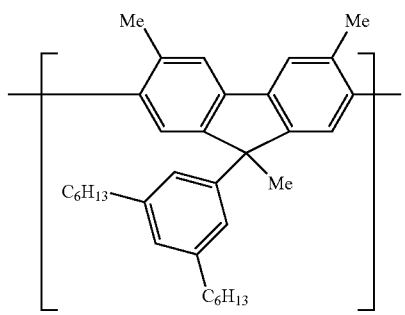
(Y-106)

(Y-107) 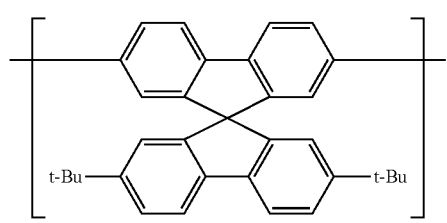
(Y-108) 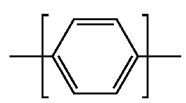
(Y-109) 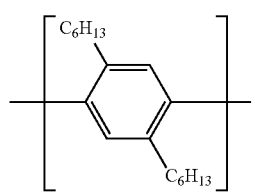
[Chemical Formula 68]
(Y-110) 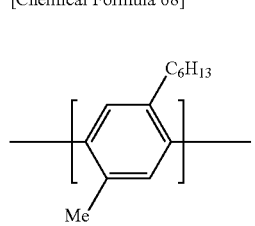
(Y-111) 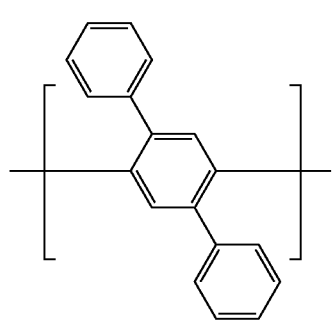
(Y-112) 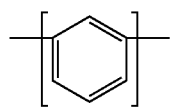
(Y-113) 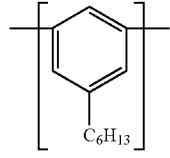
(Y-114) 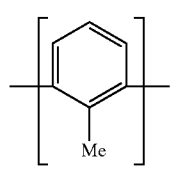
[Chemical Formula 69]
(Y-115) 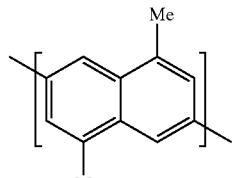
(Y-116) 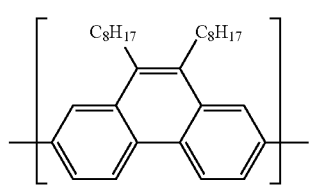
(Y-117) 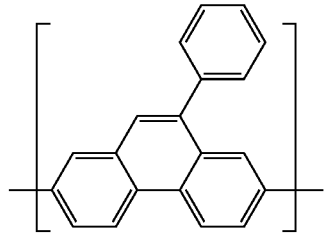
(Y-118) 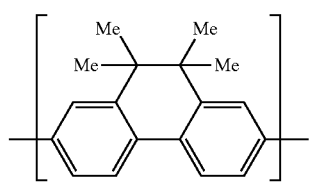
[Chemical Formula 70]
(Y-119) 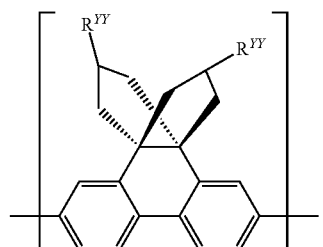
$R^{YY}=$ 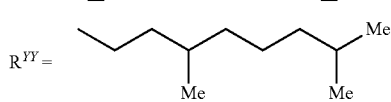
(Y-120) 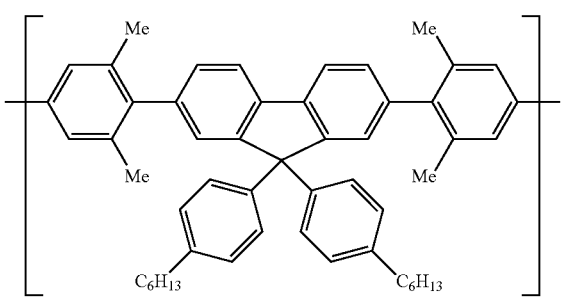

(Y-121)
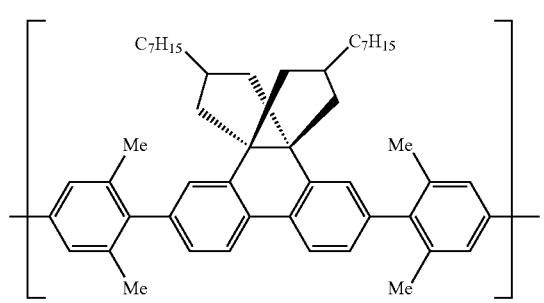
[Chemical Formula 72]
(Y-205)
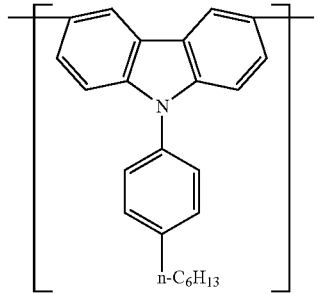
[Chemical Formula 71]
(Y-201)
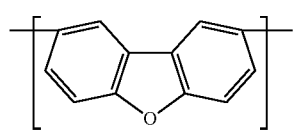
(Y-202)
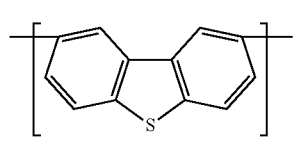
(Y-206)
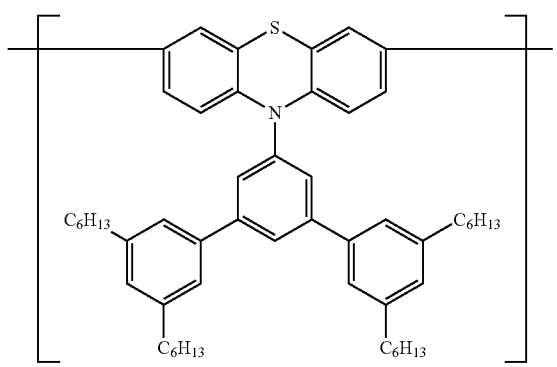
(Y-203)
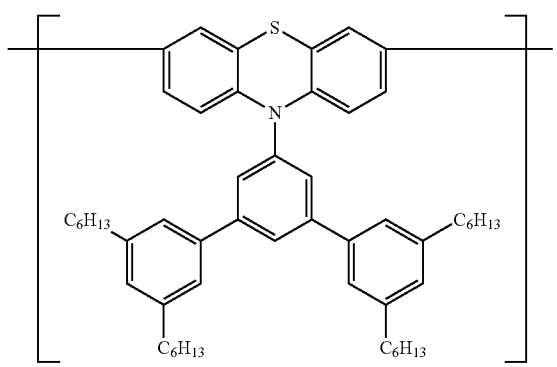
(Y-301)
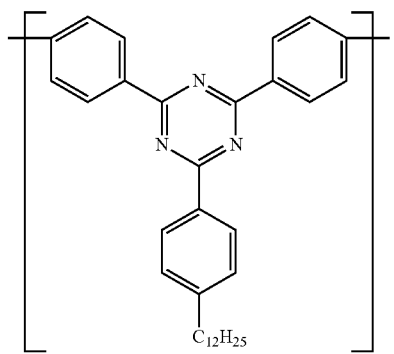
(Y-204)
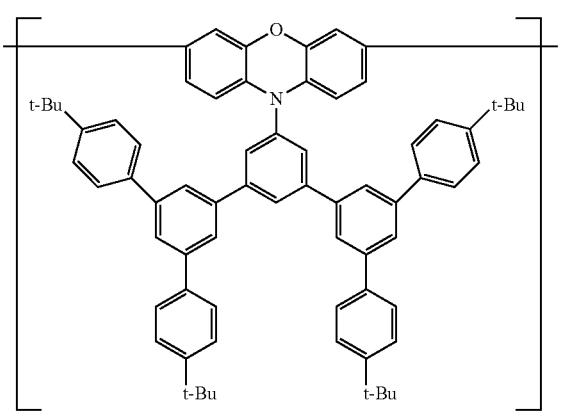
[Chemical Formula 73]
(Y-302)
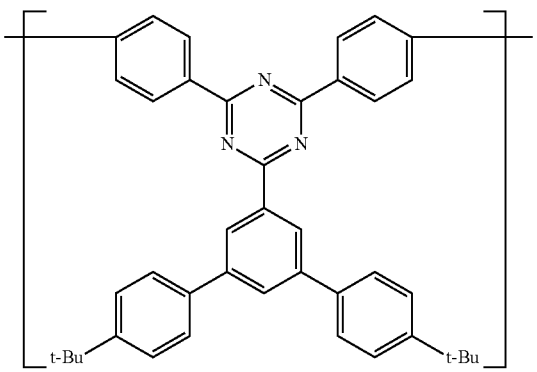

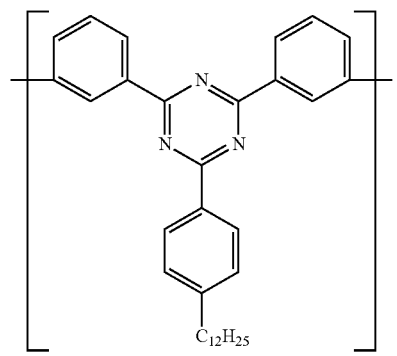

(Y-303)

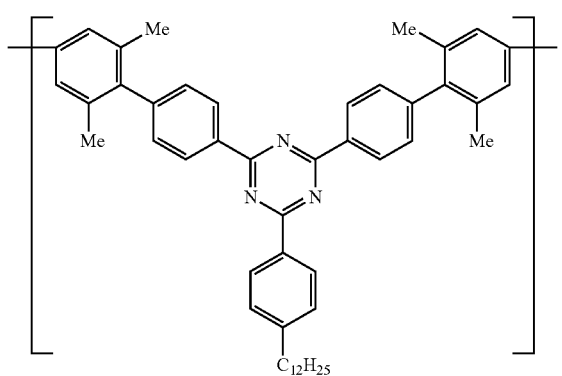

(Y-304)

The amount of the constitutional unit represented by the formula (Y) in which $Ar^{Y1}$ is an arylene group is preferably 0.5 to 90 mol %, more preferably 30 to 80 mol % with respect to the total amount of constitutional units contained in the first polymer compound, because the light emission efficiency of a light emitting device produced by using the composition of the present invention is excellent.

The amount of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 50 mol %, more preferably 3 to 30 mol % with respect to the total amount of constitutional units contained in the first polymer compound, because the charge transportability of a light emitting device produced by using the composition of the present invention is excellent.

The constitutional unit represented by the formula (Y) may be contained only singly or two or more units thereof may be contained in the first polymer compound.

Examples of the first polymer compound include polymer compounds (P-101) to (P-107) in the Table 3.

TABLE 3

| | constitutional unit and mole fraction thereof | | | | |
| --- | --- | --- | --- | --- | --- |
| | formula (Y) | | | formula (X) | |
| polymer compound | formulae (Y-1) to (Y-3) p | formulae (Y-4) to (Y-7) q | formulae (Y-8) to (Y-10) r | formulae (X-1) to (X-7) s | other t |
| (P-101) | 0.1 to 99.9 | 0.1 to 99.9 | 0 | 0 | 0 to 30 |
| (P-102) | 0.1 to 99.9 | 0 | 0.1 to 99.9 | 0 | 0 to 30 |
| (P-103) | 0.1 to 99.9 | 0 | 0 | 0.1 to 99.9 | 0 to 30 |
| (P-104) | 0.1 to 99.8 | 0.1 to 99.8 | 0.1 to 99.8 | 0 | 0 to 30 |
| (P-105) | 0.1 to 99.8 | 0.1 to 99.8 | 0 | 0.1 to 99.8 | 0 to 30 |
| (P-106) | 0.1 to 99.7 | 0.1 to 99.7 | 0.1 to 99.7 | 0.1 to 99.7 | 0 to 30 |
| (P-107) | 0.1 to 99.7 | 0.1 to 99.7 | 0.1 to 99.7 | 0.1 to 99.7 | 0 to 30 |

[In the table, p, q, r, s and t represent the mole fraction of each constitutional unit. p+q+r+s+t=100, and 100≥p+q+r+s≥70. Other constitutional unit denotes a constitutional unit other than the constitutional unit represented by the formula (Y) and the constitutional unit represented by the formula (X).]

<Polymer Compound Comprising Phosphorescent Constitutional Unit>

The phosphorescent compound contained in the composition of the present invention may be a polymer compound (hereinafter, referred to also as "the second polymer compound".) comprising a constitutional unit having the structure of a phosphorescent compound (namely, a constitutional unit having a group obtained by removing 1 or more hydrogen atoms bonding directly to carbon atoms or hetero atoms constituting a phosphorescent compound. Hereinafter, referred to also as "phosphorescent constitutional unit".). The second polymer compound contained in the composition of the present invention will be illustrated.

The phosphorescent constitutional unit is preferably a constitutional unit having the structure of a phosphorescent compound represented by the formula (1), because a light emitting device produced by using the composition of the present invention is excellent in light emission efficiency. The constitutional unit having the structure of a phosphorescent compound represented by the formula (1) is preferably a constitutional unit having a group obtained by removing from a phosphorescent compound represented by the formula (1) 1 to 3 hydrogen atoms bonding directly to carbon atoms or hetero atoms constituting the compound, more preferably a constitutional unit represented by the formula (1B), (2B), (3B) or (4B), further preferably a constitutional unit represented by the formula (2B) or (3B), particularly preferably a constitutional unit represented by the formula (2B).

[Phosphorescent Constitutional Unit Represented by the Formula (1B)]

[Chemical Formula 74]

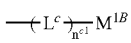

(1B)

[wherein, $M^{1B}$ represents a group obtained by removing from a phosphorescent compound represented by the formula (1)

one hydrogen atom bonding directly to a carbon atom or a hetero atom constituting the compound.

$L^C$ represents an oxygen atom, a sulfur atom, —N($R^A$)—, —C($R^B$)$_2$—, —C($R^B$)═C($R^B$)—, —C≡C—, an arylene group or a divalent heterocyclic group, and these groups each optionally have a substituent. $R^A$ represents a hydrogen atom, an alkyl group, a cycloalkyl group, an aryl group or a monovalent heterocyclic group, and these groups each optionally have a substituent. $R^B$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^B$ may be the same or different and may be combined together to form a ring together with the carbon atoms to which they are attached. When a plurality of $L^C$ are present, they may be the same or different.

$n^{c1}$ represents an integer of 0 or more.]

$R^A$ is preferably an aryl group or a monovalent heterocyclic group, more preferably an aryl group, and these groups each optionally have a substituent.

$R^3$ is preferably a hydrogen atom, an alkyl group, a cycloalkyl group, an aryl group or a monovalent heterocyclic group, more preferably a hydrogen atom, an alkyl group, a cycloalkyl group or an aryl group, further preferably a hydrogen atom or an alkyl group, particularly preferably a hydrogen atom, and these groups each optionally have a substituent.

$L^C$ is preferably —C($R^B$)$_2$—, an arylene group or a divalent heterocyclic group, more preferably —C($R^B$)$_2$— or an arylene group, further preferably an arylene group, particularly preferably a group represented by the formula (A-1) or (A-2), and these groups each optionally have a substituent.

The definition and examples of the substituent which $R^A$, $R^B$ and $L^C$ optionally have are the same as the definition and examples of the substituent which the ring $R^1$ and the ring $R^2$ described above optionally have.

$n^{c1}$ is usually an integer of 0 to 10, preferably an integer of 0 to 5, more preferably an integer of 0 to 2, further preferably 0 or 1, particularly preferably 0.

When the second polymer compound is a polymer compound comprising a constitutional unit represented by the formula (1B), the constitutional unit represented by the formula (1B) is an end constitutional unit.

"End constitutional unit" denotes a constitutional unit at an end of a polymer compound, and the end constitutional unit is preferably a constitutional unit derived from an end-capping agent in production of a polymer compound.

$M^{1B}$ is more preferably a group represented by the formula (BM-1).

[Chemical Formula 75]

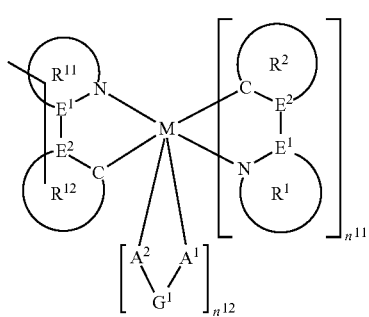

(BM-1)

[wherein,

M, $E^1$, $E^2$, the ring $R^1$, the ring $R^2$ and $A^1$-$G^1$-$A^2$ represent the same meaning as described above.

The ring $R^{11}$ represents a 5-membered or 6-membered aromatic heterocyclic ring, and these rings each optionally have a substituent. When a plurality of the substituents are present, they may be the same or different and may be combined together to form a ring together with the atoms to which they are attached. $E^1$ is a carbon atom when the ring $R^{11}$ is a 6-membered aromatic heterocyclic ring.

The ring $R^{12}$ represents a 5-membered or 6-membered aromatic hydrocarbon ring or a 5-membered or 6-membered aromatic heterocyclic ring, and these rings each optionally have a substituent. When a plurality of the substituents are present, they may be the same or different and may be combined together to form a ring together with the atoms to which they are attached. $E^2$ is a carbon atom when the ring $R^{12}$ is a 6-membered aromatic heterocyclic ring.

One of the ring $R^{11}$ and the ring $R^{12}$ has one connecting bond.

$n^{11}$ and $n^{12}$ each independently represent an integer of 0 or more. $n^{11}+n^{12}$ is 1 or 2. $n^{11}+n^{12}$ is 2 when M is a ruthenium atom, a rhodium atom or an iridium atom, while $n^{11}+n^{12}$ is 1 when M is a palladium atom or a platinum atom.]

$n^{11}$ is more preferably 2 when M is a ruthenium atom, a rhodium atom or an iridium atom.

$n^{11}$ is preferably 1 when M is a palladium atom or a platinum atom.

When the ring $R^{11}$ has no connecting bond, the definition and examples of the ring $R^{11}$ are the same as the definition and examples of the ring $R^1$ described above.

When the ring $R^{11}$ has a connecting bond, the definition and examples of the ring portion obtained by removing the connecting bond of the ring $R^{11}$ are the same as the definition and examples of the ring $R^1$ described above.

When the ring $R^{12}$ has no connecting bond, the definition and examples of the ring $R^{12}$ are the same as the definition and examples of the ring $R^2$ described above.

When the ring $R^{12}$ has a connecting bond, the definition and examples of the ring portion obtained by removing the connecting bond of the ring $R^{12}$ are the same as the definition and examples of the ring $R^2$ described above.

The definition and examples of the substituent which the ring $R^{11}$ and the ring $R^{12}$ optionally have are the same as the definition and examples of the substituent which the ring $R^1$ and the ring $R^2$ described above optionally have.

[Constitutional Unit Represented by the Formula (2B)]

[Chemical Formula 76]

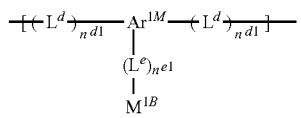

(2B)

[wherein, $M^{1B}$ represents the same meaning as described above.

$L^d$ and $L^e$ each independently represent an oxygen atom, a sulfur atom, —N($R^A$)—, —C($R^B$)$_2$—, —C($R^B$)═C($R^B$)—, —C≡C—, an arylene group or a divalent heterocyclic group, and these groups each optionally have a substituent. $R^A$ and $R^B$ represent the same meaning as described above. When a plurality of $L^d$ and $L^e$ are present, they may be the same or different at each occurrence.

$n^{d1}$ and $n^{e1}$ each independently represent an integer of 0 or more. The plurality of $n^{d1}$ may be the same or different.

$Ar^{1M}$ represents an aromatic hydrocarbon group or a heterocyclic group, and these groups each optionally have a substituent.]

$L^d$ is preferably —$C(R^B)_2$—, an arylene group or a divalent heterocyclic group, more preferably an arylene group or a divalent heterocyclic group, further preferably an arylene group, particularly preferably a group represented by the formula (A-1) or (A-2), and these groups each optionally have a substituent.

$L^e$ is preferably —$C(R^B)_2$—, an arylene group or a divalent heterocyclic group, more preferably —$C(R^B)_2$— or an arylene group, further preferably an arylene group, particularly preferably a group represented by the formula (A-1) or (A-2), and these groups each optionally have a substituent.

$n^{d1}$ and $n^{e1}$ are usually an integer of 0 to 10, preferably an integer of 0 to 5, more preferably an integer of 0 to 2, further preferably 0 or 1, particularly preferably 0.

$Ar^{1M}$ is preferably a group obtained by removing from a benzene ring, a naphthalene ring, a fluorene ring, a phenanthrene ring, a dihydrophenanthrene ring, a pyridine ring, a diazabenzene ring, a triazine ring, a carbazole ring, a phenoxazine ring or a phenothiazine ring three hydrogen atoms bonding directly to carbon atoms or hetero atoms constituting the ring, more preferably a group obtained by removing from a benzene ring, a naphthalene ring, a fluorene ring, a phenanthrene ring or a dihydrophenanthrene ring three hydrogen atoms bonding directly to carbon atoms constituting the ring, further preferably a group obtained by removing from a benzene ring or a fluorene ring three hydrogen atoms bonding directly to carbon atoms constituting the ring, particularly preferably a group obtained by removing from a benzene ring three hydrogen atoms bonding directly to carbon atoms constituting the ring, and these groups optionally have a substituent.

The definition and examples of the substituent which $L^d$, $L^e$ and $Ar^{1M}$ optionally have are the same as the definition and examples of the substituent which the ring $R^1$ and the ring $R^2$ described above optionally have.

[Constitutional Unit Represented by the Formula (3B)]

[Chemical Formula 77]

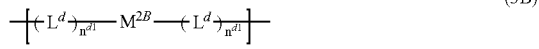

(3B)

[wherein, $L^d$ and $n^{d1}$ represent the same meaning as described above.

$M^{2B}$ represents a group obtained by removing from a phosphorescent compound represented by the formula (1) two hydrogen atoms bonding directly to carbon atoms or hetero atoms constituting the compound.]

$M^{2B}$ is more preferably a group represented by the formula (BM-2) or (BM-3), further preferably a group represented by the formula (BM-2).

[Chemical Formula 78]

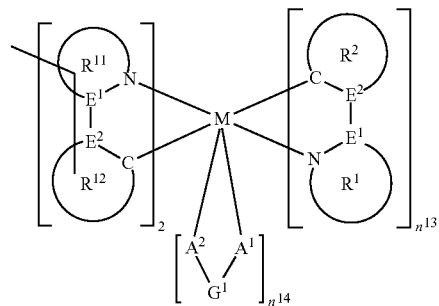

(BM-2)

[wherein,

M, $E^1$, $E^2$, the ring $R^1$, the ring $R^2$, the ring $R^{11}$, the ring $R^{12}$ and $A^1$-$G^1$-$A^2$ represent the same meaning as described above. The plurality of the rings $R^{11}$ may be the same or different. The plurality of the rings $R^{12}$ may be the same or different.

$n^{13}$ and $n^{14}$ each independently represent an integer of 0 or more. $n^{13}$+$n^{14}$ is 0 or 1. $n^{13}$+$n^{14}$ is 1 when M is a ruthenium atom, a rhodium atom or an iridium atom, while $n^{13}$+$n^{14}$ is 0 when M is a palladium atom or a platinum atom.]

$n^{13}$ is preferably 1 when M is a ruthenium atom, a rhodium atom or an iridium atom.

[Chemical Formula 79]

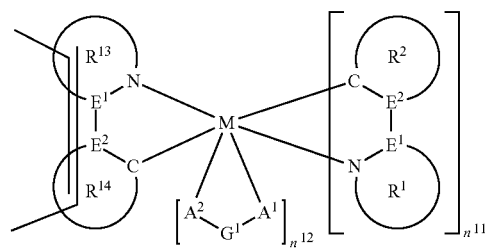

(BM-3)

[wherein,

M, $E^1$, $E^2$, the ring $R^1$, the ring $R^2$, $A^1$-$G^1$-$A^2$, $n^{11}$ and $n^{12}$ represent the same meaning as described above.

The ring represents a $R^{13}$ represents a 5-membered or 6-membered aromatic heterocyclic ring, and these rings each optionally have a substituent. When a plurality of the substituents are present, they may be the same or different and may be combined together to form a ring together with the atoms to which they are attached. $E^1$ is a carbon atom when the ring $R^{13}$ is a 6-membered aromatic heterocyclic ring.

The ring $R^{14}$ represents a 5-membered or 6-membered aromatic hydrocarbon ring or a 5-membered or 6-membered aromatic heterocyclic ring, and these rings each optionally have a substituent. When a plurality of the substituents are present, they may be the same or different and may be combined together to form a ring together with the atoms to which they are attached. $E^2$ is a carbon atom when the ring $R^{14}$ is a 6-membered aromatic heterocyclic ring.

One of the ring $R^{13}$ and the ring $R^{14}$ has two connecting bonds, or each of the ring $R^{13}$ and the ring $R^{14}$ has one connecting bond.]

When the ring $R^{13}$ has no connecting bond, the definition and examples of the ring $R^{13}$ are the same as the definition and examples of the ring $R^1$ described above.

When the ring $R^{13}$ has a connecting bond, the definition and examples of the ring portion obtained by removing the connecting bond of the ring $R^{13}$ are the same as the definition and examples of the ring $R^1$ described above.

When the ring $R^4$ has no connecting bond, the definition and examples of the ring $R^{14}$ are the same as the definition and examples of the ring $R^2$ described above.

When the ring $R^{14}$ has a connecting bond, the definition and examples of the ring portion obtained by removing the connecting bond of the ring $R^{14}$ are the same as the definition and examples of the ring $R^2$ described above.

The definition and examples of the substituent which the ring $R^{13}$ and the ring $R^{14}$ optionally have are the same as the definition and examples of the substituent which the ring $R^1$ and the ring $R^2$ described above optionally have.

It is preferable that each of the ring $R^{13}$ and the ring $R^{14}$ has one connecting bond.

[Constitutional Unit Represented by the Formula (4B)]

[Chemical Formula 80]

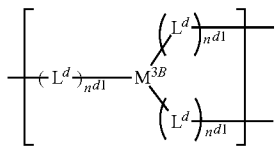

(4B)

[wherein, $L^d$ and $n^{d1}$ represent the same meaning as described above.

$M^{3B}$ represents a group obtained by removing from a phosphorescent compound represented by the formula (1) three hydrogen atoms bonding directly to carbon atoms or hetero atoms constituting the compound.]

$M^{3B}$ is preferably a group represented by the formula (BM-4).

[Chemical Formula 81]

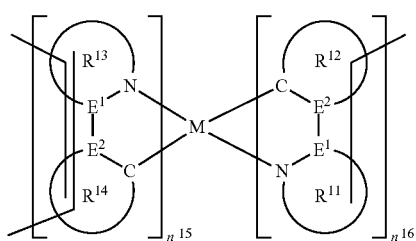

(BM-4)

[wherein,

M, $E^1$, $E^2$, the ring $R^{11}$, the ring the ring $R^{12}$, the ring $R^{14}$ and $A^1$-$G^1$-$A^2$ represent the same meaning as described above.

$n^{15}$ represents 0 or 1. $n^{16}$ represents 1 or 3. $n^{15}$ is 0 and $n^{16}$ is 3 when M is a ruthenium atom, a rhodium atom or an iridium atom. $n^{15}$ is 1 and $n^{16}$ is 1 when M is a palladium atom or a platinum atom.]

The phosphorescent constitutional unit includes, for example, constitutional units represented by the formulae (B-1) to (B-25).

[Chemical Formula 82]

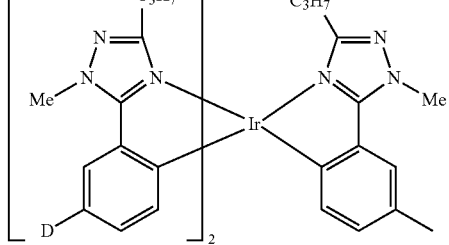

(B-1)

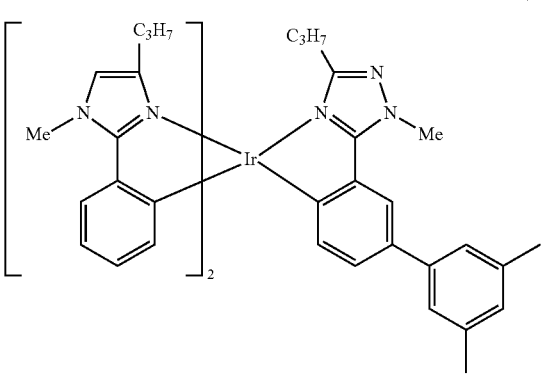

(B-2)

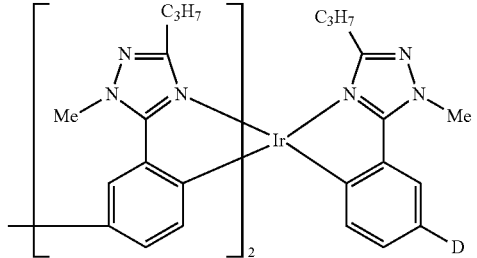

(B-3)

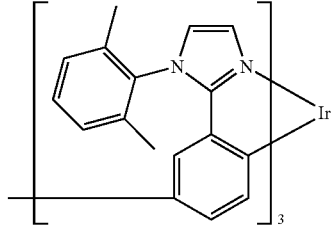

(B-4)

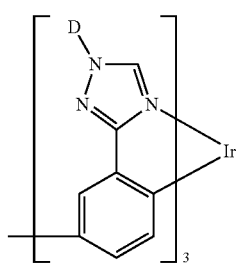

(B-5)

[Chemical Formula 83]
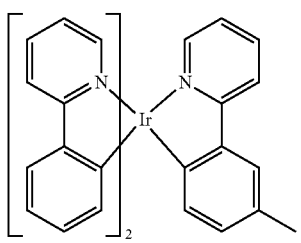 (B-6)
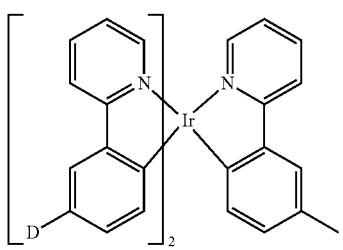 (B-7)
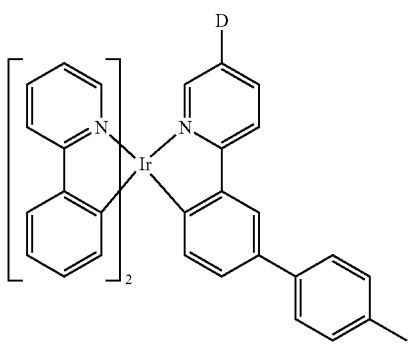 (B-8)
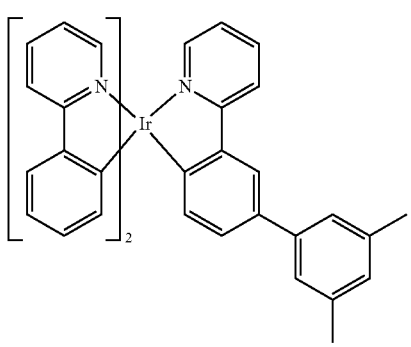 (B-9)
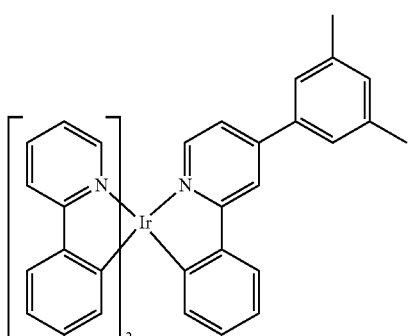 (B-10)
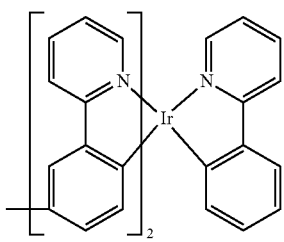 (B-11)
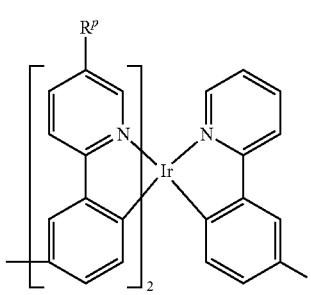 (B-12)
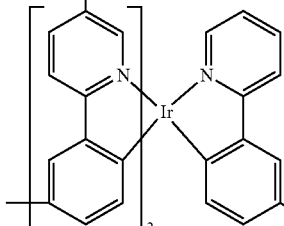 (B-13)
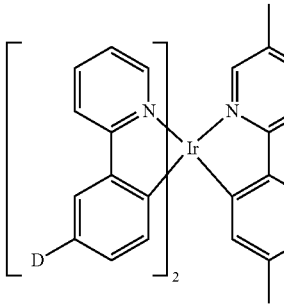 (B-14)
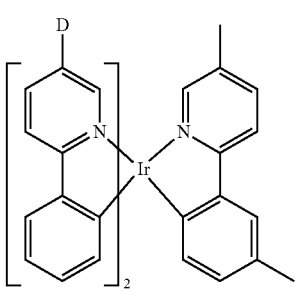 (B-15)

[Chemical Formula 84]

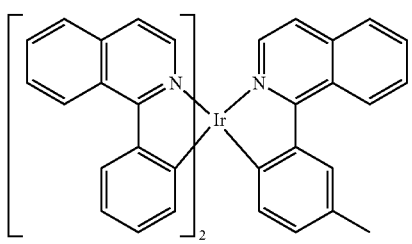 (B-16)

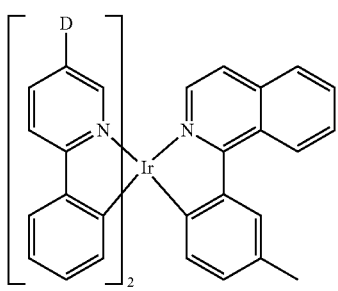 (B-17)

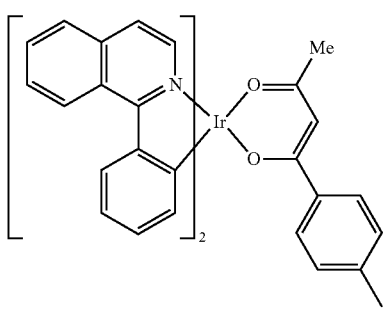 (B-18)

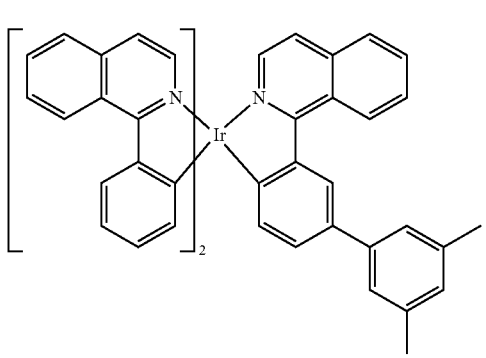 (B-19)

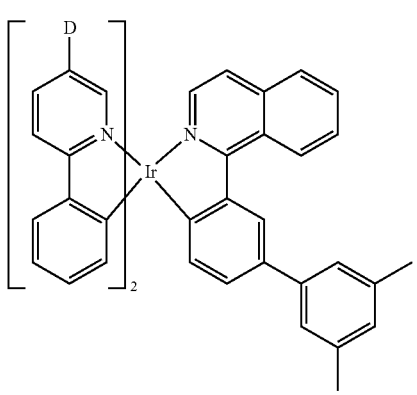 (B-20)

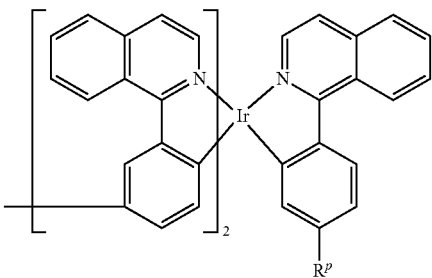 (B-21)

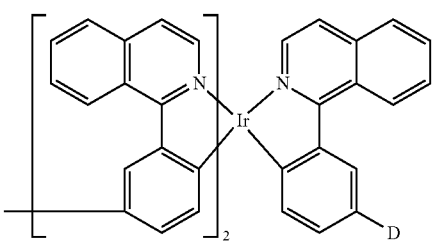 (B-22)

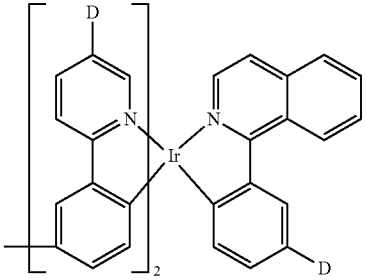 (B-23)

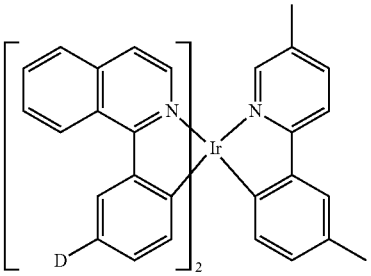 (B-24)

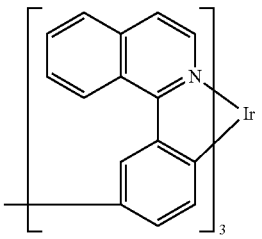 (B-25)

[wherein,

D represents a group represented by the formula (2). When a plurality of D are present, they may be the same or different.

$R^p$ represents a hydrogen atom, an alkyl group, a cycloalkyl group, an alkoxy group or a cycloalkoxy group, and these groups each optionally have a substituent.]

The amount of the phosphorescent constitutional unit is preferably 0.5 to 50 mol %, more preferably 1 to 30 mol %, further preferably 3 to 15 mol %, with respect to the total amount of constitutional units contained in the second polymer compound, because a light emitting device produced by using the composition of the present invention is excellent in light emission efficiency.

The phosphorescent constitutional unit may be contained singly or two or more of the constitutional units may be contained in the second polymer compound.

It is preferable that the second polymer compound further comprises a constitutional unit represented by the formula (Y). The definition and examples of the constitutional unit represented by the formula (Y) are the same as the definition and examples of the constitutional unit represented by the formula (Y) contained in the first polymer compound described above.

The amount of the constitutional unit represented by the formula (Y) in which $Ar^{Y1}$ is an arylene group is preferably 0.5 to 90 mol %, more preferably 30 to 80 mol %, with respect to the total amount of constitutional units contained in the second polymer compound, because a light emitting device produced by using the composition of the present invention is excellent in light emission efficiency.

The amount of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 50 mol %, more preferably 3 to 30 mol %, with respect to the total amount of constitutional units contained in the second polymer compound, because a light emitting device produced by using the composition of the present invention is excellent in charge transportability.

The constitutional unit represented by the formula (Y) may be contained singly or two or more of the constitutional units may be contained in the second polymer compound.

It is preferable that the second polymer compound further comprises a constitutional unit represented by the formula (X), because a light emitting device produced by using the composition of the present invention is excellent in hole transportability. The definition and examples of the constitutional unit represented by the formula (X) are the same as the definition and examples of the constitutional unit represented by the formula (X) contained in the first polymer compound described above.

The amount of the constitutional unit represented by the formula (X) is preferably 0.1 to 50 mol %, more preferably 1 to 40 mol %, further preferably 5 to 30 mol %, with respect to the total amount of constitutional units contained in the second polymer compound, because a light emitting device produced by using the composition of the present invention is excellent in hole transportability.

The constitutional unit represented by the formula (X) may be contained singly or two or more of the constitutional units may be contained in the second polymer compound.

The second polymer compound includes, for example, polymer compounds (P-108) to (P-114) shown in Table 4.

TABLE 2

| polymer compound | constitutional unit and mole fraction thereof | | | | | |
|---|---|---|---|---|---|---|
| | formula (Y) | | | formula (X) | phosphorescent constitutional unit formulae | |
| | formulae (Y-1) to (Y-3) p' | formulae (Y-4) to (Y-7) q' | formulae (Y-8) to (Y-10) r' | formulae (X-1) to (X-7) s' | formulae (1B) to (4B) t' | others u' |
| (P-108) | 0.1 to 99.8 | 0.1 to 99.8 | 0 | 0 | 0.1 to 50.0 | 0 to 30 |
| (P-109) | 0.1 to 99.8 | 0 | 0.1 to 99.8 | 0 | 0.1 to 50.0 | 0 to 30 |
| (P-110) | 0.1 to 99.8 | 0 | 0 | 0.1 to 99.8 | 0.1 to 50.0 | 0 to 30 |
| (P-111) | 0.1 to 99.7 | 0.1 to 99.7 | 0.1 to 99.7 | 0 | 0.1 to 50.0 | 0 to 30 |
| (P-112) | 0.1 to 99.7 | 0.1 to 99.7 | 0 | 0.1 to 99.7 | 0.1 to 50.0 | 0 to 30 |
| (P-113) | 0.1 to 99.7 | 0 | 0.1 to 99.7 | 0.1 to 99.7 | 0.1 to 50.0 | 0 to 30 |
| (P-114) | 0.1 to 99.6 | 0.1 to 99.6 | 0.1 to 99.6 | 0.1 to 99.6 | 0.1 to 50.0 | 0 to 30 |

[in the table, p', q', r', s', t' and u' represent the mole fraction of each constitutional unit. p'+q'+r'+s'+t'+u'=100 and 100≥p'+q'+r'+s'+t'≥70. The other constitutional unit denotes a constitutional unit other than the constitutional unit represented by the formula (Y), the constitutional unit represented by the formula (X) and the phosphorescent constitutional unit.]

<Production Method of Polymer Compound>

The first polymer compound and the second polymer compound may be any of a block copolymer, a random copolymer, an alternative copolymer and a graft copolymer or may be a polymer compound of the other embodiment, and are preferably a copolymer produced by copolymerizing several raw material monomers.

The first polymer compound can be produced, for example, by condensation-polymerizing a compound represented by the formula (M-Y1), and at least one compound selected from the group consisting of a compound represented by the formula (M-Y2) and a compound represented by the formula (M-X).

The second polymer compound can be produced, for example, by condensation-polymerizing a compound represented by the formula (M-Y1), at least one compound selected from the group consisting of a compound represented by the formula (M-Y2) and a compound represented by the formula (M-X), and at least one compound selected from the group consisting of a compound represented by the formula (M-1B), a compound represented by the formula (M-2B), a compound represented by the formula (M-3B) and a compound represented by the formula (M-4B).

When a compound represented by the formula (M-1B) is used, this compound is used as an end-capping agent.

In the present specification, compounds used in production of the first to second polymer compounds are collectively called "raw material monomer" in some cases.

[Chemical Formula 85]

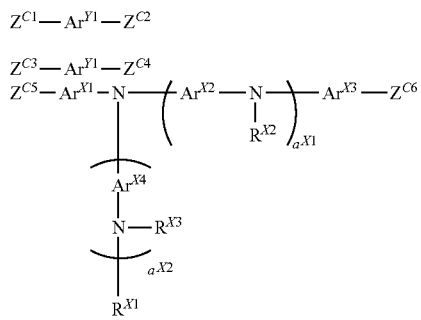

(M-Y1)
(M-Y2)

[Chemical Formula 86]

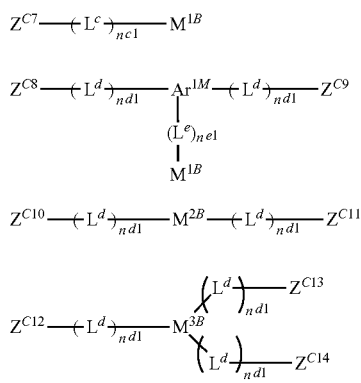

(M-1B)
(M-2B)
(M-3B)
(M-4B)

[wherein,
$Ar^{Y1}$, $Ar^{X1}$ to $Ar^{X4}$, $R^{X1}$, $R^{X2}$, $R^{X3}$, $a^{X1}$, $a^{X2}$, $L^c$ to $L^e$, $M^{1B}$ to $M^{3B}$, $n^{c1}$, $n^{d1}$ and $n^{e1}$ represent the same meaning as described above.

$Z^{C1}$ to $Z^{C14}$ each independently represent a group selected from the group consisting of Group A of substituent and Group B of substituent.]

For example, when $Z^{C1}$ and $Z^{C2}$ are a group selected from Group A of substituent, a group selected from Group B of substituent is selected for $Z^{C3}$ to $Z^{C14}$.

For example, when $Z^{C1}$ and $Z^{C2}$ are a group selected from Group B of substituent, a group selected from Group A of substituent is selected for $Z^{C3}$ to $Z^{C14}$.

<Group A of Substituent>

A chlorine atom, a bromine atom, an iodine atom and a group represented by —O—S(=O)$_2$R$^{C1}$ (wherein, R$^{C1}$ represents an alkyl group, a cycloalkyl group or an aryl group, and these groups each optionally have a substituent.).

<Group B of Substituent>

A group represented by —B(OR$^{C2}$)$_2$ (wherein, R$^{C2}$ represents a hydrogen atom, an alkyl group, a cycloalkyl group or an aryl group, and these groups each optionally have a substituent. The plurality of R$^{C2}$ may be the same or different and may be combined together to form a cyclic structure together with the oxygen atoms to which they are attached.);

a group represented by —BF$_3$Q' (wherein, Q' represents Li, Na, K, Rb or Cs.);

a group represented by —MgY' (wherein, Y represents a chlorine atom, a bromine atom or an iodine atom.);

a group represented by —ZnY'' (wherein, Y'' represents a chlorine atom, a bromine atom or an iodine atom.); and a group represented by —Sn(R$^{C3}$)$_3$ (wherein, R$^{C3}$ represents a hydrogen atom, an alkyl group, a cycloalkyl group or an aryl group, and these groups each optionally have a substituent. The plurality of R$^{C3}$ may be the same or different and may be combined together to form a cyclic structure together with the tin atom to which they are attached.).

As the group represented by —B(OR$^{C2}$)$_2$, groups represented by the following formulae are exemplified.

[Chemical Formula 87]

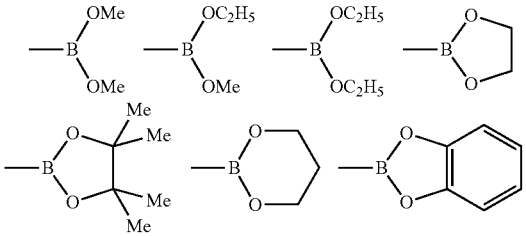

The compound having a group selected from Group A of substituent and the compound having a group selected from Group B of substituent undergo condensation polymerization by a known coupling reaction, thereby giving mutual bonding of carbon atoms linking the group selected from Group A of substituent and the group selected from Group B of substituent. Therefore, when a compound having one or more groups selected from Group A of substituent and a compound having one or more groups selected from Group B of substituent are subjected to a known coupling reaction, a condensed polymer of these compounds can be produced by condensation polymerization.

The condensation polymerization is carried out usually in the presence of a catalyst, a base and a solvent, and if necessary, a phase transfer catalyst may coexist.

The catalyst includes, for example, transition metal complexes such as palladium complexes such as dichlorobis (triphenylphosphine)palladium, dichlorobis(tris-o-methoxyphenylphosphine)palladium, palladium[tetrakis (triphenylphosphine)], [tris(dibenzylideneacetone)] dipalladium and palladium acetate, nickel complexes such as nickel[tetrakis(triphenylphosphine)], [1,3-bis(diphenylphosphino)propane]dichloronickel and [bis(1,4-cyclooctadiene)]nickel; these transition metal complexes further having a ligand such as triphenylphosphine, tri-o-tolyiphosphine, tri(tert-butylphosphine), tricyclohexylphosphine, diphenylphosphinopropane and bipyridyl. The catalysts may be used singly or in combination.

The use amount of the catalyst is usually 0.00001 to 3 molar equivalents in terms of the amount of a transition metal with respect to the sum of the molar numbers of raw material monomers.

The base includes, for example, inorganic bases such as sodium carbonate, potassium carbonate, cesium carbonate, potassium fluoride, cesium fluoride and tripotassium phosphate; organic bases such as tetrabutylammonium fluoride and tetrabutylammonium hydroxide. The bases each may be used singly or in combination.

The phase transfer catalyst include, for example, tetrabutylammonium chloride, tetrabutylammonium bromide and the like. The phase transfer catalysts each may be used singly or in combination.

The use amount of the base is each usually 0.001 to 100 molar equivalents with respect to the total molar number of raw material monomers.

The use amount of the phase transfer catalyst is each usually 0.001 to 100 molar equivalents with respect to the total molar number of raw material monomers.

The solvent includes, for example, organic solvents such as toluene, xylene, mesitylene, tetrahydrofuran, 1,4-dioxane, dimethoxyethane, N, N-dimethylacetamide and N,N-dimethylformamide; and water. The solvent may be used singly, or two or more solvents may be used in combination.

The use amount of the solvent is usually 10 to 100000 parts by weight with respect to 100 parts by weight of the total amount of raw material monomers.

The reaction temperature of condensation polymerization is usually −100 to 200° C. The reaction time is usually 1 hour or longer.

The post treatment of the polymerization reaction is conducted by known methods, such as a method of removing water-soluble impurities by liquid separation and a method in which the reaction solution resulting from the polymerization reaction is added to a lower alcohol such as methanol and a precipitate deposited is collected by filtration and dried, that are applied individually or in combination. When the first polymer compound and the second polymer compound have a low purity, they can be purified by a usual method, such as recrystallization, reprecipitation, continuous extraction by a Soxhlet extractor and column chromatography.

<Composition>

The composition of the present invention will be illustrated.

The composition of the present invention is a composition which is useful for production of a film excellent in flatness when used in a discharge type application method, and can be suitably used in production of a light emitting device. That is, the composition of the present invention is suitable as a composition for production of a light emitting device.

The composition of the present invention is a composition comprising a phosphorescent compound (may also be a second polymer compound), a solvent (A) and a solvent (B) (hereinafter, referred to also as "composition A").

In the composition A, one kind of the phosphorescent compound may be contained singly or two or more kinds of the phosphorescent compounds may be contained.

In the composition A, the content of the phosphorescent compound is usually 0.1 to 20 parts by weight, and from the standpoint of film formability, preferably 0.2 to 10 parts by weight, more preferably 0.3 to 5 parts by weight, further preferably 0.5 to 3 parts by weight, when the total content of the phosphorescent compound, a solvent (A) and a solvent (B) is 100 parts by weight.

The composition of the present invention may also be a composition comprising a phosphorescent compound (may also be a second polymer compound), a solvent (A), a solvent (B) and the first polymer compound (hereinafter, referred to also as "composition B").

In the composition B, one kind of the phosphorescent compound may be contained singly or two or more kinds of the phosphorescent compounds may be contained.

In the composition B, one kind of the first polymer compound may be contained singly or two or more kinds of the first polymer compounds may be contained.

In the composition B, the total content of the phosphorescent compound and the first polymer compound is usually 0.1 to 20 parts by weight, and from the standpoint of film formability, preferably 0.2 to 10 parts by weight, more preferably 0.3 to 5 parts by weight, further preferably 0.5 to 3 parts by weight, when the total content of the phosphorescent compound, a solvent (A), a solvent (B) and the first polymer compound is 100 parts by weight.

In the composition B, the content of the first polymer compound is usually 10 to 99.9 parts by weight, and from the standpoint of the light emission property of a light emitting device produced by using the composition B, preferably 20 to 99 parts by weight, more preferably 30 to 97 parts by weight, further preferably 40 to 95 parts by weight, when the total content of the phosphorescent compound and the first polymer compound is 100 parts by weight.

The composition of the present invention may also be a composition comprising a phosphorescent compound (may also be a second polymer compound), a solvent (A), a solvent (B) and a non-phosphorescent low molecular weight compound (hereinafter, referred to also as "composition C").

In the composition C, one kind of the phosphorescent compound may be contained singly or two or more kinds of the phosphorescent compounds may be contained.

In the composition C, one kind of the non-phosphorescent low molecular weight compound may be contained singly or two or more kinds of the non-phosphorescent low molecular weight compounds may be contained.

In the composition C, the total content of the phosphorescent compound and the non-phosphorescent low molecular weight compound is usually 0.1 to 20 parts by weight, and from the standpoint of film formability, preferably 0.2 to 10 parts by weight, more preferably 0.3 to 5 parts by weight, further preferably 0.5 to 3 parts by weight, when the total content of the phosphorescent compound, a solvent (A), a solvent (B) and the non-phosphorescent low molecular weight compound is 100 parts by weight.

In the composition C, the content of the non-phosphorescent low molecular weight compound is usually 10 to 99.9 parts by weight, and from the standpoint of the light emission property of a light emitting device produced by using the composition C, preferably 20 to 99 parts by weight, more preferably 30 to 97 parts by weight, further preferably 40 to 95 parts by weight, when the total content of the phosphorescent compound and the non-phosphorescent low molecular weight compound is 100 parts by weight.

The composition of the present invention may also be a composition comprising a phosphorescent compound (may also be a second polymer compound), a solvent (A), a solvent (B), a non-phosphorescent low molecular weight compound and a first polymer compound (hereinafter, referred to also as "composition D").

In the composition D, one kind of the phosphorescent compound may be contained singly or two or more kinds of the phosphorescent compounds may be contained.

In the composition D, one kind of the non-phosphorescent low molecular weight compound may be contained singly or two or more kinds of the non-phosphorescent low molecular weight compounds may be contained.

In the composition D, one kind of the first polymer compound may be contained singly or two or more kinds of the first polymer compounds may be contained.

In the composition D, the total content of the phosphorescent compound, the non-phosphorescent low molecular weight compound and the first polymer compound is usually 0.1 to 20 parts by weight, and from the standpoint of film formability, preferably 0.2 to 10 parts by weight, more preferably 0.3 to 5 parts by weight, further preferably 0.5 to 3 parts by weight, when the total content of the phosphorescent compound, a solvent (A), a solvent (B), the non-phosphorescent low molecular weight compound and the first polymer compound is 100 parts by weight.

In the composition D, the total content of the non-phosphorescent low molecular weight compound and the first polymer compound is usually 10 to 99.9 parts by weight, and from the standpoint of the light emission property of a light emitting device produced by using the composition D, preferably 20 to 99 parts by weight, more preferably 30 to 97 parts by weight, further preferably 40 to 95 parts by weight, when the total content of the phosphorescent compound, the non-phosphorescent low molecular weight compound and the first polymer compound is 100 parts by weight.

<Other Components>

The composition of the present invention may further comprise at least one material selected from the group consisting of a hole transporting material, a hole injection material, an electron transporting material, an electron injection material, a light emitting material (different from a phosphorescent compound) and an antioxidant.

<Hole Transporting Material>

The hole transporting material is classified into low molecular weight compounds and polymer compounds, and is preferably polymer compounds, more preferably polymer compounds having a crosslinkable group.

The polymer compound includes, for example, polyvinylcarbazole and derivatives thereof; polyarylene having an aromatic amine structure in the side chain or main chain and derivatives thereof. The polymer compound may also be a compound in which an electron accepting portion is linked. The electron accepting portion includes, for example, fullerene, tetrafluorotetracyanoquinodimethane, tetracyanoethylene, trinitrofluorenone, preferably fullerene.

In the composition of the present invention, the amount of the hole transporting material is usually 1 to 400 parts by weight, preferably 5 to 150 parts by weight when the amount of the phosphorescent compound is 100 parts by weight.

The hole transporting material may be used singly or two or more hole transporting materials may be used in combination.

<Electron Transporting Material>

The electron transporting material is classified into low molecular weight compounds and polymer compounds. The electron transporting material optionally has a crosslinkable group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone and derivatives thereof.

The polymer compound includes, for example, polyphenylene, polyfluorene and derivatives thereof. These polymer compounds may be doped with a metal.

In the composition of the present invention, the amount of the electron transporting material is usually 1 to 400 parts by weight, preferably 5 to 150 parts by weight when the amount of the phosphorescent compound is 100 parts by weight.

The electron transporting material may be used singly or two or more electron transporting materials may be used in combination.

<Hole Injection Material and Electron Injection Material>

The hole injection material and the electron injection material are each classified into low molecular weight compounds and polymer compounds. The hole injection material and the electron injection material optionally have a crosslinkable group.

The low molecular weight compound includes, for example, metal phthalocyanines such as copper phthalocyanine; carbon; oxides of metals such as molybdenum and tungsten; metal fluorides such as lithium fluoride, sodium fluoride, cesium fluoride and potassium fluoride.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer comprising an aromatic amine structure in the side chain or main chain.

In the composition of the present invention, the amounts of the hole injection material and the electron injection material are each usually 1 to 400 parts by weight, preferably 5 to 150 parts by weight when the amount of the phosphorescent compound is 100 parts by weight.

The hole injection material and the electron injection material may each be used singly or two or more of them may be used in combination.

<Ion Dope>

When the hole injection material or the electron injection material comprises an electrically conductive polymer, the electric conductivity of the electrically conductive polymer is preferably $1 \times 10^{-5}$ S/cm to $1 \times 10^{3}$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used singly or two or more ions to be doped may be used.

<Light Emitting Material>

The light emitting material (the light emitting material is different form a phosphorescent material) is classified into low molecular weight compounds and polymer compounds. The light emitting material optionally has a crosslinkable group.

The low molecular weight compound includes, for example, naphthalene and derivatives thereof, anthracene and derivatives thereof, and perylene and derivatives thereof.

The polymer compound includes, for example, polymer compounds comprising a phenylene group, a naphthalenediyl group, a fluorenediyl group, a phenanthrenediyl group, dihydrophenanthrenediyl group, a group represented by the formula (X), a carbazolediyl group, a phenoxazinediyl group, a phenothiazinediyl group, an anthracenediyl group, a pyrenediyl group and the like.

In the composition of the present invention, the amount of the light emitting material is usually 0.1 to 400 parts by weight when the amount of the phosphorescent compound is 100 parts by weight.

<Antioxidant>

The antioxidant may advantageously be one which is soluble in the solvent (A) and/or the solvent (B) and does not disturb light emission and charge transportation, and the examples thereof include phenol antioxidants and phosphorus-based antioxidants.

In the composition of the present invention, the compounding amount of the antioxidant is usually $10^{-6}$ to $10^{1}$ parts by weight when the amount of the composition is 100 parts by weight.

The antioxidant may be used singly or two or more antioxidants may be used in combination.

<Viscosity>

The viscosity of the composition of the present invention is usually 1 to 100 mPa·s, preferably 1 to 50 mPa·s, more preferably 1 to 20 mPa·s.

<Film>

The film is a film comprising a phosphorescent compound (may also be a second polymer compound), formed by using the composition of the present invention. In the film, a first polymer compound or non-phosphorescent low molecular weight compound may also be contained.

The film includes also an insolubilized film in which a phosphorescent compound (may also be a second polymer compound) or a first polymer compound or non-phosphorescent low molecular weight compound is insolubilized in a solvent by cross-link. The insolubilized film is a film obtained by cross-linking a phosphorescent compound or a first polymer compound or non-phosphorescent low molecular weight compound by an external stimulus such as heating and light irradiation. The insolubilized film can be suitably used for lamination of a light emitting device because the film is substantially insoluble in a solvent.

The temperature of heating for cross-linking the film is usually 25 to 300° C., and from the standpoint of excellent light emission efficiency, preferably 50 to 250° C., more preferably 150 to 200° C.

The light used in light irradiation for cross-linking the film is, for example, ultraviolet light, near ultraviolet light and visible light.

The film is suitable as a light emitting layer, a hole transporting layer or a hole injection layer in a light emitting device.

The film can be fabricated, for example, by a spin coat method, a casting method, a micro gravure method, a gravure method, a bar coat method, a roll coat method, a wire bar coat method, a dip coat method, a spray coat method, a screen printing method, a flexo printing method, an offset printing method, an inkjet printing method, a capillary coat method or a nozzle coat method, using the composition of the present invention, and a film fabricated by an inkjet printing method or the like as a discharge type application method is excellent in its flatness.

The thickness of the film is usually 1 nm to 10 µm.

<Light Emitting Device>

The light emitting device of the present invention is a light emitting device produced by using the composition of the present invention, and may also be a light emitting device in which a phosphorescent compound (may also be a second polymer compound) and/or a first polymer compound or non-phosphorescent low molecular weight compound is cross-linked intramolecularly or intermolecularly.

The light emitting device of the present invention is, for example, constituted of electrodes consisting of an anode and a cathode and a layer obtained by using the composition of the present invention disposed between the electrodes.

<Layer Constitution>

The layer produced by using the composition of the present invention is usually at least one selected from a light emitting layer, a hole transporting layer, a hole injection layer, an electron transporting layer and an electron injection layer, preferably a light emitting layer. These layers comprise a light emitting material, a hole transporting material, a hole injection material, an electron transporting material and an electron injection material, respectively.

The light emitting device comprises a light emitting layer between an anode and a cathode. The light emitting device of the present invention preferably comprises at least one of a hole injection layer and a hole transporting layer between an anode and a light emitting layer from the standpoint of hole injectability and hole transportability, and preferably comprises at least one of an electron injection layer and an electron transporting layer between a cathode and a light emitting layer from the standpoint of electron injectability and electron transportability.

The material of a hole transporting layer, an electron transporting layer, a light emitting layer, a hole injection layer and an electron injection layer includes the above-described hole transporting materials, electron transporting materials, light emitting materials, hole injection materials and electron injection materials, respectively, in addition to the composition of the present invention.

When the material of a hole transporting layer, the material of an electron transporting layer and the material of a light emitting layer are soluble in a solvent which is used in forming a layer adjacent to the hole transporting layer, the electron transporting layer and the light emitting layer, respectively, in fabrication of a light emitting device, it is preferable that the materials have a crosslinkable group to avoid dissolution of the materials in the solvent. After forming the layers using the materials having a crosslinkable group, the layers can be insolubilized by crosslinking the crosslinkable group.

Methods of forming respective layers such as a light emitting layer, a hole transporting layer, an electron transporting layer, a hole injection layer and an electron injection layer in the light emitting device of the present invention include, for example, a method of vacuum vapor deposition from a powder and a method of film formation from solution or melted state when a low molecular weight compound is used, and, for example, a method of film formation from solution or melted state when a polymer compound is used.

Methods of film formation from solution include, for example, a spin coating method, a casting method, a micro gravure coating method, a gravure coating method, a bar coating method, a roll coating method, a wire bar coating method, a dip coating method, a spray coating method, a screen printing method, a flexo printing method, an offset printing method, an inkjet printing method, a capillary coating method and a nozzle coating method.

The order and the number of layers to be laminated and the thickness of each layer may be controlled in view of light emission efficiency and luminance life.

<Substrate/Electrode>

The substrate in the light emitting device may advantageously be a substrate on which an electrode can be formed and which does not chemically change in forming an organic layer, and is a substrate made of a material such as, for example, glass, plastic and silicon. In the case of an opaque substrate, it is preferable that an electrode most remote from the substrate is transparent or semi-transparent.

The material of the anode includes, for example, electrically conductive metal oxides and semi-transparent metals, preferably, indium oxide, zinc oxide and tin oxide; electrically conductive compounds such as indium.tin.oxide (ITO) and indium.zinc.oxide; a composite of silver, palladium and copper (APC); NESA, gold, platinum, silver and copper.

The material of the cathode includes, for example, metals such as lithium, sodium, potassium, rubidium, cesium, beryllium, magnesium, calcium, strontium, barium, aluminum, zinc and indium; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode may each take a lamination structure composed of two or more layers.

<Production Method of Light Emitting Device>

The light emitting device of the present invention can be produced by a production method of a light emitting device comprising an anode, a cathode and a light emitting layer disposed between the anode and the cathode, comprising a step of forming the light emission layer using the composition of the present invention (a first embodiment of the production method of a light emitting device).

The method of forming a light emitting layer using the composition of the present invention includes, for example, a spin coat method, a casting method, a micro gravure method, a gravure method, a bar coat method, a roll coat method, a wire bar coat method, a dip coat method, a spray coat method, a screen printing method, a flexo printing method, an offset printing method, an inkjet printing method, a capillary coat method and a nozzle coat method. Of them, an inkjet printing method or the like as a discharge type application method is preferable.

The light emitting device of the present invention can be produced by a production method of a light emitting device comprising an anode, a cathode, alight emitting layer disposed between the anode and the cathode, and at least one layer selected from the group consisting of a hole transporting layer, a hole injection layer, an electron transporting layer and an electron injection layer, comprising a step of forming the at least one layer selected from the group consisting of a hole transporting layer, a hole injection layer, an electron transporting layer and an electron injection layer using the composition of the present invention (a second embodiment of the production method of a light emitting device).

The method of forming the at least one layer selected from the group consisting of a hole transporting layer, a hole injection layer, an electron transporting layer and an electron injection layer using the composition of the present invention includes, for example, a spin coat method, a casting method, a micro gravure method, a gravure method, a bar coat method, a roll coat method, a wire bar coat method, a dip coat method, a spray coat method, a screen printing method, a flexo printing method, an offset printing method, an inkjet printing method, a capillary coat method and a nozzle coat method. Of them, an inkjet printing method or the like as a discharge type application method is preferable.

<Use>

For producing planar light emission by using a light emitting device, a planar anode and a planar cathode are disposed so as to overlap with each other. Patterned light emission can be produced by a method of placing a mask with a patterned window on the surface of a planer light emitting device, a method of forming extremely thick a layer intended to be a non-light emitting, thereby having the layer essentially no-light emitting or a method of forming an anode, a cathode or both electrodes in a patterned shape. By forming a pattern with any of these methods and disposing certain electrodes so as to switch ON/OFF independently, a segment type display capable of displaying numbers and letters and the like is provided. For producing a dot matrix display, both an anode and a cathode are formed in a stripe shape and disposed so as to cross with each other. Partial color display and multi-color display are made possible by a method of printing separately certain polymer compounds showing different emission or a method of using a color filter or a fluorescence conversion filter. The dot matrix display can be passively driven, or actively driven combined with TFT and the like. These displays can be used in computers, television sets, portable terminals and the like. The planar light emitting device can be suitably used as a planer light source for backlight of a liquid crystal display or as a planar light source for illumination. If a flexible substrate is used, it can be used also as a curved light source and a curved display.

EXAMPLES

The following examples will illustrate the present invention further in detail, but the present invention is not limited to these examples.

In the present examples, the form of a film was measured using a three-dimensional non-contact surface shape measuring system (manufactured by Mitsubishi Chemical Systems, Inc., trade name: Micromap (MM557N-M100 type)).

<Synthesis Example 1> Synthesis of Phosphorescent Compound E1

A phosphorescent compound E1 was synthesized according to a method disclosed in JP-A No. 2006-188673.

[Chemical Formula 88]

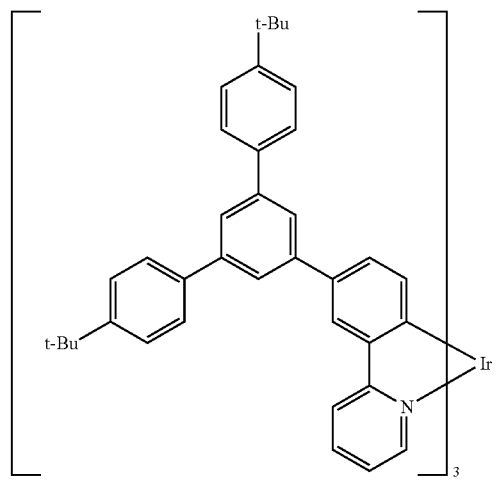

Phosphorescent Compound E1

<Synthesis Example 2> Synthesis of Low Molecular Weight Compound H1

A low molecular weight compound H1 was synthesized according to a method disclosed in JP-A No. 2010-189630.

[Chemical Formula 89]

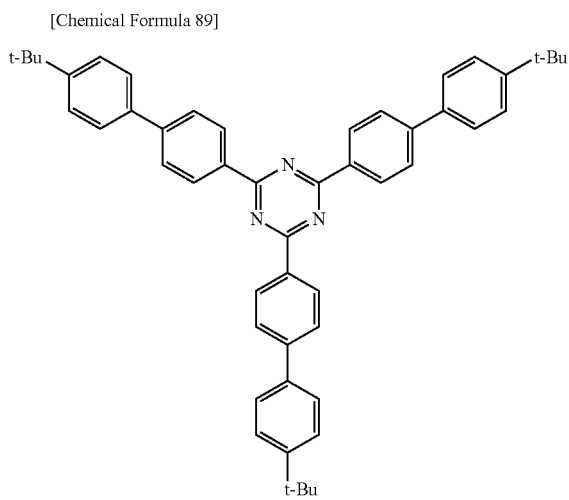

Low Molecular Weight Compound H1

<Example 1> Preparation of Composition 1

Zero point four five parts by weight of the phosphorescent compound E1, 1.05 parts by weight of the low molecular weight compound H1, 78.8 parts by weight of tetralin (the boiling point under 1 atm: 207° C.) and 19.7 parts by weight of ethylbenzene (the boiling point under 1 atm: 136° C.) were mixed. Thereafter, the mixture was stirred, thereby dissolving the phosphorescent compound E1 and the low molecular weight compound H1 in a mixed solvent of tetralin and ethylbenzene, to prepare a composition 1. The difference in boiling point between tetralin and ethylbenzene is 71° C.

<Example 2> Preparation of Composition 2

Zero point four five parts by weight of the phosphorescent compound E1, 1.05 parts by weight of the low molecular weight compound H1, 78.8 parts by weight of 3-phenoxytoluene (the boiling point under 1 atm: 272° C.) and 19.7 parts by weight of sec-butylbenzene (the boiling point under 1 atm: 173° C.) were mixed. Thereafter, the mixture was stirred, thereby dissolving the phosphorescent compound E1 and the low molecular weight compound H1 in a mixed solvent of 3-phenoxytoluene and sec-butylbenzene, to prepare a composition 2. The difference in boiling point between 3-phenoxytoluene and sec-butylbenzene is 99° C.

<Example 3> Preparation of Composition 3

Zero point four five parts by weight of the phosphorescent compound E1, 1.05 parts by weight of the low molecular weight compound H1, 78.8 parts by weight of 3-phenoxytoluene (the boiling point under 1 atm: 272° C.) and 19.7 parts by weight of anisole (the boiling point under 1 atm: 154° C.) were mixed. Thereafter, the mixture was stirred, thereby dissolving the phosphorescent compound E1 and the low molecular weight compound H1 in a mixed solvent of 3-phenoxytoluene and anisole, to prepare a composition 3. The difference in boiling point between 3-phenoxytoluene and anisole is 118° C.

<Comparative Example 1> Production of Composition C1

Zero point four five parts by weight of the phosphorescent compound E1, 1.05 parts by weight of the low molecular weight compound H1, 68.95 parts by weight of n-heptylbenzene (the boiling point under 1 atm: 235° C.) and 29.55 parts by weight of toluene (the boiling point under 1 atm: 110° C.) were mixed. Thereafter, the mixture was stirred, thereby dissolving the phosphorescent compound E1 and the low molecular weight compound H1 in a mixed solvent of n-heptylbenzene and toluene, to produce a composition C1. The difference in boiling point between n-heptylbenzene and toluene was 125° C.

<Comparative Example 2> Production of Composition C2

Zero point four five parts by weight of the phosphorescent compound E1, 1.05 parts by weight of the low molecular weight compound H1, 68.95 parts by weight of n-hexylbenzene (the boiling point under 1 atm: 226° C.) and 29.55 parts by weight of 4-methylanisole (the boiling point under 1 atm: 175° C.) were mixed. Thereafter, the mixture was stirred, thereby dissolving the phosphorescent compound E1 and the low molecular weight compound H1 in a mixed solvent of n-hexylbenzene and 4-methylanisole, to produce a composition C2. The difference in boiling point between n-hexylbenzene and 4-methylanisole was 51° C.

<Example B1> Formation of Film E1

The composition 1 prepared in Example 1 was injected into a syringe, then, an ultrafine needle was attached to the syringe, and the composition 1 was discharged onto a glass substrate using the syringe equipped with the ultrafine needle. The resultant glass substrate was dried under atmospheric pressure at 23° C. for 20 minutes, to form a film B1 on the glass substrate.

When the form of the film E1 was measured, the film B1 was in the form close to flat. The film E1 had a "thickness of thinnest central part" of 115 nm and a "thickness of thickest peripheral part" of 327 nm. The film B1 had a value of "(thickness of thickest peripheral part)/(thickness of thinnest central part)" (criterion for flatness) of 2.8.

<Example B2> Formation of Film B2

The composition 2 prepared in Example 2 was injected into a syringe, then, an ultrafine needle was attached to the syringe, and the composition 2 was discharged onto a glass substrate using the syringe equipped with the ultrafine needle. The resultant glass substrate was dried by heating under atmospheric pressure on a hot plate at 80° C. for 20 minutes, to form a film B2 on the glass substrate.

When the form of the film B2 was measured, the film B2 was in the form close to flat. The film B2 had a "thickness of thinnest central part" of 1702 nm and a "thickness of thickest peripheral part" of 1738 nm. The film B2 had a value of "(thickness of thickest peripheral part)/(thickness of thinnest central part)" (criterion for flatness) of 1.0.

<Example B3> Formation of Film B3

The composition 3 prepared in Example 3 was injected into a syringe, then, an ultrafine needle was attached to the syringe, and the composition 3 was discharged onto a glass substrate using the syringe equipped with the ultrafine needle. The resultant glass substrate was dried by heating under atmospheric pressure on a hot plate at 80° C., for 20 minutes to form a film B3.

When the form of the film B3 was measured, the film B3 was in the form close to flat. The film B3 had a "thickness of thinnest central part" of 2352 nm and a "thickness of thickest peripheral part" of 2821 nm. The film B3 had a value of "(thickness of thickest peripheral part)/(thickness of thinnest central part)" (criterion for flatness) of 1.2.

<Comparative Example CB1> Formation of Film CB1

The composition C1 prepared in Comparative Example 1 was injected into a syringe, then, an ultrafine needle was attached to the syringe, and the composition C1 was discharged onto a glass substrate using the syringe equipped with the ultrafine needle. The resultant glass substrate was dried by heating under atmospheric pressure on a hot plate at 50° C. for 20 minutes, to form a film CB1.

When the form of the film CB1 was measured, the film CB1 was in the form of extreme concave. The film CB1 had a "thickness of thinnest central part" of 38 nm and a "thickness of thickest peripheral part" of 512 nm. The film CB1 had a value of "(thickness of thickest peripheral part)(thickness of thinnest central part)" (criterion for flatness) of 13.5.

<Example CB2> Formation of Film CB2

The composition C2 prepared in Comparative Example 2 was injected into a syringe, then, an ultrafine needle was attached to the syringe, and the composition C2 was discharged onto a glass substrate using the syringe equipped with the ultrafine needle. The resultant glass substrate was dried under reduced pressure at 23° C. for 20 minutes, to form a film CB2 on the glass substrate.

When the form of the film CB2 was measured, the film CB2 was in the form of extreme concave. The film CB2 had a "thickness of thinnest central part" of 9 nm and a "thickness of thickest peripheral part" of 266 nm. The film CB2 had a value of "(thickness of thickest peripheral part) (thickness of thinnest central part)" (criterion for flatness) of 29.6.

INDUSTRIAL APPLICABILITY

The present invention can provide a composition comprising a phosphorescent compound and a solvent which is useful for production of a film excellent in flatness when used in a discharge type application method. Further, the present invention can provide a light emitting device produced by using the composition.

The invention claimed is:

1. A composition comprising a phosphorescent compound, a solvent (A) and a solvent (B), wherein
the solvent (A) and the solvent (B) are each independently an aromatic hydrocarbon solvent or an aromatic ether solvent, and at least one of the solvent (A) and the solvent (B) is an aromatic ether solvent,
the boiling point under 1 atm of the solvent (A): bpA (° C.) and the boiling point under 1 atm of the solvent (B): bpB (° C.) satisfy the formula (11) and the formula (12), and
the content of the solvent (A): wtA (by weight) and the content of the solvent (B): wtB (by weight) satisfy the formula (13):

$$bpB<200° C. \leq bpA \quad (11)$$

$$70° C. \leq bpA - bpB \leq 120° C. \quad (12)$$

$$wtB \leq wtA \quad (13),$$

provided that when the composition further comprises one or more solvents (C), the content of the solvent (A): wtA (by weight), the content of the solvent (B): wtB (by weight) and the total content of the solvents (C): wtC (by weight) satisfy the formula (14):

$$wtC < wtB \leq wtA \quad (14).$$

2. The composition according to claim 1, wherein the phosphorescent compound is a phosphorescent compound represented by the formula (1):

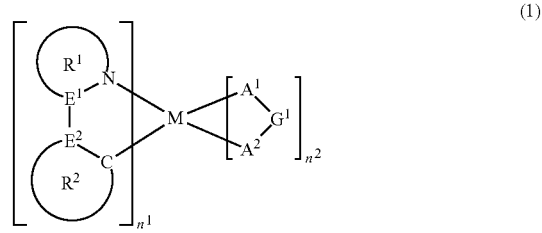

wherein
M represents a ruthenium atom, a rhodium atom, a palladium atom, an iridium atom or a platinum atom,
$n^1$ represents an integer of 1 or more, $n^2$ represents an integer of 0 or more, and $n^1+n^2$ is 3 when M is a ruthenium atom, a rhodium atom or an iridium atom, while $n^1+n^2$ is 2 when M is a palladium atom or a platinum atom,
$E^1$ and $E^2$ each independently represent a carbon atom or a nitrogen atom, and at least one of $E^1$ and $E^2$ is a carbon atom,
the ring $R^1$ represents a 5-membered or 6-membered aromatic heterocyclic ring and the ring optionally has a substituent, and when a plurality of the substituents are present, they may be the same or different and may be combined together to form a ring together with the atoms to which they are attached, and when a plurality of the rings $R^1$ are present, they may be the same or different, and $E^1$ is a carbon atom when the ring $R^1$ is a 6-membered aromatic heterocyclic ring,
the ring $R^2$ represents a 5-membered or 6-membered aromatic hydrocarbon ring or a 5-membered or 6-membered aromatic heterocyclic ring and these rings each optionally have a substituent, and when a plurality of the substituents are present, they may be the same or different and may be combined together to form a ring together with the atoms to which they are attached, and when a plurality of the ring $R^2$ are present, they may be the same or different, and $E^2$ is a carbon atom when the ring $R^2$ is a 6-membered aromatic heterocyclic ring, and
$A^1$-$G^1$-$A^2$ represents an anionic bidentate ligand, $A^1$ and $A^2$ each independently represent a carbon atom, an oxygen atom or a nitrogen atom and these atoms each may be an atom constituting a ring, $G^1$ represents a single bond or an atomic group constituting the bidentate ligand together with $A^1$ and $A^2$, and when a plurality of $A^1$-$G^1$-$A^2$ are present, they may be the same or different.

3. The composition according to claim 2, wherein the ring $R^1$ is a quinoline ring optionally having a substituent, an isoquinoline ring optionally having a substituent, a pyridine ring optionally having a substituent, a pyrimidine ring optionally having a substituent, an imidazole ring optionally having a substituent or a triazole ring optionally having a substituent.

4. The composition according to claim 2, wherein the ring $R^2$ is a benzene ring optionally having a substituent, a naphthalene ring optionally having a substituent, a fluorene ring optionally having a substituent, a phenanthrene ring optionally having a substituent, a pyridine ring optionally having a substituent, a diazabenzene ring optionally having a substituent, a pyrrole ring optionally having a substituent, a furan ring optionally having a substituent or a thiophene ring optionally having a substituent.

5. The composition according to claim 2, wherein at least one ring selected from the group consisting of the ring $R^1$ and the ring $R^2$ has a group represented by the formula (2):

  (2)

wherein
$R^{100}$ represents an aryl group, a monovalent heterocyclic group or a substituted amino group and these groups each optionally have a substituent.

6. The composition according to claim 2, wherein M is an iridium atom.

7. The composition according to claim 1, further comprising a non-phosphorescent low molecular weight compound.

8. The composition according to claim 1, further comprising a polymer compound comprising at least one constitutional unit selected from the group consisting of a constitutional unit represented by the formula (X) and a constitutional unit represented by the formula (Y):

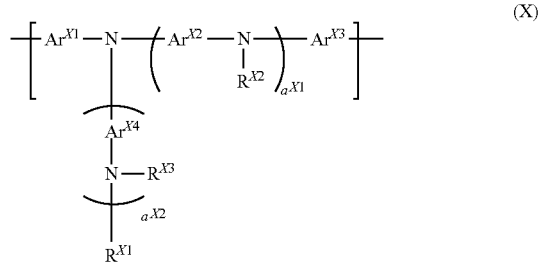  (X)

wherein
$a^{X1}$ and $a^{X2}$ each independently represent an integer of 0 or more, $Ar^{X1}$ and $Ar^{X3}$ each independently represent an arylene group or a divalent heterocyclic group and these groups each optionally have a substituent, $Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent, and when a plurality of $Ar^{X2}$ and $Ar^{X4}$ are present, they may be the same or different at each occurrence, and $R^{X1}$, $R^{X2}$ and $R^{X3}$ each independently represent a hydrogen atom, an alkyl group, a cycloalkyl group, an aryl group or a monovalent heterocyclic group and these groups each optionally have a substituent, and when a plurality of $R^{X2}$ and $R^{X3}$ are present, they may be the same or different at each occurrence:

  (Y)

wherein $Ar^{Y1}$ represents an arylene group, a divalent heterocyclic group or a divalent group in which at least one arylene group and at least one divalent heterocyclic group are bonded directly, and these groups each optionally have a substituent.

9. The composition according to claim 1, further comprising at least one material selected from the group consisting of a hole transporting material, a hole injection material, an electron transporting material, an electron injection material, a light emitting material and an antioxidant.

10. The composition according to claim 1, the viscosity of the composition being 1 to 20 mPa·s.

11. A light emitting device comprising an anode, a cathode and a light emitting layer disposed between the anode and the cathode, wherein the light emitting layer is a layer obtained by using the composition according to claim 1.

\* \* \* \* \*